United States Patent [19]
Hirata et al.

[11] Patent Number: 5,831,875
[45] Date of Patent: Nov. 3, 1998

[54] LINK MECHANISM ANALYZER AND LINK MECHANISM JOINT DATA ARITHMETIC APPARATUS

[75] Inventors: Mitsunori Hirata; Yuichi Sato; Tsugito Maruyama, all of Kawasaki, Japan

[73] Assignee: Fujitsu Limited, Kawasaki, Japan

[21] Appl. No.: 657,166

[22] Filed: Jun. 3, 1996

[30] Foreign Application Priority Data

Nov. 7, 1995 [JP] Japan ................................ 7-288843
Mar. 25, 1996 [JP] Japan ................................ 8-067819

[51] Int. Cl.$^6$ ............................ G06F 17/50; G06F 17/16
[52] U.S. Cl. ..................... 364/578; 364/512; 345/419; 345/420
[58] Field of Search ................................ 364/578, 149, 364/148, 158, 550, 551.01, 512, 505, 801; 395/500, 964; 345/419, 420, 433, 335

[56] References Cited

U.S. PATENT DOCUMENTS

| | | |
|---|---|---|
| 4,858,146 | 8/1989 | Shebini ............................ 364/578 |
| 5,043,929 | 8/1991 | Kramer et al. ................... 364/578 |
| 5,253,189 | 10/1993 | Kramer ............................ 364/578 |
| 5,427,531 | 6/1995 | Kramer ............................ 434/302 |
| 5,452,238 | 9/1995 | Kramer et al. ................... 364/578 |

OTHER PUBLICATIONS

Lian et al., "Adaptive Force Control of Single Link Mechanisms with Joint Flexibility", IEEE, 1991, pp. 540–545.

*Primary Examiner*—Kevin J. Teska
*Assistant Examiner*—Thai Phan
*Attorney, Agent, or Firm*—Staas & Halsey

[57] ABSTRACT

There are provided a link mechanism analyzer for performing a performance confirmation or test on a simualation basis for link mechanism produced using a CAD system for a mechanism design, and a link mechanism joint data arithmetic apparatus for evaluating joint data describing a parameter representative of a couping relation between a link of the link mechanism and a joint, which parameter is referred to as, for example, a Deravit-Hartenberg's link parameter, and a parameter value of the paramerter. The evaluation of such a joint data will be needed when a performance confirmation or test on a simualation basis for the link mechanism is performed using the link mechanism analyzer.

27 Claims, 79 Drawing Sheets

FIG. 14
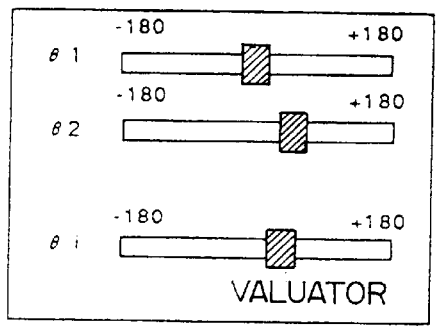
FIG. 15
FIG. 16(A)   FIG. 16(B)   FIG. 16(C)
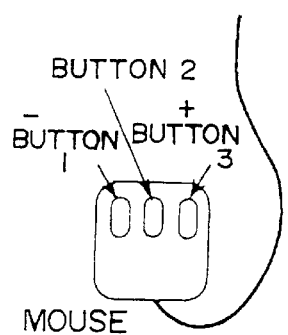 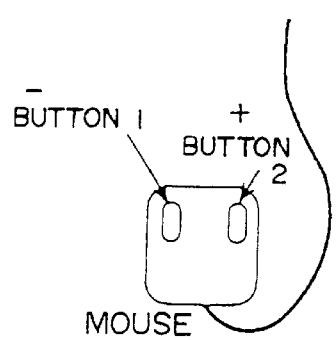 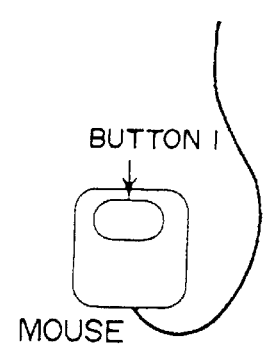

FIG.36

| LINK MECH. INFORMATION |
|---|
| LOAD |
| EDITION |
| RETENTION |
| DELETION |
| NEW MECH. REG. |

| FILE NAME |
|---|
| clank+2link |
| LINK SORT TITLE |
| 2LINK+CRANK | clank+2link — FILE NAME
1 — DEGREE OF FREEDOM clank — LINK SORT NAME
clank1 — 1st LINK NAME
ROTATION — CONSTRAINT TYPE
CONSTRAINT POINT POSITION
clank2 0,0,Ld — LINK NAME CLOSEST TO CONSTRAINT POINT, COORDINATE LOOKING AT LINK COORDINATE SYSTEM 2link — LINK SORT NAME
CONSTRAINT POINT POSITION
2link2 0,0,L2b — LINK NAME CLOSEST TO CONSTRAINT POINT, COORDINATE LOOKING AT LINK COORDINATE SYSTEM clank+2link.image — LINK SORT IMAGE DATA
2LINK+CRANK — LINK SORT TITLE
clank+2link.select — 1st LINK SELECTION SCREEN
clank+2link.drive — DRIVE SELECTION SCREEN

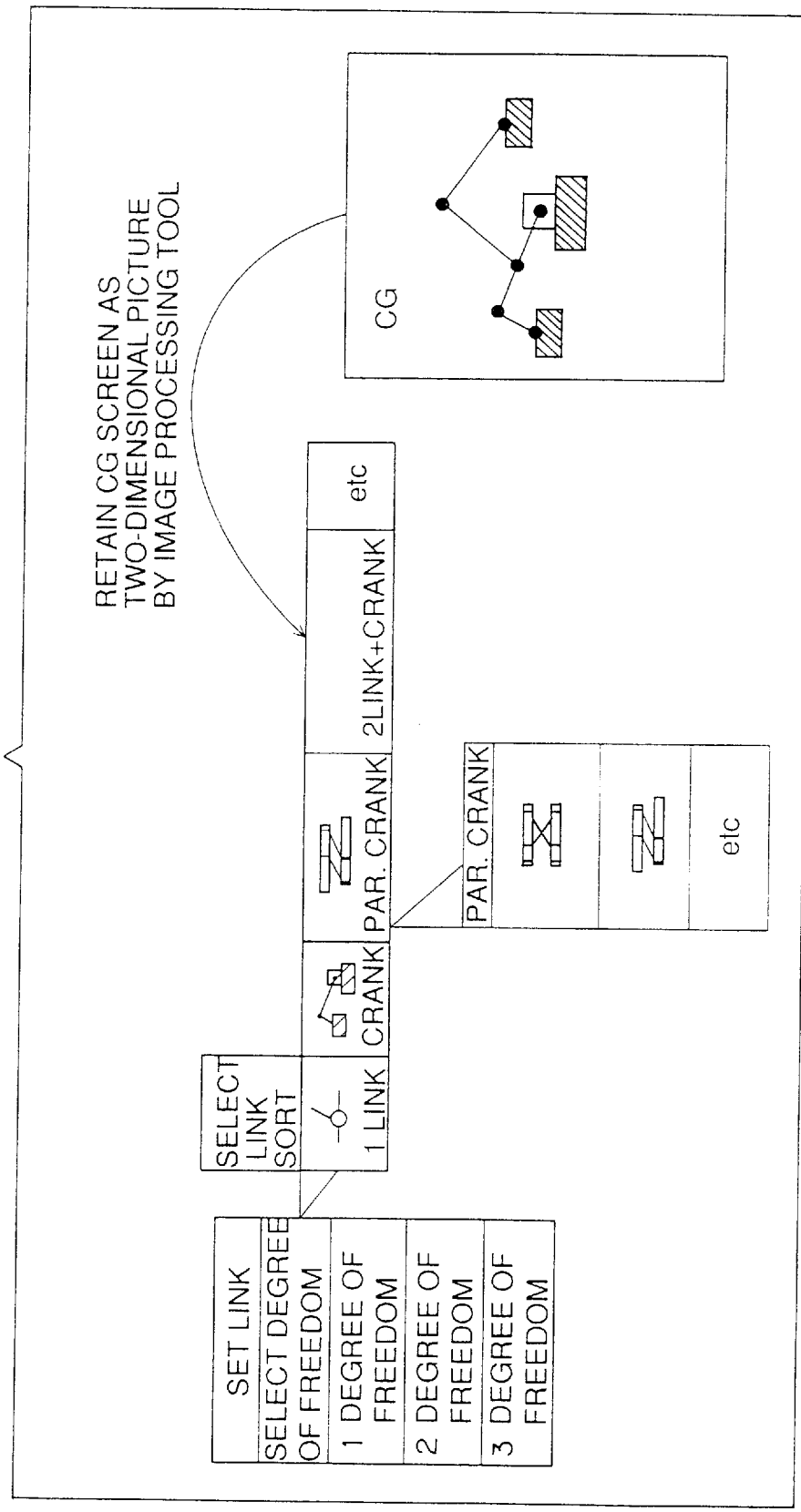

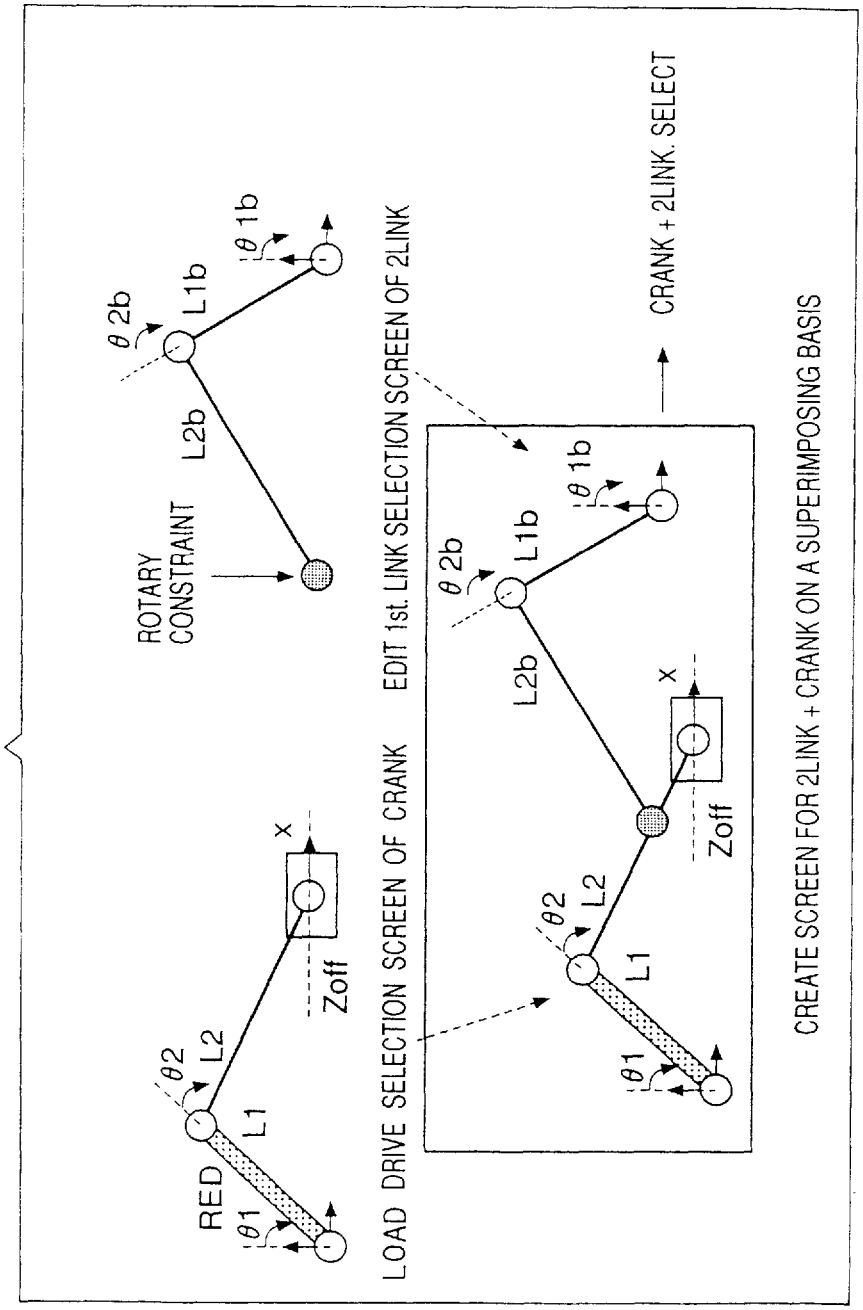

FIG.67A

| JOINT LIMIT : JOINT 2 | |
|---|---|
| MIN. [m] | -0.1 |
| MAX. [m] | +0.2 |

FIG.67B

| JOINT LIMIT : JOINT 2 | | |
|---|---|---|
| MIN. [m] | -0.1 | |
| MAX. [m] | +0.2 | |

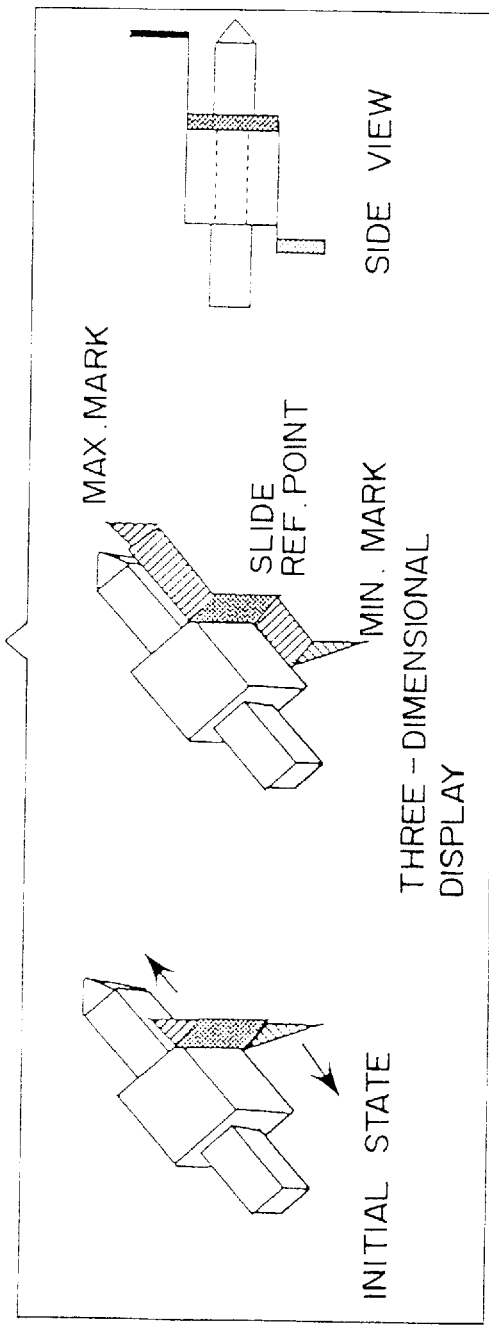

FIG.86
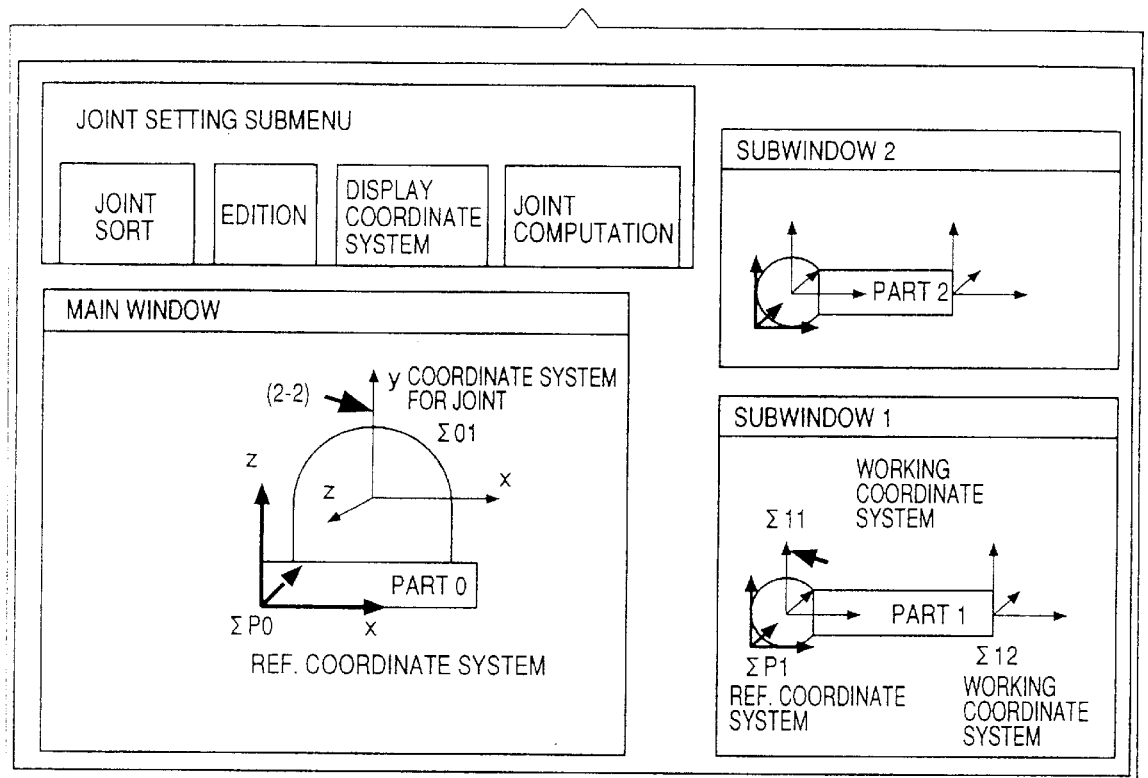
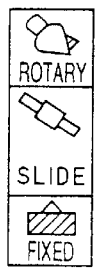
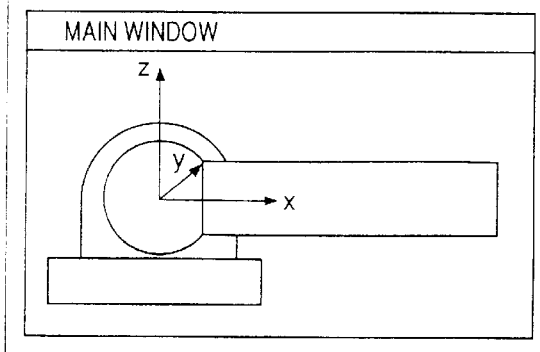

IMAGINARY JOINT MODEL
PGB VALUE : 0.11, 0.11, 0.11

LINK MECHANISM ANALYZER AND LINK MECHANISM JOINT DATA ARITHMETIC APPARATUS

BACKGROUND OF THE INVENTION

1. Field of the Invention

The present invention relates to a link mechanism analyze for performing a performance confirmation or test on a simulation basis for link mechanisms produced using a CAD system for mechanism design, and a link mechanism joint data arithmetic apparatus for evaluating joint data describing a parameter representative of a couping relation between a link of the link mechanism and a joint, which parameter is referred to as, for example, a Deravit-Hartenberg's link parameter (hereinafter, referred to as D-H parameter), and a parameter value of the parameter. The evaluation of such a joint data will be needed when a performance confirmation or test on a simulation basis for the link mechanism is performed using the link mechanism analyzer.

2. Description of the Related Art

Recently, cases have become frequent such that a product design is carried out using a three-dimensional CAD system. Generally, such a product has several movable portions. There is a need to confirm, after assembling, as to whether the product may move as designed, or whether collision between parts occurs. With regard to such a confirmation, hitherto, it is implemented through trial manufacture. However, the confirmation by trial manufacture takes much time and is expensive.

The development of computer graphics (hereinafter, referred to as CG) and simulation technology make it possible to perform a visual performance confirmation in such a way that the movable portions are moved through the simulation and then displayed on a CG screen, without manufacturing the product by way of trial. Thus, according to this technology, it is possible to early detect and correct the faulty design, thereby contributing to reduction of design time and cost. For the purpose of the foregoing, while the mechanism analyzer system is built, as will be described roughly hereinafter, the conventional mechanism analyzer system involves such a disadvantage that operation for moving the movable portion through definition of the mechanism is very complicated, and that would make the burden too heavy for the user.

Hitherto, three-dimensional CAD systems, such as Pro/Engineering, i-DEAS, have adopted the assembly function for a performance confirmation of the link mechanism, in which a parameter as to a relative position of parts and an attitude or an orientation thereof is updated to repeatedly perform a rearrangement of the parts, thereby performing a performance confirmation. However, these systems take a lot of time for alteration of the parameters. Specifically, since these systems involve no inverse kinematics, it is great trouble for the user to provide an arrangement such that a relative position of part-to-part and an attitude or an orientation are adjusted.

The inverse kinematics implies a technique in which when information as to a position of the tip or the halfway position of the link mechanism and its orientation is given, angles of the joints for coupling the links constituting the link mechanism are determined. On the other hand, the forward kinematics implies a technique in which when angles of the joints are given, a position of the tip of the link mechanism and its orientation are determined.

A robot simulator referred to as an IGRIP is known. This robot simulator is provided with a solution of the forward kinematics on the general links below 6 degree of freedom each having rotary/slide joints. In addition, such a robot simulator is arranged in such a way that a solution of the forward kinematics, which is defined by the user, is also incorporated into the system. However, according to such a robot simulator, there is a need to perform a complicated setting on each robot suitable for the robot. Consequently, the use of the robot simulator as mentioned above for the purpose of a performance confirmation of the various link mechanisms involves such a problem that a complicated setting has to be done over again for each link mechanism, and thus such a device has a poor working efficiency.

Further, hitherto, there exists software for the mechanism analysis for performing a performance confirmation through taking in data of parts produced by using a modeler as an attachment, or a three-dimensional CAD system on the market. However, the use of such software involves problems such that setting of the movable portion is complicated; there is a need to define the forward kinematics and the inverse kinematics and this would be too complicated for the user; there is a need to enter parameters for the link mechanism; and it happens that there are not enough parameters having a strict analytic solution and thus specifically a closed loop system of link mechanism cannot be strictly solved.

Further, as a premise of the link mechanism analysis, it is necessary to define a mutual coupling state among a plurality of parts constituting a link mechanism, that is, the link mechanism itself. Specifically, there is a need to define a joint (as to a sort, a position and an orientation of the joint) for coupling parts produced by using the three-dimensional CAD system and a traveling limit (also referred to as "joint limit") of the parts coupled with each other by the joint, thereby defining the link mechanism itself. What is meant by defining the link mechanism is that there is evaluated joint data describing a parameter representative of a couping relation between a link and a joint constituting the link mechanism, which parameter is, for example, D-H parameter, and a parameter value of the parameter. The resultant joint data is used for an analysis of the link mechanism.

With respect to defining joints, hitherto, according to the "Softimage" scheme which is often adopted when producing an animation, a definition of a joint and a joint limit is performed in such a procedure that a framework referred to as a skeleton is arranged through a mouse operation, several sphere joints of links are connected to each other so that joints of human and animal as an animation are set up, and thereafter a constraint of the joint limit is provided. However, according to this scheme, it is difficult to implement a strict definition. The "Softimage" scheme is adopted for the purpose of producing the animation. It is sufficient for the joints of human and animal to be arranged at the approximate position of their configuration, and no strictness is required. Thus, this scheme will be sufficient for producing the animation.

On the other hand, in the fields of product design and robotics, a strictness is required for definitions of the position and the orientation of the joints. While it is considered that the position of the joint is strictly designated, first, there is a problem as to what technology is used to designate strictly and effectively in operability the position of the joint, and second, even if the position of the joint is strictly designated, there still remains a further problem as to whether a traveling behavior of the parts coupled by the joint is readily visually grasped on the screen on an intuitive basis.

SUMMARY OF THE INVENTION

In view of the foregoing, it is therefore an object of the present invention to provide a link mechanism analyzer capable of performing a mechanism analysis of a link mechanism with a simple operation.

It is another object of the present invention to provide a link mechanism joint data arithmetic apparatus capable of providing a joint definition of a link mechanism with a simple operation and also in such a way that a traveling behavior of the parts coupled by the joint is readily visually grasped on the screen on an intuitive basis.

FIG. 1 is a basic block diagram of a first link mechanism analyzer according to the present invention;

To achieve the above-mentioned objects, according to the present invention, there is provided a first link mechanism analyzer comprising:

(1-1) file storage unit (101) for storing a file which describes an analytical solution of a forward kinematics on each of a plurality of sorts of link mechanism models each having a link and a joint, and an analytical solution of an inverse kinematics, on each of the plurality of sorts of link mechanism models, in a case where the link and the joint of each of the link mechanism models are adopted as a driving source for driving the link mechanism model;

(1-2) data input unit (102) for inputting geometry data representative of a three-dimensional geometry of a link mechanism to be analyzed having a link and a joint, and joint data which describes a parameter representative of a coupling relation between the link and the joint constituting the link mechanism to be analyzed and a parameter value of the parameter;

(1-3) a first handler (103) for selecting from among the plurality of sorts of link mechanism models a link mechanism model corresponding to a three-dimensional geometry represented by the geometry data inputted through the data input unit;

(1-4) a second handler (104) for designating a driving source for driving a link mechanism to be analyzed having the three-dimensional geometry represented by the geometry data inputted through the data input unit;

(1-5) a third handler (105) for inputting a drive rate of the driving source designated by operation of said second handler; and (1-6) an arithmetic unit (106) for solving on a numerical value basis the analytical solution of the forward kinematics corresponding to the link mechanism model selected by operation of the first handler, and the analytical solution of the inverse kinematics corresponding to the driving source of the link mechanism to be analyzed designated by operation of the second handler, in such a manner that the parameter value included in the joint data inputted through said data input unit and the drive rate inputted by operation of the third handler are substituted.

FIG. 1 is a basic block diagram of also a second link mechanism analyzer according to the present invention;

To achieve the above-mentioned objects, according to the present invention, there is provided a second link mechanism analyzer comprising:

(2-1) file storage unit (101) for storing a file which describes an analytical solution of a forward kinematics and a kinetics on each of a plurality of sorts of link mechanism models each having a link and a joint;

(2-2) a data input unit (102) for inputting geometry data representative of a three-dimensional geometry of a link mechanism to be analyzed having a link and a joint, and joint data which describes a parameter representative of a coupling relation between the link and the joint constituting the link mechanism to be analyzed and a parameter value of the parameter;

(2-3) a first handler (103) for selecting from among said plurality of sorts of link mechanism models a link mechanism model corresponding to a three-dimensional geometry represented by the geometry data inputted through the data input unit;

(2-4) a second handler (104) for designating a driving source for driving a link mechanism to be analyzed having the three-dimensional geometry represented by the geometry data inputted through the data input unit;

(2-5) a third handler (105) for inputting a drive rate of the driving source designated by operation of said second handler; and (2-6) an arithmetic unit (106) for solving on a numerical value basis the analytical solution of the forward kinematics and the kinetics corresponding to the link mechanism model selected by operation of the first handler in such a manner that the parameter value included in the joint data inputted through the data input unit and the drive rate inputted by operation of the third handler are substituted.

In the first and second link mechanism analyzers of the present invention, naming of the first handler (103), the second handler (104) and the third handler (105) is provided in view of their function, and physically, it is acceptable to form those handlers with a single handler.

Further, with respect to the input unit (102), it is acceptable to adopt such a type of arrangement that geometry data and joint data, which have been already created in the external system such as a three-dimensional CAD system, separately provided from these link mechanism analyzers, are inputted from the exterior, alternatively, the three-dimensional CAD system is incorporated thereinto.

According to the first link mechanism analyzer of the present invention, the file storage unit (101) stores a file which describes not only an analytical solution of a forward kinematics on each of a plurality of sorts of link mechanism models each having a link and a joint, but also an analytical solution of an inverse kinematics, on each of the plurality of sorts of link mechanism models, in a case where the link and the joint of each of the link mechanism models are adopted as a driving source for driving the link mechanism model. Thus, it is sufficient for a user to designate a desired driving source in correspondence between a link mechanism to be analyzed and a link mechanism model, and input a driving rate of the driving source, performing an arithmetic operation using the analytical solution prepared beforehand.

This is subject similar as to the matter of the second link mechanism analyzer of the present invention. According to the second link mechanism analyzer of the present invention, the file storage unit (101) stores a file which describes an analytical solution of not only a forward kinematics, but also a kinetics on each of a plurality of sorts of link mechanism models each having a link and a joint. Thus, it is sufficient for an user to designate a desired driving source in correspondence between a link mechanism to be analyzed and a link mechanism model, and input a driving force of the driving source, performing a numerical value analysis using the analytical solution prepared beforehand.

Thus, according to the first and second link mechanism analyzers of the present invention, it is possible to implement the mechanism analysis of the link mechanism through a simple operation required for the user.

In the first or second link mechanism analyzer of the present invention, it is preferable that the analyzer further comprises display unit (107) for displaying a graphic screen of the three-dimensional geometry represented by the geometry data inputted through the data input unit, and a link mechanism model screen representing the link mechanism model selected by operation of the first handler. This feature makes it possible to readily perform a selection of a desired link mechanism model, and also to perform a performance confirmation through a display of a result of the numerical value analysis in the form of the graphic screen.

Further, in the first or second link mechanism analyzer of the present invention, it is preferable that the display unit (107) displays a plurality of menu titles arriving at a designation of a desired link mechanism model through a sequential designation, and the first handler performs an operation to designate the menu titles displayed on the display unit. This feature makes it possible to simplify operation of the designation of a desired link mechanism model, thereby implementing a system improved in operational efficiency.

In this case, it is further preferable that said plurality of menu titles include a menu title representative of each of groups of link mechanism models which are classified with degree of freedom. This feature makes it possible to implement a system further improved in an operational efficiency.

In the first or second link mechanism analyzer of the present invention, it is acceptable that the second handler (104) performs both an operation of instructing a link on the graphic screen displayed on said display unit (107), and an operation of instructing as to which one of the link and the joint coupling the link is adopted as the driver source. It is also acceptable that the display unit (107) displays marks, each representative of a selectable driving source, the mark being superimposed on the link mechanism model screen, and the second handler performs an operation of instructing one of the marks.

In the mechanism analysis of the link mechanism, there is a need to designate the driving source. A designation of the driving source is readily performed through a designation operation once or twice.

In the first or second link mechanism analyzer of the present invention, it is preferable that the analyzer further comprises a fourth handler (104) for designating a first link locating at a base of all the links constituting the link mechanism to be analyzed having the three-dimensional geometry represented by the geometry data inputted through the data input unit. In this case, it is also preferable that the analyzer further comprises a first link detecting unit (109) for detecting a first link locating at a base of all the links constituting the link mechanism to be analyzed having the three-dimensional geometry represented by the geometry data inputted through said data input unit, on the basis of the parameter included in the joint data inputted through the data input unit.

In the mechanism analysis of the link mechanism, there is a need to know the first link located at a base of all the links constituting the link mechanism to be analyzed. The designation of the first link is implemented by the user, or when it is unequivocally determined, it is desirably automatically determined.

In the first or second link mechanism analyzer of the present invention, it is preferable that the analyzer further comprises a new link mechanism model construction unit (110) for constructing a new sort of link mechanism model by combination of a plurality of link mechanism models from among the plurality of sorts of link mechanism models. This feature makes it possible to implement a system further improved in an operational efficiency.

FIG. 2 is a basic block diagram of a link mechanism joint data arithmetic apparatus according to the present invention.

To achieve the above-mentioned objects, according to the present invention, there is provided a link mechanism joint data arithmetic apparatus comprising:

(3-1) geometry data input unit (201) for inputting geometry data representative of a three-dimensional geometry of a plurality of parts constituting a link mechanism having a link and a joint;

(3-2) a joint defining handler (202) for defining a sort, a position and an orientation of joints for coupling parts in such a manner that from among a plurality of sorts of solid joint marks in which joints are classified and provided in form of a model on a three-dimensional basis, any one of the solid joint marks is selected, and the selected solid joint mark is arranged, at a joint portion whereat the parts entered through the geometry data input unit are coupled, with a predetermined position and a predetermined orientation;

(3-3) display unit (203) for displaying parts entered through the geometry data input unit and the solid joint marks; and (3-4) joint data arithmetic unit (204) responsive to a message that the solid joint mark is arranged at the joint portion for evaluating joint data which describes a parameter representative of a coupling relation between the link and the joint constituting the link mechanism including a part involving the solid joint mark and a parameter value of the parameter.

According to the link mechanism joint data arithmetic apparatus as defined above, it is possible to implement a system improved in an operability, since a movement of parts coupled through the joint can be readily grasped on an intuitive basis on the screen. Thus, it is possible to define the link mechanism in which a movement of parts coupled through the joint can readily be grasped on an intuitive basis, through simple operation.

In the link mechanism joint data arithmetic apparatus as mentioned above, it is acceptable that the geometry data input unit (201) is adapted to input geometry data representative of a three-dimensional geometry of a plurality of parts in a state of assembly; and the joint defining handler is operative to dispose the solid joint mark at the joint portion of a plurality of parts in a state of assembly, entered through the geometry data input unit. Further, it is also acceptable that the geometry data input unit (201) is adapted to input geometry data representative of a three-dimensional geometry of a plurality of parts in a state before assembly; and said joint defining handler (202) is operative to dispose the solid joint marks each indicating that the position and the orientation are mutually associated, at the joint portions of a plurality of parts to be mutually coupled, respectively.

In the link mechanism joint data arithmetic apparatus as mentioned above, it is preferable that the link mechanism joint data arithmetic apparatus further comprises a collision check unit (205) for inspecting as to whether the solid joint marks collide with the parts. This feature makes it possible to readily arrange the solid joint mark on a surface of the part, thereby simplifying operation for an arrangement of the solid joint mark.

In the link mechanism joint data arithmetic apparatus as mentioned above, it is preferable that the geometry data input unit (201) is adapted to input joint position data representative of a joint position as well as the geometry data; said joint defining handler (202) is for performing operations including an operation to dispose the solid joint mark at the joint position represented by said joint position data.

In a case where the joint position data as well is created in a CAD system or the like, it is possible to arrange the solid joint mark through more simple operation.

In the link mechanism joint data arithmetic apparatus as mentioned above, it is preferable that the display unit (203) is adapted to display a two-dimensional geometry formed through projection of the parts in a predetermined direction; the joint defining handler is for performing operations including an operation to dispose the solid joint mark at the joint position by instructing a joint position in said two-dimensional geometry.

In a case where a two-dimensional geometry of parts can be displayed, it will be more simple in operation to designate the joint position on the two-dimensional geometry.

In the link mechanism joint data arithmetic apparatus as mentioned above, it is preferable that the link mechanism joint data arithmetic apparatus further comprises a joint limit defining handler (206) for determining a travel limit of parts coupled by joints. The joint limit defining handler (206) may be the same as the joint defining handler (202) on a hardware basis.

In this case, it is preferable that the solid joint mark is provided with a mark portion simulating a travel position of the parts coupled through the joint, the joint limit defining handler determines the travel limit of the parts by means of moving the mark portion to a position corresponding to a travel limit position of the parts. Further, it is also preferable that the joint limit defining handler determines the travel limit of the parts by means of moving the parts coupled through the joint, displayed on the display unit, to a travel limit position of the parts.

Now, there will be explained a relationship between the link mechanism analyzer of the present invention and the the link mechanism joint data arithmetic apparatus of the present invention.

For example, a CAD system or the like produces geometry data of a plurality of parts constituting a link mechanism, and such a geometry data is inputted, by the geometry data input unit (201) shown in FIG. 2, to the link mechanism joint data arithmetic apparatus of the present invention. In the link mechanism joint data arithmetic apparatus of the present invention, the link mechanism is defined by arranging the solid joint mark in a fashion as mentioned above, so that joint data is created. The joint data thus created is inputted together with the geometry data, by the data input unit (102) shown in FIG. 1, to the link mechanism analyzer of the present invention in which the analysis of the link mechanism is performed.

Incidentally, the link mechanism analyzer of the present invention and the link mechanism joint data arithmetic apparatus of the present invention are the same apparatus or system on a hardware basis. Therefore, it is acceptable that all of the handlers or some handlers are used on a common basis. Further, it is acceptable that the CAD system for creating geometry data is incorporated into the same hardware.

BRIEF DESCRIPTION OF THE DRAWINGS

FIG. 14 is an explanatory view useful for understanding a joint angle inputting method according to a valuator;

FIG. 15 is an explanatory view useful for understanding a joint angle inputting method according to a numerical value entry;

FIGS. 16(A), 16(B) and 16(C) are typical illustrations of various type of mouse buttons useful for understanding a joint angle inputting method according to the mouse buttons;

FIG. 36 is an explanatory view useful for understanding a registration method for a new link mechanism;

FIG. 37 is an explanatory view useful for understanding a producing method for image data representative of an illustration of a new link mechanism model;

FIG. 38 is an explanatory view useful for understanding an editing method for a first link selecting screen of a new link mechanism model;

FIGS. 67(A) and (B) are each an exemplary illustration of a screen of "joint limit" as to the slide type of joint;

FIG. 68 is an exemplary illustration of the maximum value mark and the minimum value mark which are appended to the slide type of joint;

FIG. 86 is an explanatory view useful for understanding a display scheme for standby and acceleration of parts in the subwindow.

DESCRIPTION OF THE PREFERRED EMBODIMENTS

Hereinafter, there will be described embodiments of the present invention.

Here, as a matter of convenience of the explanation, first, there will be explained embodiments of a link mechanism analyzer according to the present invention, and then explained embodiments of a link mechanism joint data arithmetic apparatus.

Incidentally, the first link mechanism analyzer and the second link mechanism analyzer have many common portions which can be explained on a common basis. Thus, hereinafter, there will be described embodiments of the first link mechanism analyzer, and then described embodiments of the second link mechanism analyzer different from the first link mechanism analyzer.

Figure 1:
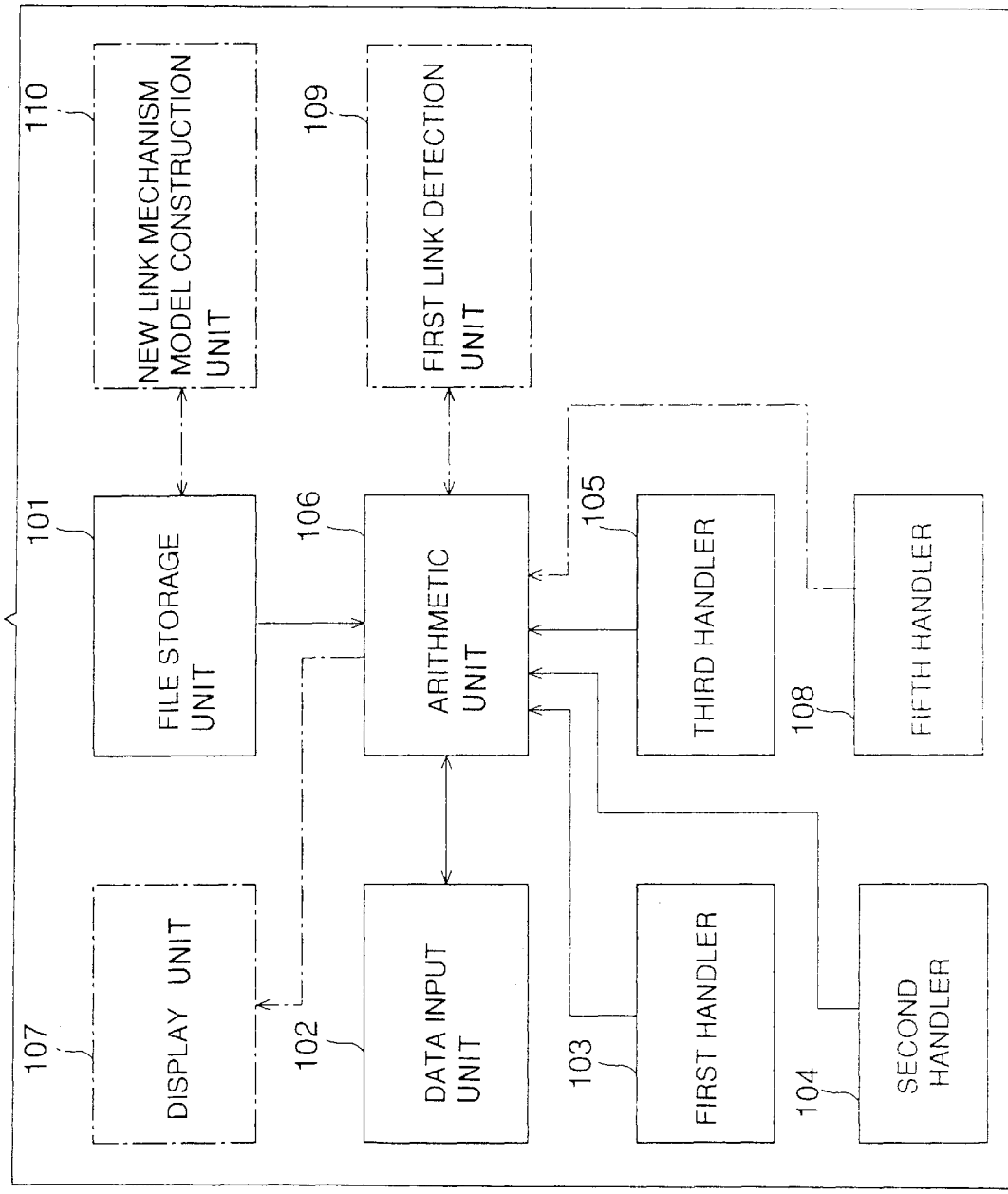
FIG. 1 is a basic block diagram of first and second link mechanism analyzers according to the present invention.
Figure 2:
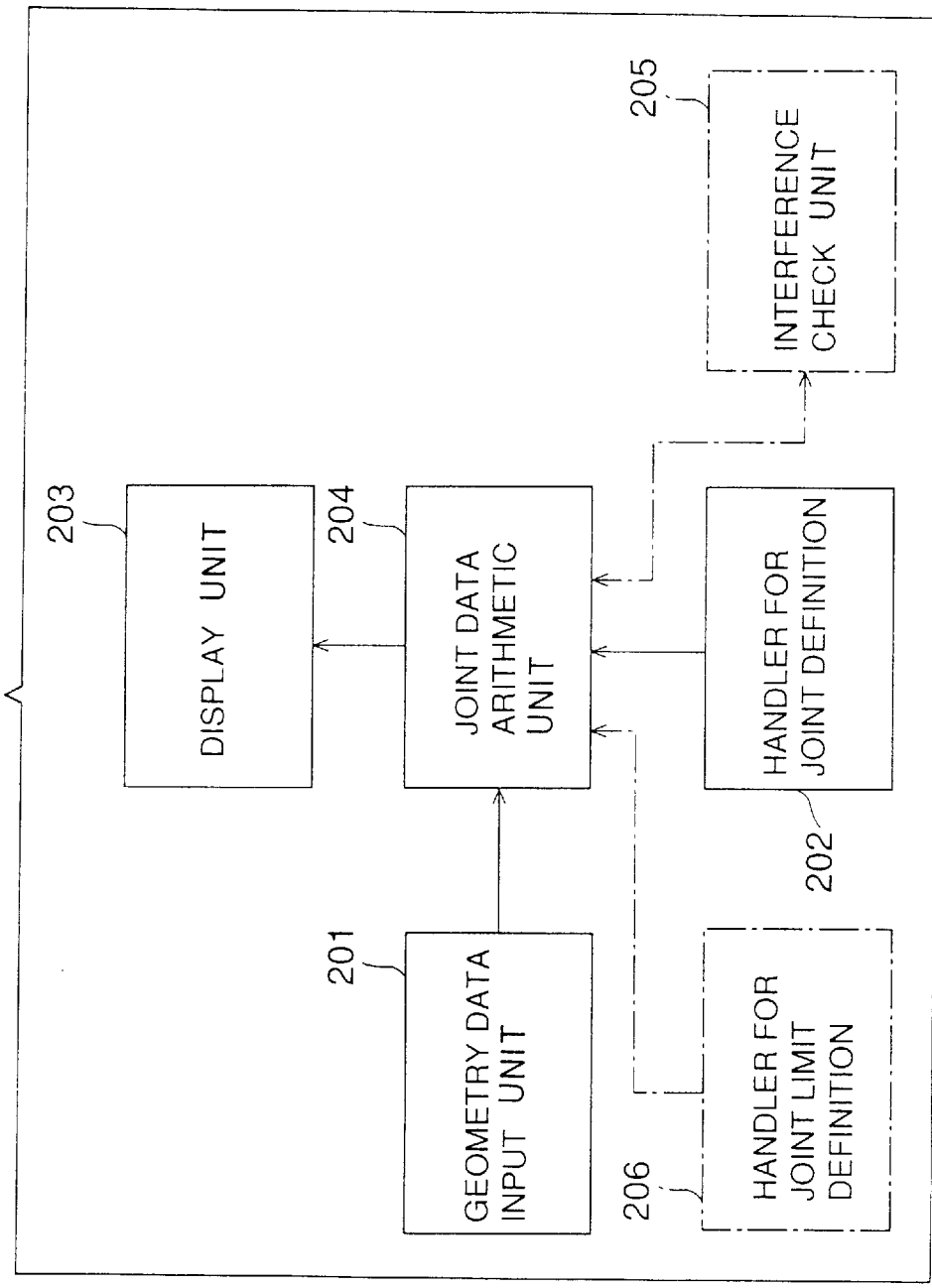
FIG. 2 is a basic block diagram of a link mechanism joint data arithmetic apparatus according to the present invention.
Figure 3:
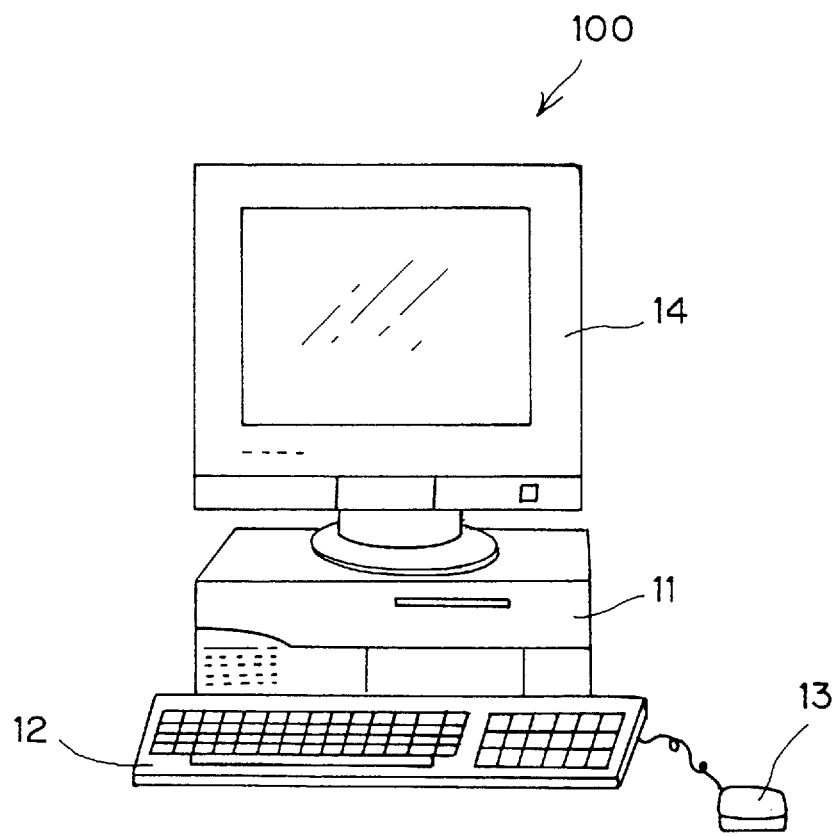
FIG. 3 is a perspective view of a link mechanism analyzer according to one embodiment of the present invention.

FIG. 3 is a perspective view of the first link mechanism analyzer according to one embodiment of the present invention.

As shown in FIG. 3, the first link mechanism analyzer 100 is constituted of a computer system, and comprises a main body 11 in which a CPU is incorporated thereinto, a keyboard 12, a mouse 13 and a CRT display 14. Into the main body 11, there are incorporated in addition to the CPU a floppy disk drive onto which a floppy disk is loaded so as to read data recorded on the floppy disk and also to record data onto the floppy disk, and a magnetic disk drive for storing a large capacity of data.

According to the present embodiment, downloaded on a floppy disk at a three-dimensional CAD end are geometry data representative of a three-dimensional geometry of a link mechanism to be analyzed, which link mechanism is designed with the use of a three-dimensional CAD system (not illustrated), and joint data describing a D-H parameter representative of a couping relation between a link and a joint constituting the link mechanism, and a parameter value of the parameter. Such a floppy disk is loaded on the link mechanism analyzer 100 shown in FIG. 3 so that the above-mentioned geometry data and joint data are read through the floppy disk.

It is acceptable to provide such an arrangement that the three-dimensional CAD system and the link mechanism analyzer 100 are connected with each other through a communication line so that the geometry data and joint data, which are transmitted from the three-dimensional CAD system via the communication line to the link mechanism analyzer 100, are stored in the magnetic disk drive incorporated into the link mechanism analyzer 100, alternatively, to provide such an arrangement that the three-dimensional CAD system is incorporated into the link mechanism analyzer 100.

In the link mechanism analyzer 100, there is stored in the magnetic disk drive incorporated into the main body 11 a file in which described are illustrations of link mechanism models (which will be described in detail later) for typically displaying a plurality of sorts of link mechanism models, analytical solutions of the forward kinematics of the respective link mechanism models, analytical solutions of the inverse kinematics in a case where drives of the respective link mechanism models are driven, and the like.

Figure 4:
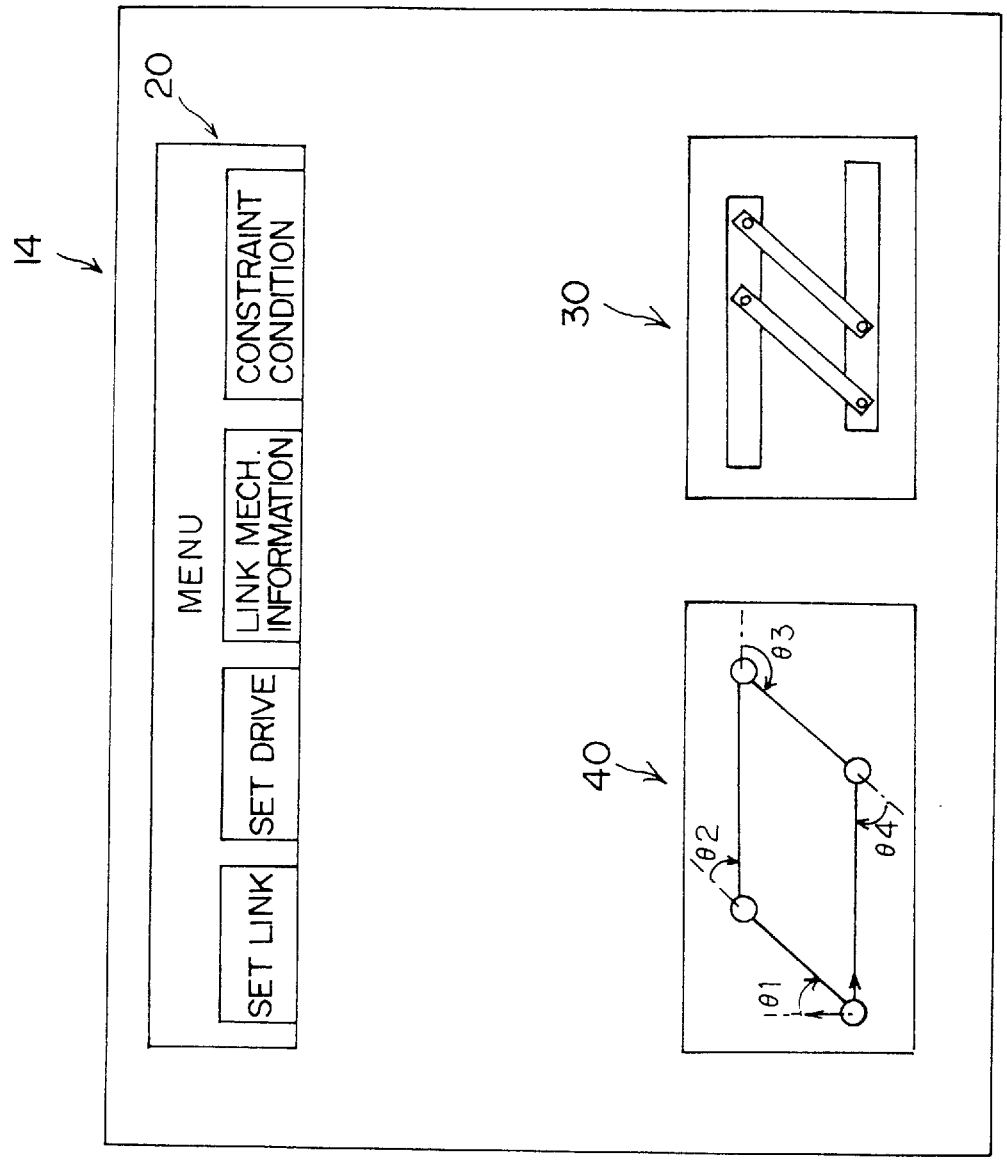
FIG. 4 is an illustration showing one aspect of a screen displayed on a CRT display.

FIG. 4 is an illustration showing one aspect of a screen displayed on a CRT display.

According to the present embodiment, while it is possible to open various screens on a CRT display 14, typically, as shown in FIG. 4, there are displayed a menu screen 20 consisting of a menu title group, a CG screen 30 representative of a three-dimensional geometry of a link mechanism to be analyzed, produced on the basis of the geometry data of the link mechanism, and a link mechanism model screen 40 for displaying an illustration of a link mechanism model corresponding to the link mechanism to be analyzed, selected by the user in accordance with a way as will be described later.

While the CG screen 30 is drawn superficially, the CG screen 30 is created on the basis of the geometry data representative of a three-dimensional geometry of the link mechanism to be analyzed. Thus, there may be displayed CG screens looking at the three-dimensional geometry from various directions in accordance with an instruction of the user.

Figure 5:
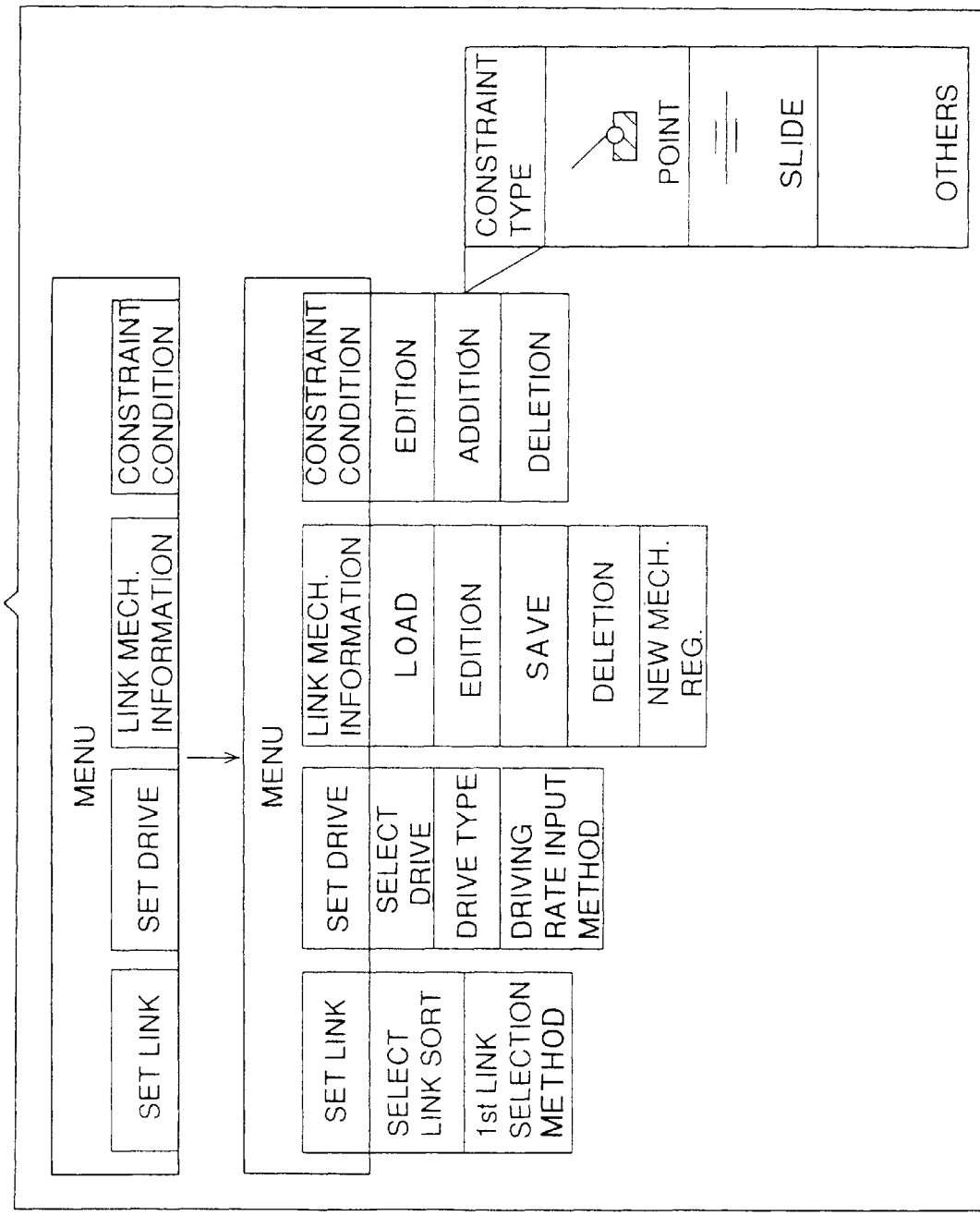
FIG. 5 is a view representative of tables of a main menu and a submenu.

FIG. 5 is a view representative of tables of a main menu and a submenu;

The menu screen 20 shown in FIG. 4 is only a main menu. When anyone of "set link", "set drive", "link mechanism information" and "constraint condition", which are displayed in the main menu, is selected using the mouse 13, various sort of sub-menus according to the selected menu title is displayed, and a desired menu title may be selected from among the sub-menus. In this manner, the user may input various instructions into the link mechanism analyzer. The meaning of the menu titles will be explained later in conjunction with the respective operations. It is also possible to input various instructions through the keyboard 12.

Hereinafter, the present embodiment will be explained in conjunction with the user's operations. Incidentally, here, the link mechanism to be analyzed is "parallel crank" by way of example. However, there will be exemplarily shown also "1 link" and "crank", if necessary, as well as the "parallel crank".

When data (geometry data and joint data) of the link mechanism to be analyzed are inputted to the link mechanism analyzer 100, as shown in FIG. 3, there is displayed on the CRT display unit 14 a CG screen 30 (here parallel crank) based on the entered geometry data.

Next, for the purpose of analysis of the link mechanism, the user selects from among a plurality of sorts of link mechanism models a link mechanism model of a parallel crank corresponding to the CG screen 30 of a parallel crank appearing on the CG screen 30. This selection is carried out in the following manner.

Figure 6:
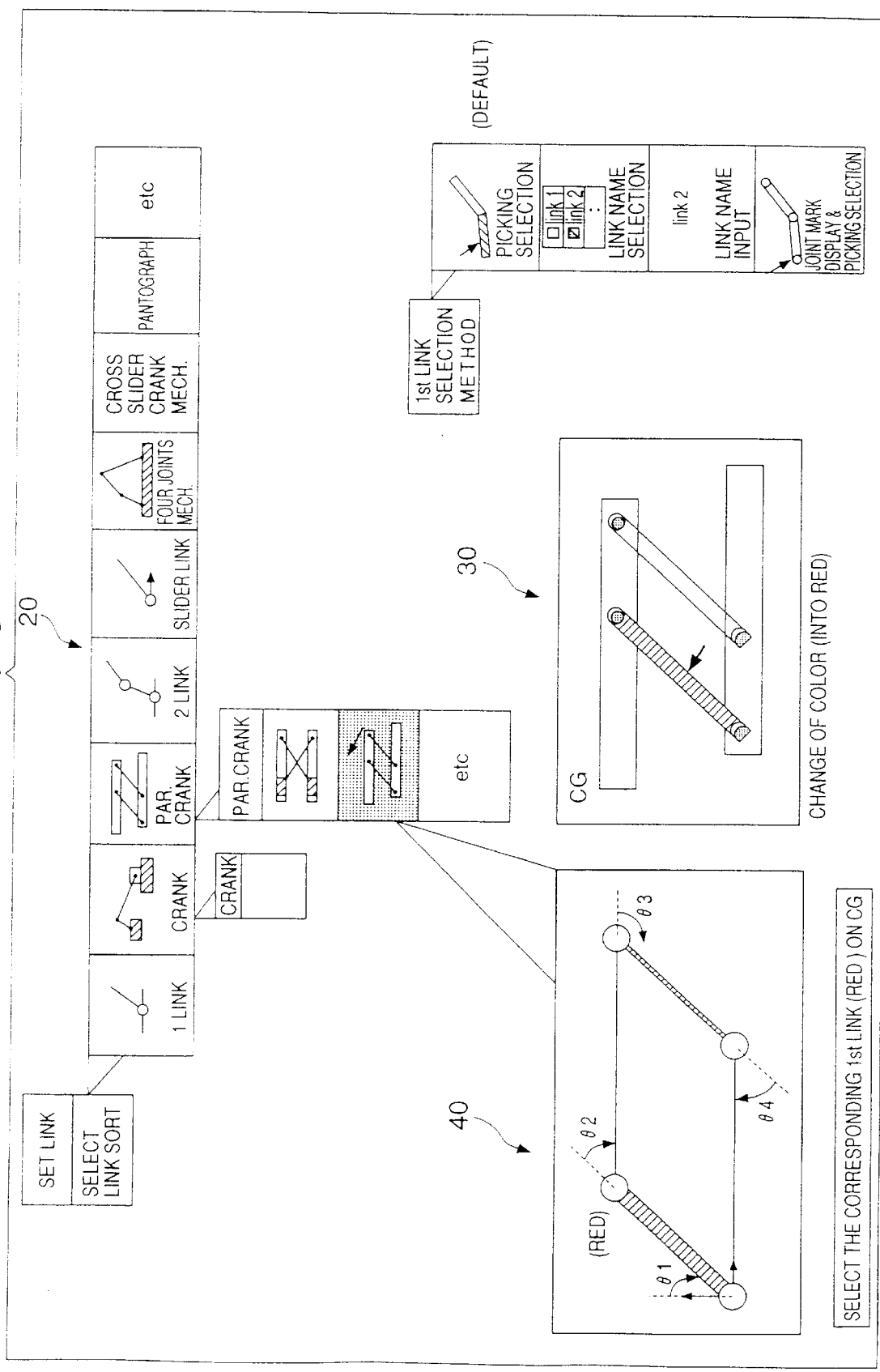
FIG. 6 is an explanatory view useful for understanding an operational procedure of a selection of a link mechanism model and the subsequent selection of the first link.
Figure 7:
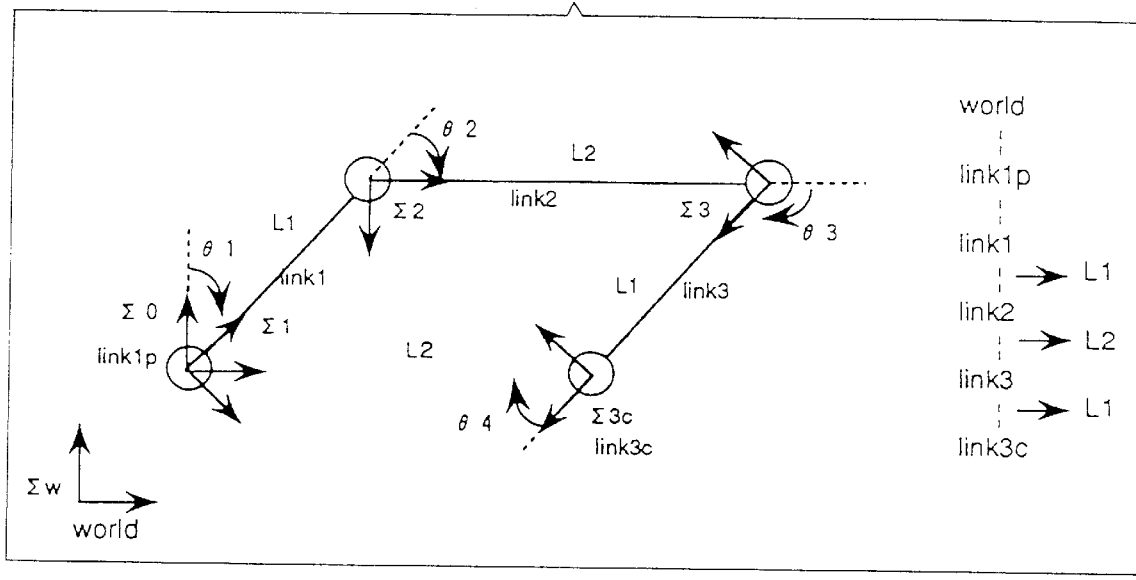
FIG. 7 is an illustration showing a link coordinate system of a link mechanism model of a parallel crank, and a membership.
Figure 8:
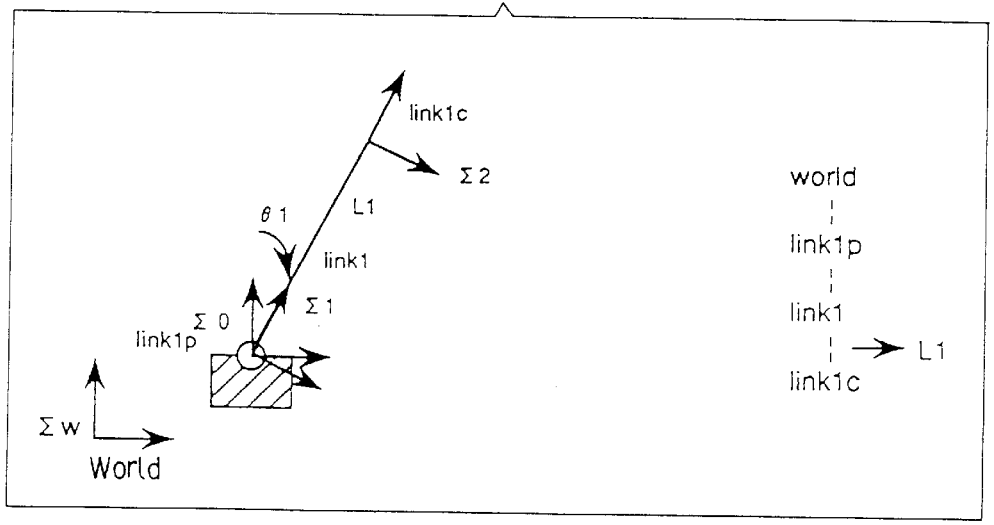
FIG. 8 is an illustration showing a link coordinate system of a link mechanism model of one link, and a membership.
Figure 9:
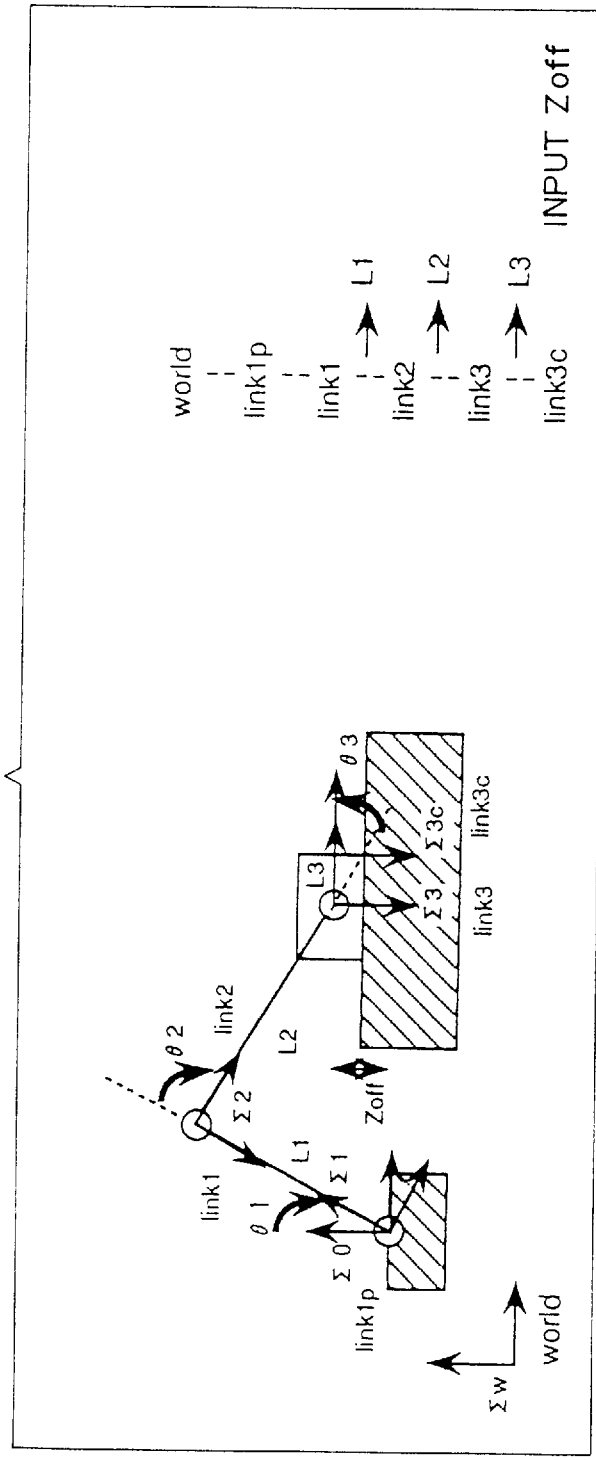
FIG. 9 is an illustration showing a link coordinate system of a link mechanism model of a crank, and a membership.

FIG. 6 is an explanatory view useful for understanding an operational procedure of a selection of a link mechanism model and the subsequent selection of the first link. FIGS. 7 is an illustration showing a link coordinate system of a link mechanism model of a parallel crank, and a membership. FIG. 8 is an illustration showing a link coordinate system of a link mechanism model of one link, and a membership. FIG. 9 is an illustration showing a link coordinate system of a link mechanism model of a crank, and a membership.

First, the cursor of the mouse 13 is brought into line with the menu title "set link" in the main menu, and then the mouse 13 is clicked, so that the "set link" is selected. Hereinafter, this operation is referred to simply as a selection of "set link", or a depression of "set link" button. This is similar to the matter of other menu titles.

When the menu title "set link" is selected, there appears on the screen the submenus "select link sort" and "1st link selection method" (cf. FIG. 5). Thus, the "select link sort" is selected therebetween.

Then, as shown in FIG. 6, there are displayed the menu titles corresponding to the various link mechanism models, such as "1 link", "crank", "parallel crank", "2 link", "slider-link", "four joint mechanism", "closs slider-crank mechanism", and "pantograph".

Next, the "parallel crank" is selected. Then, there is displayed menu titles of several link mechanism models which belong to the parallel crank, and thus the menu title of the link mechanism model suitable for the analysis of the link mechanism to be analyzed is selected. Thus, there is displayed an illustration screen 40 of the parallel crank finally selected.

Likely, after a selection of the "set link" is selected, if the "1st link selection method" is selected, there will be displayed the menu titles corresponding to a plurality of 1st link selection methods prepared beforehand.

The link mechanism is defined with an array of coordinate systems in such a fashion as a first link of coordinate systems defined by a connection relation with a world coordinate system, a second link of coordinate systems defined by a connection relation with the first link, . . . , a coordinate systems of the tip of the link mechanism. Here, a set of array of the coordinate systems is referred to as a "link coordinate system", and a connection relation between a plurality of coordinate systems constituting the "link coordinate systems" is referred to as a "membership". According to the present embodiment, as the joint data, the link coordinate systems and the membership are described in the form of D-H parameter, and parameter values (length of the respective links and the like) of the D-H parameter. The D-H parameter is well known (cf. for example, "ROBOTICS for mechanical systems" by Shigeki Tohyama, published by Sohgoh Densi Publishing Company), and the detailed explanation will be omitted.

Even if the link mechanism model suitable for the analysis is selected in the above-mentioned manner, it is insufficient to establish a correspondence between the link mechanism model and the link mechanism to be analyzed. There is a need to indicate a correspondence between the respective links and joints constituting the link mechanism to be analyzed and the respective links and joints of the selected link mechanism model. Here, an establishment of the correspondence is performed through designating the first link of the link mechanism to be analyzed.

Specifically, when the link mechanism model suitable for the analysis is selected and its link mechanism model screen 40 is displayed, a "picking selection", as a default (initial state) of the first link selection scheme, is selected, and as a result, there is displayed below the link mechanism model screen 40, as shown in FIG. 6, such a message that "select the corresponding 1st link (red) on a CG". The first link on the link mechanism model screen 40 is displayed in red. In this condition, the user operates to travel the mark of the mouse to the first link of the link mechanism to be analyzed, displayed on the CG screen 30, and clicks the mouse (hereinafter, this operation is referred to as picking of the "first link", and this is the similar as to the matter of other scenes).

Picking of the "first link" on the CG screen 30 causes the first link on the CG screen 30 to be displayed in red, and thus it is indicated that the link is selected as the first link.

Incidentally, according to the present embodiment, with respect to the first link selection schemes, there are prepared, in addition to the "picking selection" described above, a "link name selection" in which a link name read in as data of the link mechanism to be analyzed together with the above-mentioned geometry data and the joint data is displayed together with a button, and the first link is selected through picking of the button; a "link name input" in which a link name is inputted through the keyboard 12 (cf. FIG. 3); and a "joint mark display and picking selection" in which marks are displayed on the CG screen 30, and the first link is selected through picking of a mark associated with the first link, of the displayed marks. The user may optionally select a desired one of these selection schemes to select the first link.

In this manner, the link mechanism model corresponding to the link mechanism to be analyzed is selected, and the first link of the link mechanism to be analyzed is designated, thereby establishing a correspondence between the respective links and joints constituting the link mechanism to be analyzed and the respective links and joints of the selected link mechanism model. After an establishment of the correspondence is performed, the link mechanism analyzer is operative to substitute the parameter values (e.g. length of the respective links and the like of the link mechanism to be analyzed) of the D-H parameter extracted from the joint data of the link mechanism to be analyzed by analytical solutions (will be described later) of the forward kinematics and the inverse kinematics corresponding to the link mechanism models established in a correspondence in a fashion as mentioned above.

Here, an extraction method of the parameter values from the joint data will be exemplarily explained.

(In case of the parallel crank; cf. FIG. 7)

The parallel crank comprises, as shown in FIG. 7, a link "link 1p" fixed on a world coordinate systems Σ w, a first link "link 1" coupled to the tip of the link "link 1p", a second link "link 2" coupled via a joint to the tip of the first link "link 1", a third link "link 3" coupled via a joint to the tip of the second link "link 2", and an imaginary link "link 3c" located at the tip of the third link "link 3". There is provided a constraint condition such that the first link "link 1" and the third link "link 3" are equal to each other in their length and are always parallel with each other.

In the fashion as mentioned above, when the link mechanism model of the parallel crank is selected and in addition picking of the first link is implemented, an ID number of the first link is appended to the file in which the joint data is described, and link information in which link coordinate systems and a membership are described is retrieved in the file on the basis of the ID number. Here, as shown in FIG. 7, the name of the first link is "link 1".

Here, link information is referred to, and the parameter values L1, L2 and L1 (in case of the parallel crank, a length of the first link "link 1"=a length of the third link "link 3"), which are representative of link lengths of the first link "link 1", the second link "link 2" and the third link "link 3", respectively, are read on the basis of information (cf. FIG. 7) as to the membership of the link information. The parameters representative of the lengths of the respective links of mathematical expressions representative of analytical solutions of the forward kinematics and the inverse kinematics of the parallel crank are substituted by the parameter values thus read. The details will be described hereinafter.

After the first link "link 1" is specified by the ID of the first link "link 1", information as to the second link "link 2" coupled to the tip of the first link "link 1" is referred to. It is assumed that in such information, as the parameter values of the D-H parameters of the second link "link 2", a length ai of the link, a distance di between links, an angle α i of torsion and an angle θ i between links are described in the form of L1, 0.0, 0.0, 0.0 in the named order, respectively, where i denotes the i-th link, here i=2. In this condition, parameter value L1 (numerical value), which is representative of a length of the link, is read from the parameter values of the D-H parameters of of the second link "link 2". The link parameter representative of length of the first link and the parameter representative of length of the third link of mathematical expressions representative of analytical solutions of the forward kinematics and the inverse kinematics of the parallel crank are substituted by the parameter value L1 thus read (in case of the parallel crank, a length of the first link "link 1"=a length of the third link "link 3").

Next, information as to the third link "link 3" coupled to the tip of the second link "link 2" is referred to. It is assumed that as the parameter values of the D-H parameters of the link "link 3", a length ai of the link, a distance di between links, an angle α i of torsion and an angle θ i between links are described in the form of L2, 0.0, 0.0, $\theta_{off}$ in the named order, respectively, where L2 stands for a length of the second link, and $\theta_{off}$ denotes a predetermined offset value representative of the angle between links. In this condition, parameter value L2 (numerical value) is read from this information. The link parameter representative of length of the second link of mathematical expressions representative of analytical solutions of the forward kinematics and the inverse kinematics of the parallel crank are substituted by the parameter value L2.

(In case of one link; cf. FIG. 8)

One link comprises, as shown in FIG. 8, a world coordinate systems Σ w, a link "link 1p", a first link "link 1" coupled to the tip of the link "link 1p", and an imaginary link "link 1c" located at the tip of the first link "link 1".

In a similar fashion to that of the parallel crank, after the first link "link 1" is specified by the ID of the first link "link 1", information as to the link "link 1c" coupled to the tip of the first link "link 1" is referred to. It is assumed that in such information, as the parameter values of the D-H parameters of the link "link 1c", a length ai of the link, a distance di between links, an angle α i of torsion and an angle θ i between links are described in the form of L1, 0.0, 0.0, 0.0 in the named order, respectively. In this condition, parameter value L1 (numerical value), which is representative of a length of the first link "link 1", is read. The link parameter representative of length of the first link of mathematical expressions representative of analytical solutions of the forward kinematics and the inverse kinematics of the one link are substituted by the parameter value L1 thus read.

(In case of the crank; cf. FIG. 9)

The crank comprises, as shown in FIG. 9, a world coordinate systems Σ w, a link "link 1p", a first link "link 1" coupled to the tip of the link "link 1p", a second link "link 2" coupled via a joint to the tip of the first link "link 1", a third link "link 3" coupled via a joint to the tip of the second link "link 2", and an imaginary link "link 3c" located at the tip of the third link "link 3". There is provided a constraint condition such that the tip of the third link "link 3" is slidable only in a direction X (a horizontal direction in the figure) at the position which is different in a height by an offset value $Z_{off}$ in a direction Z (a vertical direction of the figure) with respect to the origin of the coordinate Σ 0.

In a similar fashion to that of the parallel crank, after the first link "link 1" is specified by the ID of the first link "link 1", information as to the second link "link 2" coupled to the tip of the first link "link 1" is referred to. It is assumed that in such information, as the parameter values of the D-H parameters of the second link "link 2", a length ai of the link, a distance di between links, an angle α i of torsion and an angle θ i between links are described in the form of L1, 0.0, 0.0, 0.0 in the named order, respectively. In this condition, parameter value L1 (numerical value), which is representative of a length of the first link "link 1", is read. The link parameter representative of length of the first link of mathematical expressions representative of analytical solutions of the forward kinematics and the inverse kinematics of the one link are substituted by the parameter value L1 thus read.

Next, information as to the third link "link 3" coupled to the tip of the second link "link 2" is referred to. It is assumed that in such information, as the parameter values of the D-H parameters of the third link "link 3", a length ai of the link, a distance di between links, an angle α i of torsion and an angle θ i between links are described in the form of L2, 0.0, 0.0, 0.0 in the named order, respectively. In this condition, parameter value L2 (numerical value), which is representative of a length of the second link "link 2", is read. The link parameter representative of length of the second link of mathematical expressions representative of analytical solutions of the forward kinematics and the inverse kinematics of the link are substituted by the parameter value L2 thus read.

Further, information as to the link "link 3c" coupled to the tip of the third link "link 3" is referred to. It is assumed that in such information, as the parameter values of the D-H parameters of the third link "link 2", a length ai of the link, a distance di between links, an angle α i of torsion and an angle θ i between links are described in the form of L3, 0.0, 0.0, 0.0 in the named order, respectively. In this condition, parameter value L3 (numerical value), which is representative of a length of the third link "link 3", is read. The link parameter representative of length of the third link of mathematical expressions representative of analytical solutions of the forward kinematics and the inverse kinematics of the link are substituted by the parameter value L3 thus read.

According to the present embodiment, the link parameter for the forward kinematics and the inverse kinematics may be set up, using the D-H parameters, in a simple operation such that the link mechanism model is selected and the first link is designated, simply, as in a fashion described above. Consequently, according to the present embodiment, it is possible to set up mathematical expressions of the forward kinematics and the inverse kinematics for an analysis of the link mechanism, without need of inputting newly the link parameters for an analysis of the link mechanism to be analyzed.

In this manner, the user sets up a link analysis model corresponding to the link mechanism to be analyzed, and then actually operates the link mechanism on a simulation basis to perform the performance confirmation. For the purpose of implementing this, according to the present embodiment, first, a link or a joint to be a drive source for the link mechanism to be analyzed is designated in accordance with a fashion as set forth below.

A "set drive" in the main menu shown in FIGS. 4 and 5 is selected.

When a "set drive" is selected in the main menu shown in FIGS. 4 and 5, there appear on a CRT display, as shown in FIG. 5, submenu titles "select drive", "drive type", and "driving rate input method". Here, the "select drive" is selected therebetween.

Figure 10:
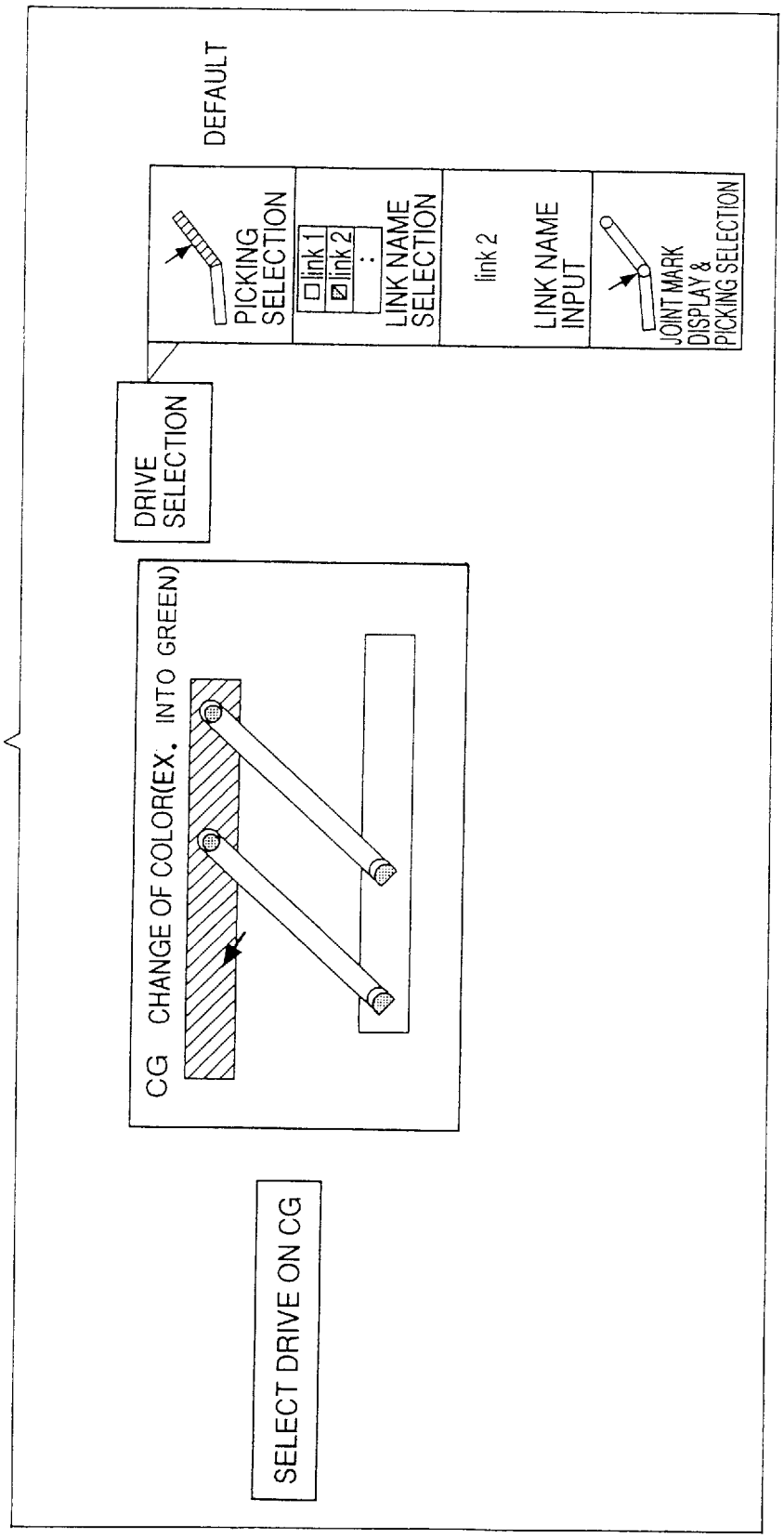
FIG. 10 is a view showing a CG screen displayed when "drive selection" is selected, and a submenu of "drive selection"

FIG. 10 is a view showing a CG screen displayed when "drive selection" is selected, and a submenu of "drive selection".

According to the present embodiment, with respect to the drive selection schemes, there are prepared, as shown in FIG. 10, a "picking selection", a "link name selection", a "link name input", and a "joint mark display and picking selection". As a default (initial setting), the "picking selection" is selected.

When the "picking selection" is selected, there appears on the CRT display a message "select drive on CG". Picking of the link as the drive causes the selected drive (link) to be changed in color into blue on the CG screen, thereby indicating that the link is selected as the drive.

However, exactly speaking, at this time point, it is unclear as to whether the selected link is a drive source for driving the associated link mechanism (in which the selected link serves to change its position and orientation and other links move in compliance with a performance of the selected link), or a joint provided between the selected link and its parent link is a drive source (in which the joint rotates and other joints and the links move in compliance with a performance of the joint).

For those reasons, next, an input is made to instruct which one of these elements (link and joint) is a drive source. Here, a default is set up to imply that the link, which is selected as a drive of these two elements, is a drive source. Thus, it is sufficient for the user to perform a setting operation for a drive source only when the joint is adopted as the drive source. Here, it is referred to as "drive type" which one of the link and the joint is selected as a drive source.

Figure 11:
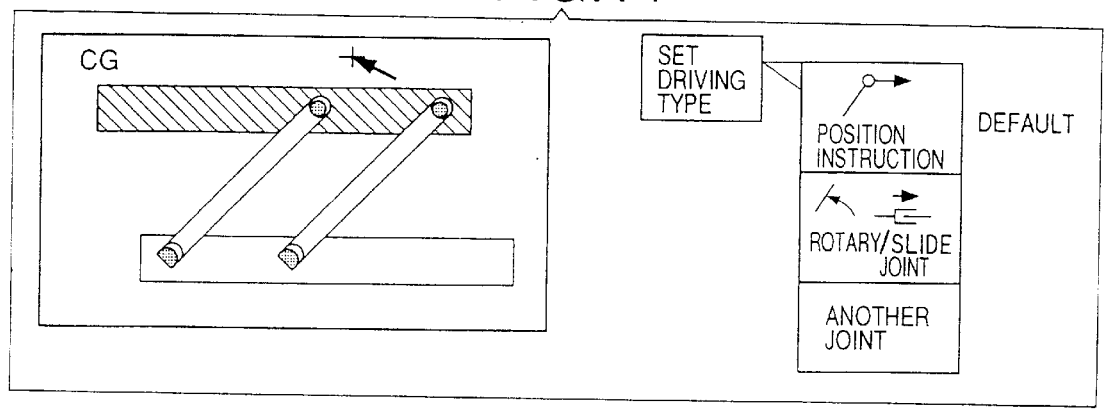
FIG. 11 is an explanatory view useful for understanding a drive type setting scheme.

FIG. 11 is an explanatory view useful for understanding a drive type setting scheme.

When a "drive type" is selected in the submenu shown in FIG. 5, there are displayed menu title groups corresponding to the various drive type selection schemes as shown in FIG. 11.

Here, a link selected as a "position instruction", that is, the drive is a drive source, and it is set up in the form of a default that to input a drive rate its link position is inputted.

When "rotary/slide joint" is selected, it is selected that the drive type is a joint value instruction, that is, that the joint of the base of the link selected as the drive is a drive source, and to input a drive rate an angle of rotation of the joint (in case of a rotary joint) or a translational (slide) rate of the joint (in case of a slide joint) is inputted.

Incidentally, the rotary joint implies a joint which rotates to bring about a change of an angle between links coupled to each other via the rotary joint, and the slide joint implies a joint which serves to bring about a translation (slide) of a link coupled to the tip of the slide joint.

The "another joint" implies joints other than the rotary/slide joint, for example, a universal joint or the like which is a spherical joint and is capable of varying on a three-dimensional basis a direction of a link to which the tip of the joint is coupled. Here, there is shown no example of joints other than the rotary/slide joint, and thus there is omitted an explanation as to an operation when the "another joint" is selected.

When the "position instruction" (default) in the "drive type setting" is selected, even if any link is selected, the inverse kinematics involved in a case where the tip of the associated link mechanism is moved is automatically selected. The automatic selection of such an inverse kinematics serves, when the driving rate described below is inputted, to evaluate an angle of a joint in a case where the tip of the link mechanism is driven by the corresponding driving rate inputted, move the link mechanism, and display the geometry of the link mechanism after the movement in the form of a CG screen.

When the "rotary/slide joint" in the "drive type setting" is selected, the inverse kinematics according to the selected drive and drive type (a joint as the driving source) is automatically selected. The automatic selection of such an inverse kinematics serves, when the driving rate described below is inputted, to evaluate an angle of a joint other than the joint as the driving source and move the link mechanism. Further, the forward kinematics according to the selected drive and drive type is automatically selected. The link mechanism after the movement is displayed in the form of a CG screen.

Next, there will be explained a driving rate input method.

Figure 12:
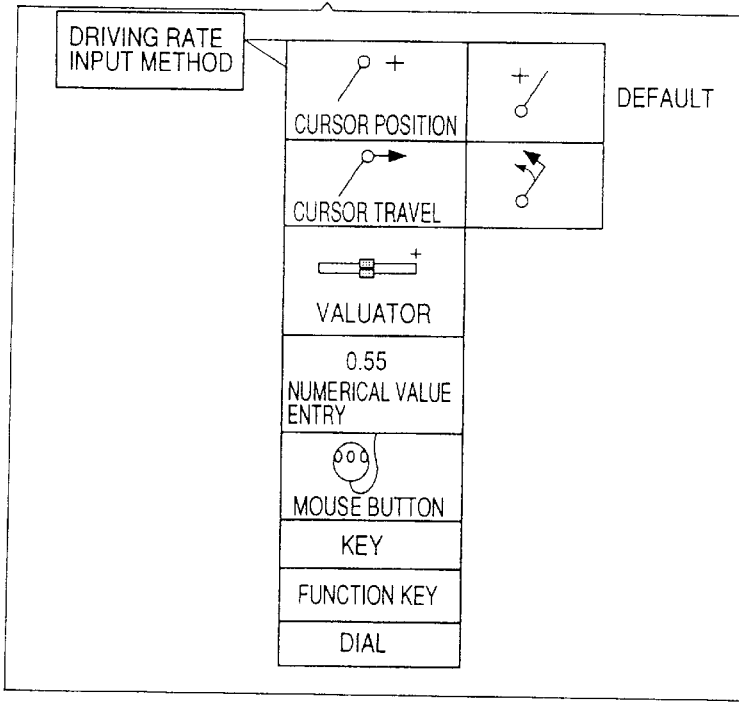
FIG. 12 is an illustration showing a menu title group for instructing a driving rate inputting method.

FIG. 12 is an illustration showing a menu title group for instructing a driving rate inputting method.

After the drive and the drive type are set up in a fashion as mentioned above, there is inputted a drive rate indicating how much the link mechanism is to be driven in rate.

When the menu title "driving rate inputting method" is selected in the submenu of the "set drive" shown in FIG. 5, there are displayed menu title groups corresponding to various driving rate inputting methods, as shown in FIG. 12, where the "cursor position" is set up as a default. As other choices, there are prepared "cursor travel", "valuator", "numerical value entry", "mouse button", "key", "function key" and "dial". Hereinafter, these items will be schematically explained one by one exemplarily taking a case where a "rotary/slide joint" is selected as a drive type".

(cursor position)

Figure 13:
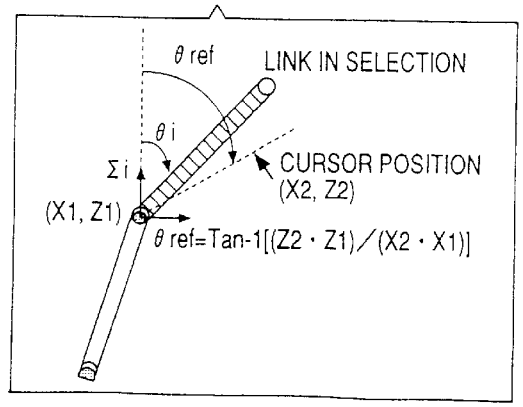
FIG. 13 is an explanatory view useful for understanding a joint angle inputting method according to a cursor position.

FIG. 13 is an explanatory view useful for understanding a joint angle inputting method according to a cursor position.

In case of the joint angle inputting method according to the "cursor position", assuming that the upper position of FIG. 13 with respect to a joint of the base of the link selected as a drive is (X1, Z1) and the position of the cursor set up on the screen through the user's operation of the mouse is (X1, Z1), an angle ($\theta_{ref}$) of rotation of the joint is evaluated through the following expression.

$$\theta_{ref} = \mathrm{Tan}^{-1}[(Z2-Z1)/(X1-X2)]$$

(cursor travel)

The user operates the mouse to move a cursor on the screen in such a manner that the selected link is pulled or pushed with the cursor. Assuming that the initial position of the cursor is denoted by (X1, Z1) and the terminal position of the cursor is denoted by (X2, Z2), the addition or the subtraction of the rate proportional to the following expressions to or from an angle θ of rotation is carried out.

$$\Delta Z = Z2 - Z1$$

$$\Delta X = X2 - X1$$

Thus, an angle ($\theta_{ref}$) of rotation after travel of the joint is evaluated through $$\theta_{ref} = \theta \pm \Delta X \cdot G$$

or, $$\theta_{ref} = \theta \pm \Delta Z \cdot G$$

where G stands for a predetermined proportional constant.

(valuator)

FIG. 14 is an explanatory view useful for understanding a joint angle inputting method according to a valuator.

When the "valuator" is selected, a valuator screen shown in FIG. 14 is displayed. The user operates the mouse to move a cursor to a position of a button of the valuator corresponding to the joint of the driving source, and to pick up the button with the cursor through the mouse operation. The travel corresponds to an angle of rotation of the joint.

(numerical value entry)

FIG. 15 is an explanatory view useful for understanding a joint angle inputting method according to a numerical value entry.

When the "numerical value entry" is selected, a numerical value screen shown in FIG. 15 is displayed. The user operates the keyboard 12 shown in FIG. 3 to select a joint of a driving source so as to input a rotating rate of the selected joint.

(mouse button)

FIGS. 16(A), 16(B) and 16(C) are typical illustrations of various type of mouse buttons useful for understanding a joint angle inputting method according to the mouse buttons.

As the mouse buttons, there are several types of ones, that is, the first type having three buttons 1–3, as shown in FIG. 16(A), the second type having two buttons 1–2, as shown in FIG. 16(B), and third type having only one button 1, as shown in FIG. 16(C).

In a system to which a mouse provided with three buttons 1–3 as shown in FIG. 16(A) is connected, the buttons 1 and 3 are used to evaluate an angle ($\theta_{ref}$) of rotation of the joint as the driving source through the following expressions.

operation of button 1: $\theta_{ref} = \theta - \Delta\theta \cdot dt$ operation of button 3: $\theta_{ref} = \theta + \Delta\theta \cdot dt$ where θ: the current angle of rotation of the joint
Δθ: variation rate of rotating rate per unit time while the mouse button is depressed
dt: time while the mouse button is depressed In a system to which a mouse provided with two buttons 1–2 as shown in FIG. 16(B) is connected, the buttons 1 and 2 are used to evaluate an angle ($\theta_{ref}$) of rotation of the joint as the driving source through the following expressions in a similar fashion to that of the above.

operation of button 1: $\theta_{ref} = \theta - \Delta\theta \cdot dt$ operation of button 1: $\theta_{ref} = \theta + \Delta\theta \cdot dt$ In a system to which a mouse provided with only one button 1 as shown in FIG. 16(B) is connected, when the button 1 is continuously depressed by one time throughout a period of time of Δ t, an angle ($\theta_{ref}$) of rotation of the joint as the driving source is evaluated through the following expression.

$$\theta_{ref} = \theta - \Delta\theta \cdot dt$$

Further, in this system, when the button 1 is continuously depressed through a double click (once depression and immediately after one more depression) throughout a period of time of Δ t, an angle ($\theta_{ref}$) of rotation of the joint as the driving source is evaluated through the following expression.

$$\theta_{ref} = \theta + \Delta\theta \cdot dt$$

(key)

When the "key" is selected, two keys (e.g. j-key and k-key) of the keyboard 12 are used, in a similar fashion to that of the operation of the mouse buttons as mentioned above, to evaluate the followings.

operation of j-key: $\theta_{ref} = \theta - \Delta\theta \cdot dt$ operation of k-key: $\theta_{ref} = \theta + \Delta\theta \cdot dt$ (function key)

When the "function key" is selected, two keys (e.g. F1 key and F2 key) of the keyboard 12 are used, in a similar fashion to that of the operation of the mouse buttons as mentioned above, to evaluate the followings.

operation of F1 key: $\theta_{ref} = \theta - \Delta\theta \cdot dt$ operation of F2 key: $\theta_{ref} = \theta + \Delta\theta \cdot dt$ (dial)

The "dial" is used when the system shown in FIG. 3 is provided with a dial such as a volume dial for a volume control as one of the handlers. A rotating rate of a joint of the driving source is inputted through the dialing operation.

According to the present embodiment, there are prepared various driving rate input methods as mentioned above. Thus, the user may optionally select a desired method according to his requirements. Here, there is exemplarily shown a case where a joint is adopted as the driving source and a rotating rate of the joint is inputted. On the other hand, in a case where a link is adopted as the driving source, the rotating rate of the joint is replaced as an input by a travel in the Z direction or the X direction. With respect to also input methods of a travel of the link, in a similar fashion to that of the input methods of the rotating rate of the joint, there are prepared various input methods as described above. The explanation for those methods is the same as the above, and thus will be omitted.

In this manner, when the drive rate of the driving source is inputted, the forward kinematics or the inverse kinematics according to the drive rate is solved on a numerical value basis, so that a traveling of the link mechanism is carried out. The link mechanism after the traveling is displayed on a CG screen.

Figure 17:
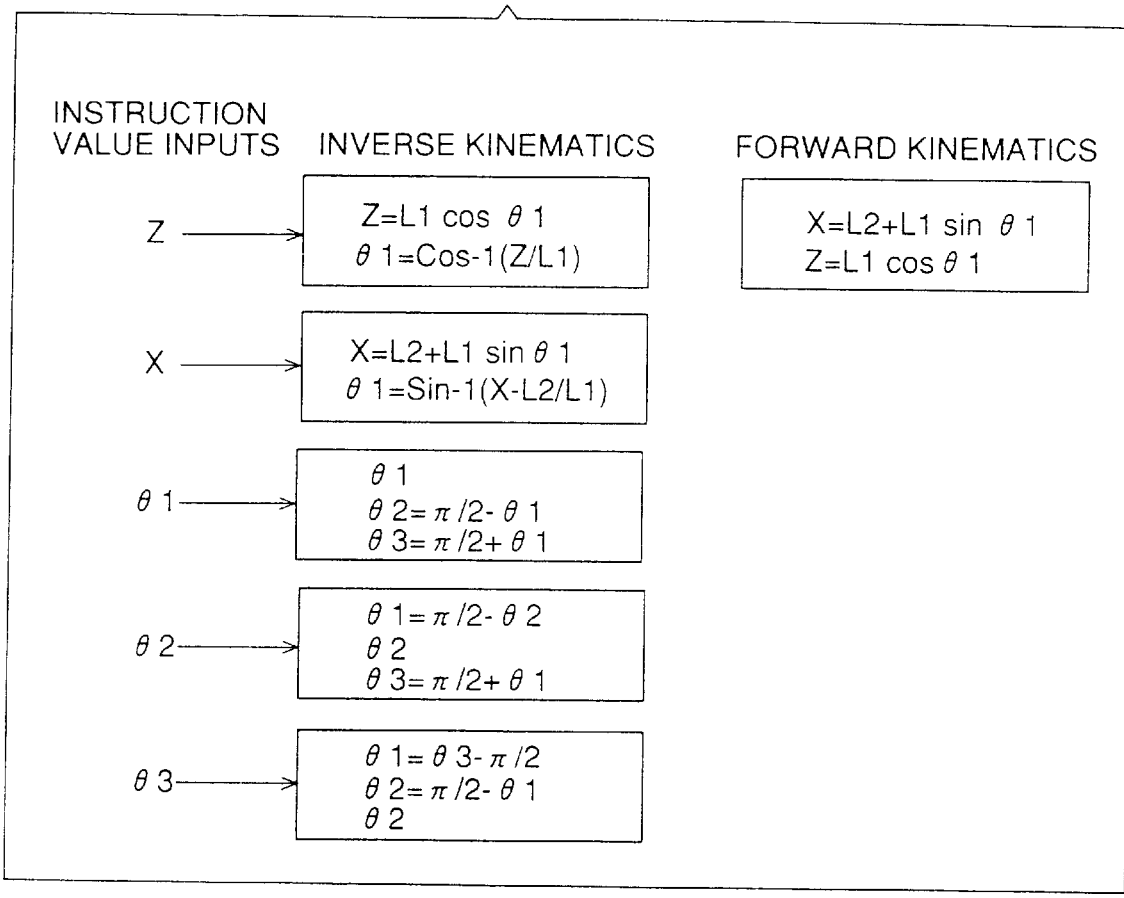
FIG. 17 is an illustration showing the forward kinematics of the parallel cranks and the inverse kinematics of the parallel cranks, associated with instruction value inputs each representative of driving rate.
Figure 18:
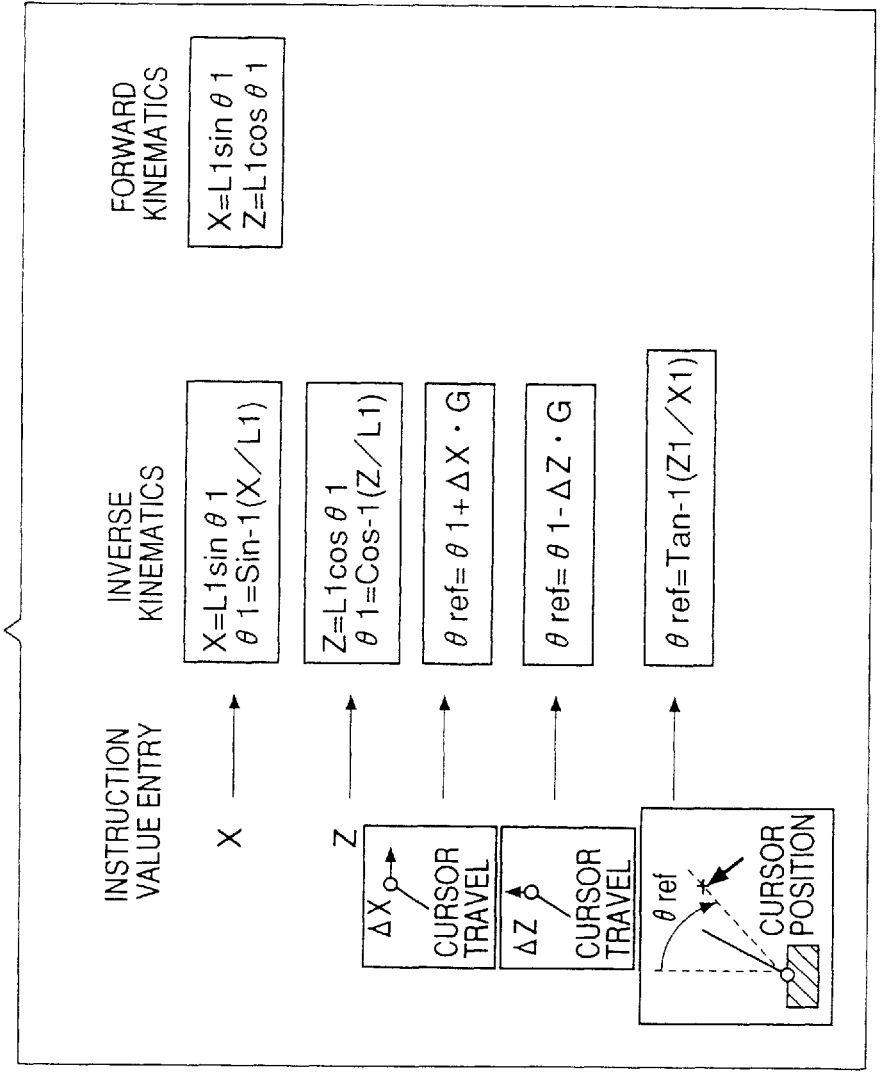
FIG. 18 is an illustration showing the forward kinematics of one link and the inverse kinematics of one link, associated with instruction value inputs each representative of driving rate.
Figure 19:
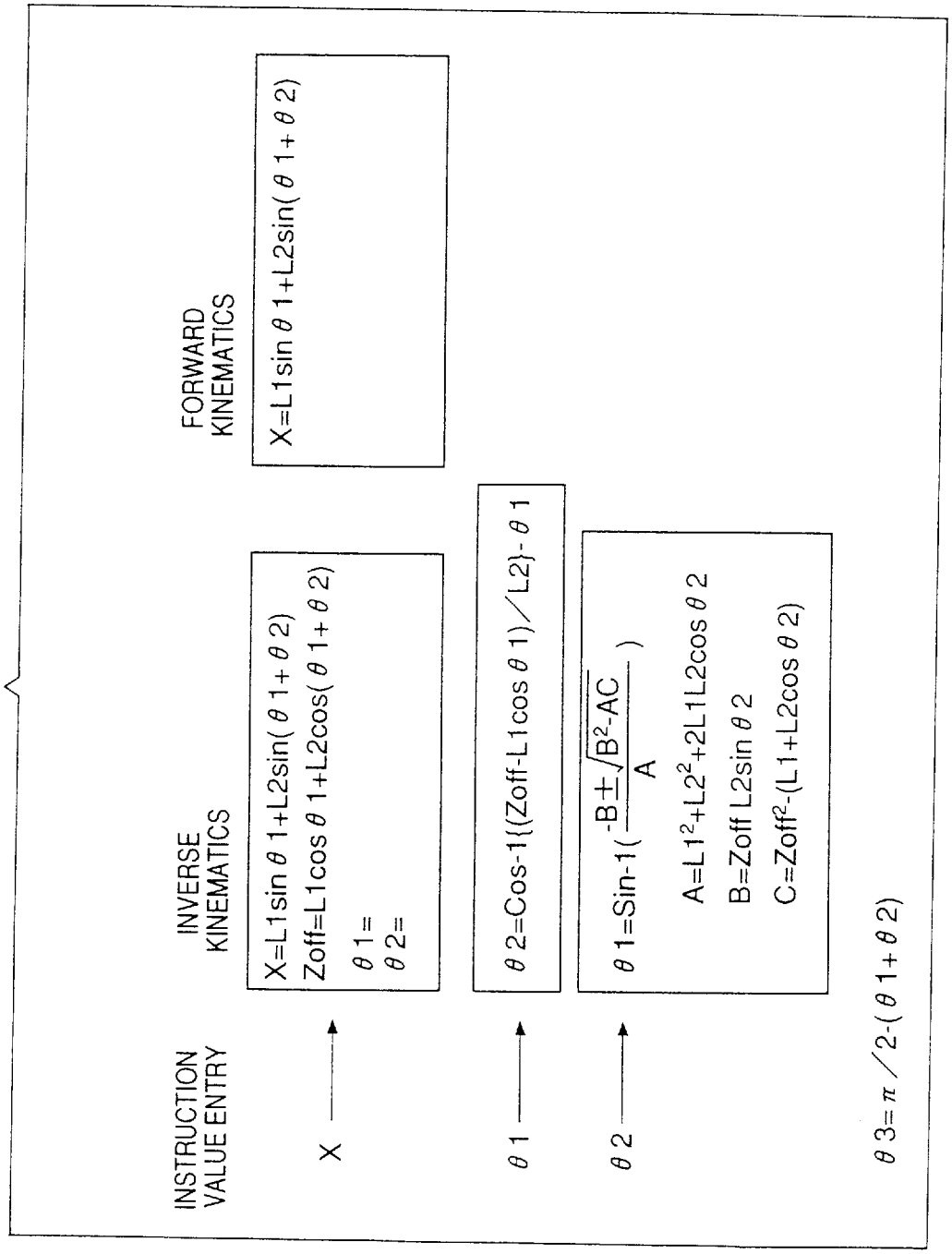
FIG. 19 is an illustration showing the forward kinematics of cranks and the inverse kinematics of cranks, associated with instruction value inputs each representative of driving rate.

FIG. 17 is an illustration showing the forward kinematics of the parallel cranks and the inverse kinematics of the parallel cranks, associated with instruction value inputs each representative of driving rate. FIG. 18 is an illustration showing the forward kinematics of 1 link and the inverse kinematics of 1 link, associated with instruction value inputs each representative of driving rate. FIG. 19 is an illustration showing the forward kinematics of cranks and the inverse kinematics of cranks, associated with instruction value inputs each representative of driving rate.

In case of the parallel crank, when Z, X, $\theta_1$, $\theta_2$, $\theta_3$ (as to a definition of $\theta_1$, $\theta_2$ and $\theta_3$, see FIG. 7) is inputted as instruction values, the instruction values are substituted for the forward kinematics or the inverse kinematics as shown in FIG. 17, which are already solved on an analysis basis, and the geometry of the link mechanism after the movement based on the instruction values is evaluated. The resultant geometry is displayed on a CG display. This is the similar as to the matter of the one link shown in FIG. 18 and the crank shown in FIG. 19.

According to the present embodiment, as mentioned above, the forward kinematics or the inverse kinematics, which are beforehand solved on an analysis basis in accordance with the selected link mechanism drive or drive type, are selected to be solved on a numerical value basis. This feature makes it possible for the user to readily move the link mechanism, without taking into account a complicated matter such that the forward kinematics and the inverse kinematics are inputted and selected.

The fundamental explanation of one embodiment of a link mechanism analyzer according to the present invention is terminated with the above description, and hereinafter there will be explained modifications in which the embodiment is partially modified or added to in part.

Here, there will be explained another method of a selection of the link mechanism model, which may be substituted for the method of a selection of the link mechanism model explained referring to FIGS. 5 and 6.

Figure 20:
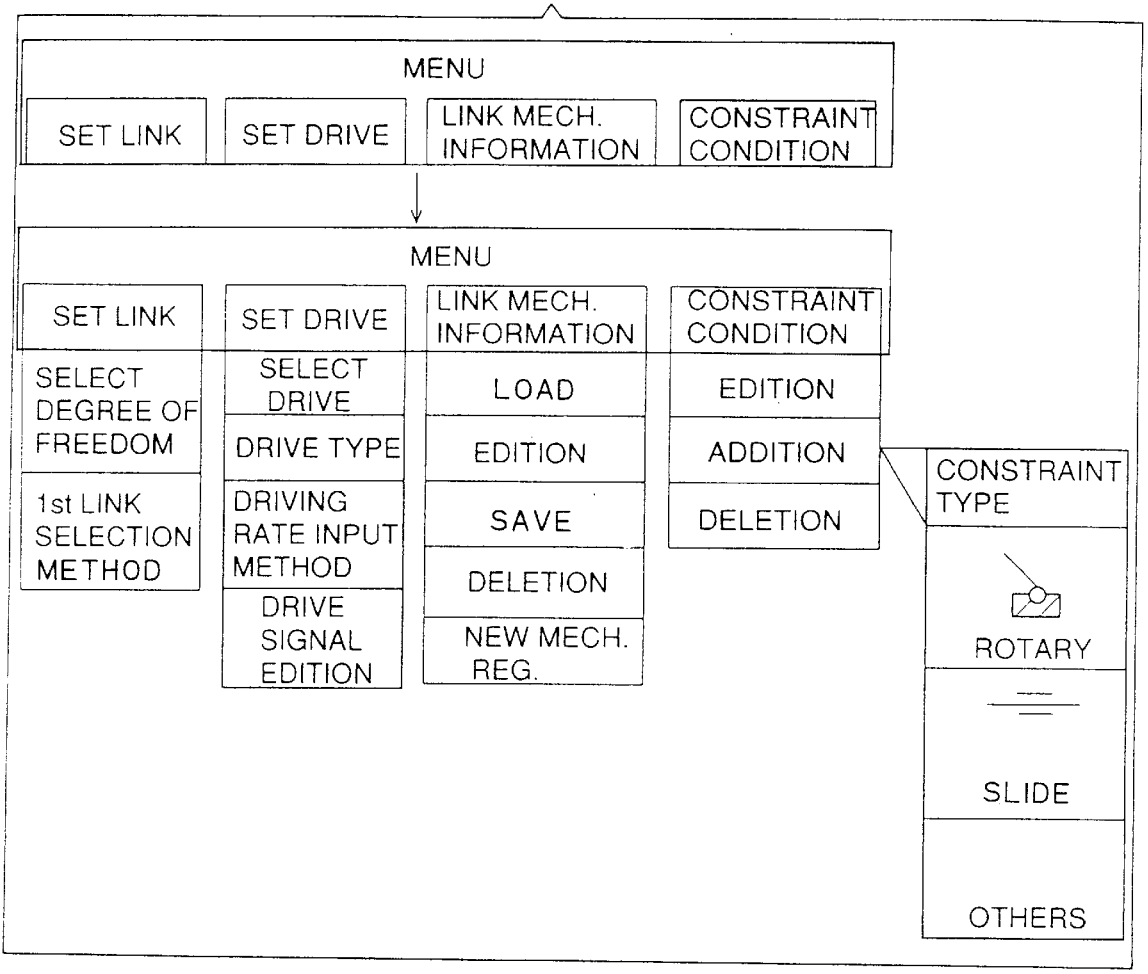
FIG. 20 is a view representative of tables of a main menu and a submenu.
Figure 21:
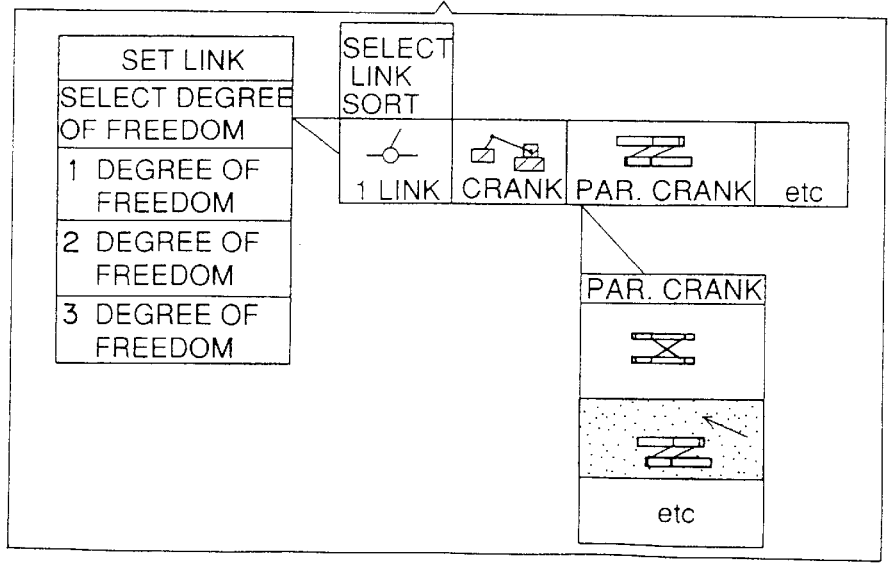
FIG. 21 is an illustration showing a menu title group for various link mechanism models of one degree of freedom.

FIG. 20 is a view representative of a menu screen adopted in the method of a selection of the link mechanism model to be explained here. FIG. 21 is an illustration showing a menu title group for various link mechanism models of one degree of freedom.

When a "set link" is selected in the menu shown in FIG. 20, there are displayed a "select degree of freedom" and a "first link selection method" in the form of a submenu of the "set link". When the "select degree of freedom" is selected, a menu title group as "1 degree of freedom", "2 degree of freedom", 3 degree of freedom" is displayed. Thus, when the "1 degree of freedom" is selected, there are displayed a menu title group corresponding to the link mechanism models of 1 degree of freedom, for example, "1 link", "crank", "parallel crank", . . . When the "parallel crank" is selected, there is displayed menu titles as to several geometry of link mechanism models of the parallel crank. Thus, the user may select from among those menu titles a link mechanism model suitable for the link mechanism to be analyzed of interest.

In this manner, if the link mechanism models are classified with the degree of freedom beforehand, and the menu subjected to such a classification is displayed, it is possible to efficiently perform a selection of the link mechanism.

Next, there will be explained another method of a setting of driving source, which may be substituted for the methods of setting of the drive and the drive type explained referring to FIGS. 10 and 11.

Figure 22:
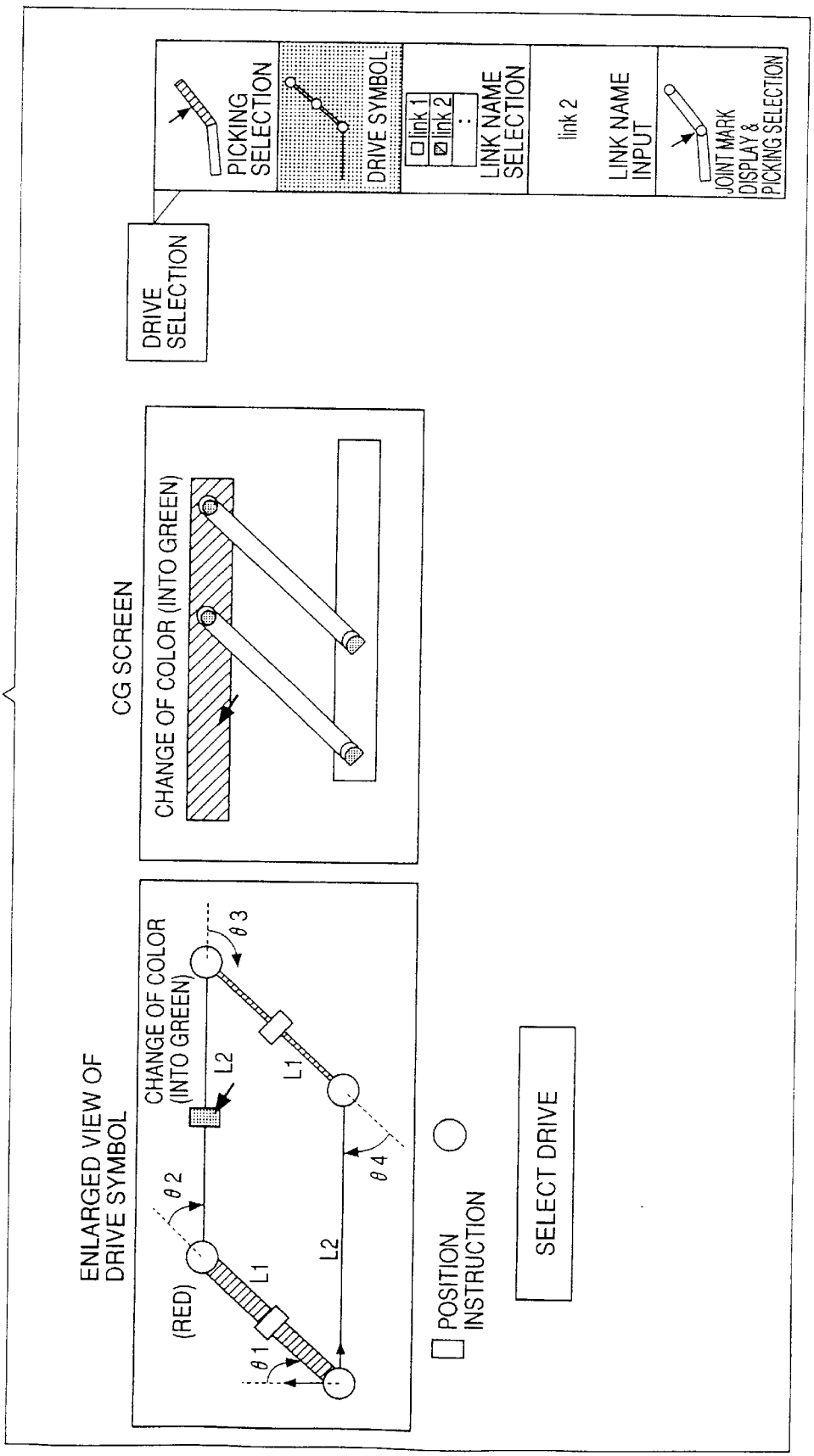
FIG. 22 is an explanatory view useful for understanding a drive source setting method in case of a parallel crank.
Figure 23:
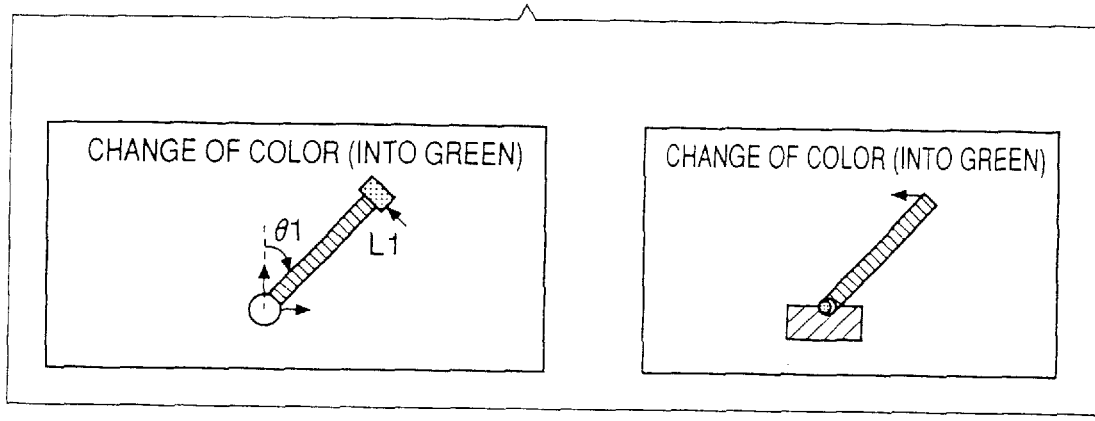
FIG. 23 is an explanatory view useful for understanding a drive source setting method in case of one link.
Figure 24:
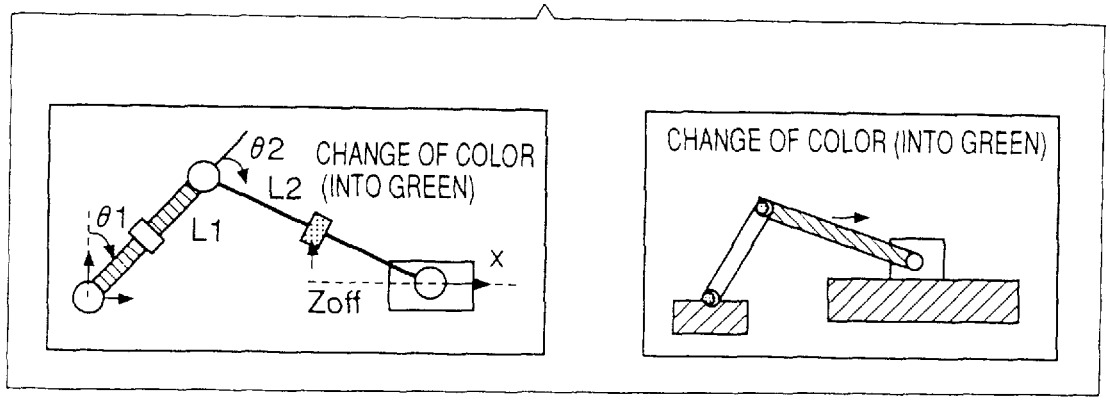
FIG. 24 is an explanatory view useful for understanding a drive source setting method in case of a crank.

FIGS. 22–24 are explanatory views useful for understanding drive source setting methods in cases of a parallel crank, one link and a crank, respectively.

Now assuming that a "drive symbol" is registered in the form of a submenu of the "drive selection" (FIG. 10) through the "set drive" shown in FIG. 5, then the "set drive", the "drive selection" and the "drive symbol" are selected in the named order, after making a selection of the link mechanism and the first link. When a series of those operations is implemented, the drive symbol is displayed on a link mechanism model screen in such a manner that the drive symbol is superimposed on an illustration of the link mechanism model. The drive symbol is partitioned in a symbol mark into two parts of a link (position instruction) and a joint. Consequently, picking of one of those symbol marks makes it possible to simultaneously perform a selection of the drive and a selection of the drive type explained referring to FIGS. 10 and 11 through one operation.

Here, the selections of the drive and the drive type are performed directly on the link mechanism model screen, but not on the CG screen. At this stage, there is already established a correspondence between the respective links and joints of the link mechanism to be analyzed and the respective links and joints of the link mechanism model. Thus, it is possible to set the drive at the end of the link mechanism model screen. Also in case of a selection of the drive by the drive symbol, the link of the selected drive is indicated in green on both the link mechanism model screen and the CG screen.

By the way, in either case of the selection method of the link mechanism model explained referring to FIGS. 5 and 6 and the selection method of the link mechanism model explained referring to FIGS. 20 and 21, the link mechanism model corresponding to the link mechanism to be analyzed is selected on the basis of appearance thereof. It is also true, however, that in some cases the link mechanism model corresponding to the link mechanism to be analyzed cannot be unequivocally determined. The reason why this is so is that in some cases, the link mechanism models are identical in their appearance, but different in a definition (referred to as joint definition) of a coupling relationship between links. It will be explained as to the parallel crank by way of example.

Figure 25:
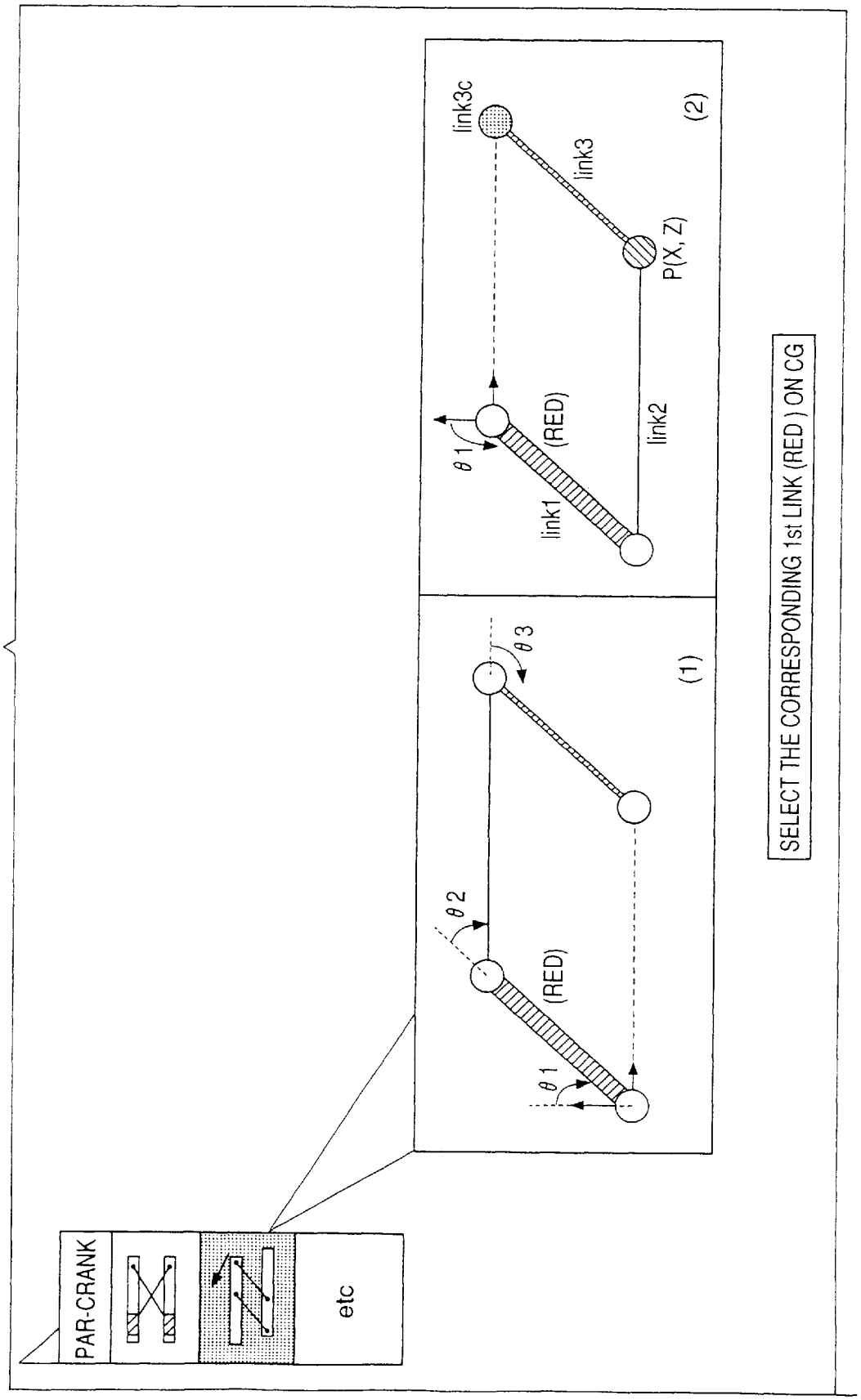
FIG. 25 is a view showing a link mechanism model screen.
Figure 26:
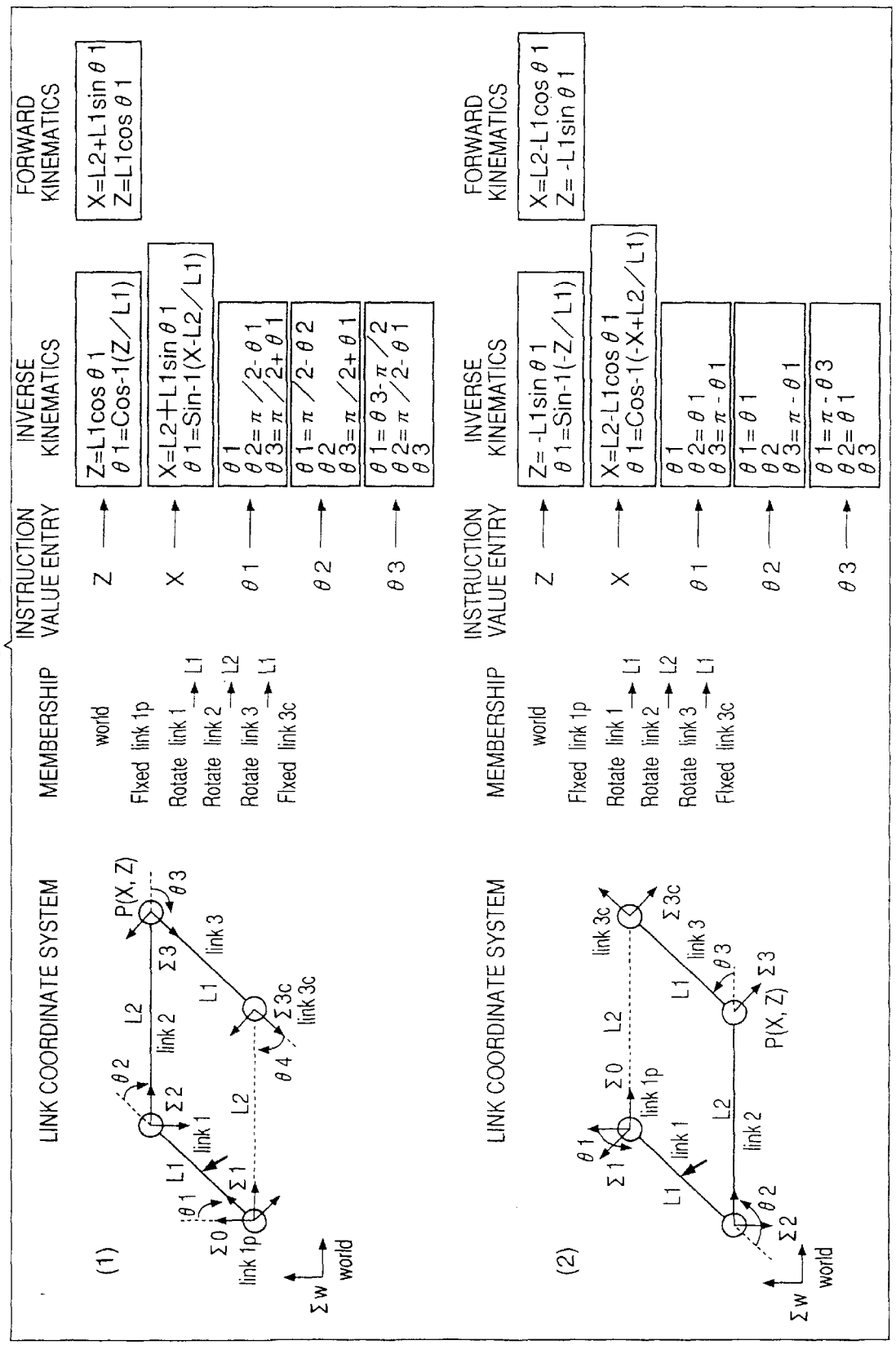
FIG. 26 is an illustration showing the forward kinematics of two link mechanism models displayed on the link mechanism model screen and the inverse kinematics of the two link mechanism models, associated with link coordinate systems, memberships, instruction value inputs.

FIGS. 25 is a view showing a link mechanism model screen in which a menu title is selected to choose a desired geometry of a parallel crank. FIG. 26 is an illustration showing the forward kinematics of two link mechanism models displayed on the link mechanism model screen and the inverse kinematics of the two link mechanism models, associated with link coordinate systems, memberships, instruction value inputs.

As shown in FIGS. 25 and 26, in some cases, there exists a plurality of link mechanism models in which the link mechanism models are identical in their appearance, but different in the joint definition as shown in FIG. 26. In such a case, as shown in FIG. 25, in a state such that a menu title is selected to choose a desired geometry of parallel crank, there is displayed a plurality of link mechanism model screens in which the geometry is the selected one, but the joint definition is different. Thus, the user may choose one of the plurality of link mechanism model screens. Thereafter, likely, the first link is selected on the CG screen.

Alternatively, as shown in FIG. 25, in a case where at the stage that a plurality of link mechanism models are displayed, it is possible to specify a link mechanism model corresponding to the link mechanism to be analyzed, which is displayed on the CG screen, from among the plurality of link mechanism models only through selecting the first link on the CG screen, it is acceptable to specify the link mechanism model corresponding to the link mechanism to be analyzed, which is displayed on the CG screen, through selecting the first link on the CG screen without selecting one of all the plurality of link mechanism models displayed. For example, according to the examples shown in FIGS. 25 and 26, link information as to the link mechanism to be analyzed is referred to, and when the coordinates at the initial state of the joint (corresponding to the joint at P point shown in FIG. 26) of the base of the third link is expressed by P ($X_{int}$, $Z_{int}$), if $Z_{int}$>0, the link mechanism model shown in part (1) of FIG. 26 is selected, and if $Z_{int}$<0, the link mechanism model shown in part (2) of FIG. 26 is selected. Incidentally, it is assumed that Z-coordinates of the origin of the coordinates Σ 0 of the link "link 1p" shown in FIG. 26 is expressed by Z=0. When the link, which is subjected to the picking on the CG screen, is links other than the first link, it implies that such a link is unsuitable as the first link. Thus, there is displayed a message "select the first link once more please".

As mentioned above, if there is provided such an arrangement that in a case where there exist a plurality of link mechanism models each having the identical geometry, only picking of the first link on the CG screen enables one suitable link mechanism model to be automatically selected from among the plurality of link mechanism models, there is no need for the user to take into account a difference in the joint definition therebetween, thereby improving operational efficiency.

Figure 27:
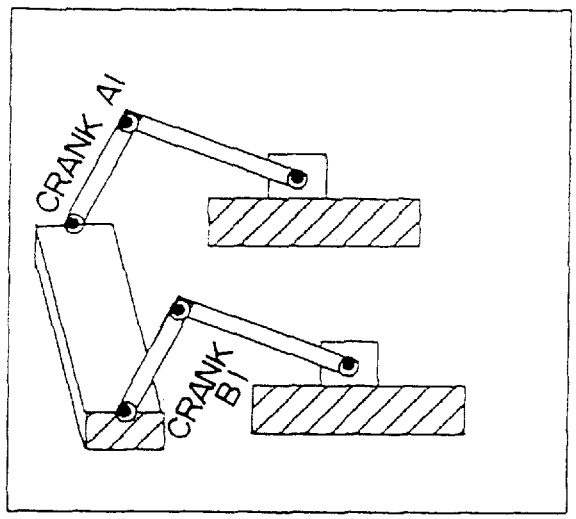
FIG. 27 is an illustration showing an example of a CG screen useful for understanding the necessity of selection of the first link.

FIG. 27 is an illustration showing an example of a CG screen useful for understanding the necessity of selection of the first link.

The above-mentioned embodiments show simple examples for the purpose of explanation of the essential matter of the present invention. In some cases, however, the product of interest to be analyzed in performance is composed of many link mechanisms. Now, as shown in FIG. 27, let us consider, as a little complicated example, an example in which there are provided two cranks.

In this case, to select the first link after the "crank" is selected through the "select link sort", there is a need to practice a picking for either crank A1 or crank A2. In general, however, it is impossible to automatically determine the first link. This is similar to that of other sort of link mechanism. Consequently, in general, the user is obliged to select the first link of the link mechanism on the CG screen.

However, as will be described hereinafter, in some cases, it is possible to specify the first link of the link mechanism on the CG screen without the selection by the user's handling. According to the present embodiment, in the following case, the automatic determination of the first link is feasible.

Figure 28:
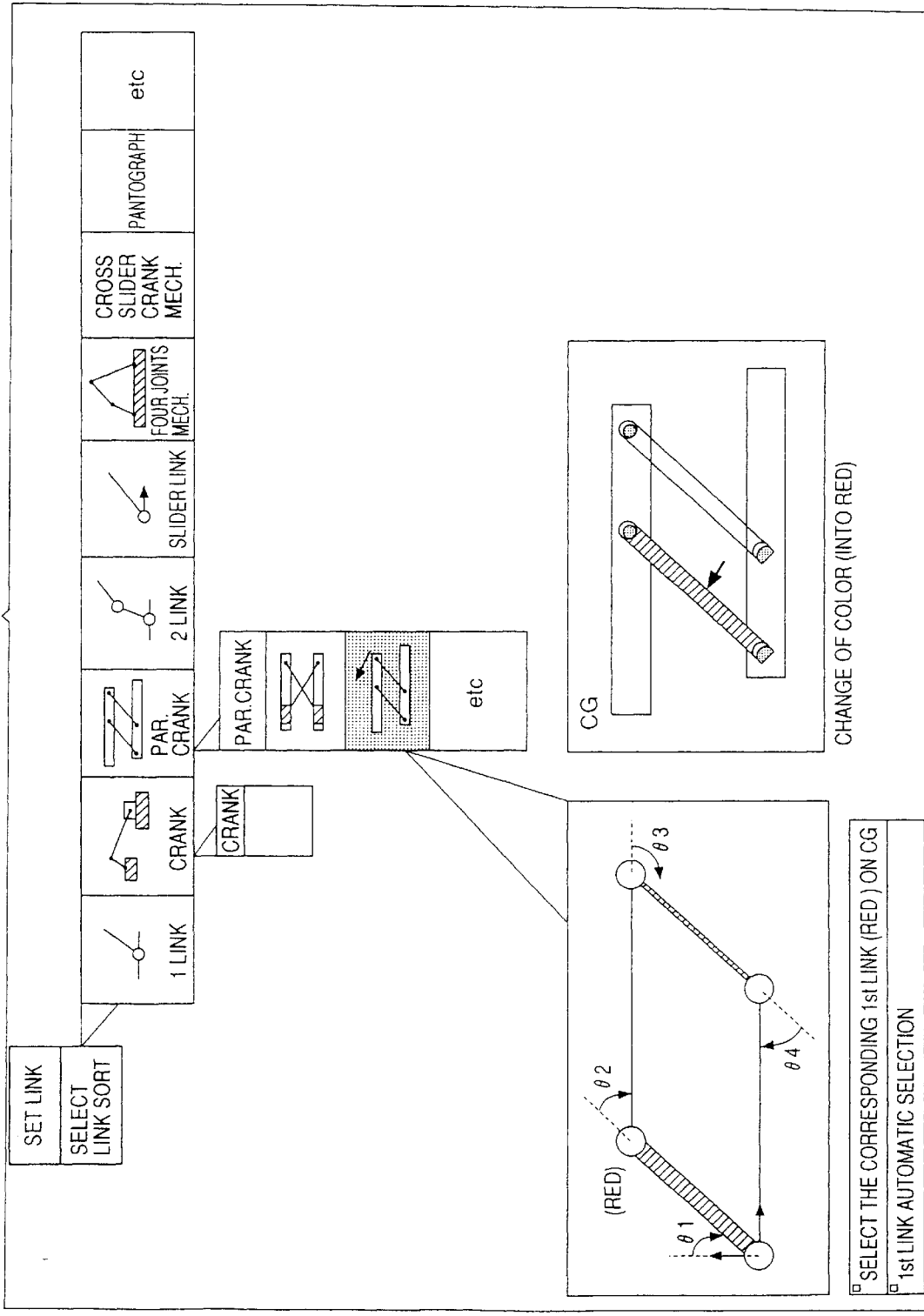
FIG. 28 is an explanatory view useful for understanding an operational procedure of a selection of a link mechanism model and the subsequent selection of the first link.

FIG. 28 is an explanatory view useful for understanding an operational procedure of a selection of a link mechanism model and the subsequent selection of the first link.

In a similar fashion to that of the explanation referring to FIG. 6, at the stage that a link mechanism is selected and the illustration thereof is displayed, if it is possible to automatically select the first link, there are displayed a message "first link automatic selection" as well as a message "select on a CG the corresponding first link (red)". Picking of the "first link automatic selection" enables an automatic selection of the first link of the link mechanism displayed on the CG.

As cases in which the first link can be automatically selected, there are mainly two cases, one of which is involved in a case in which the link mechanism displayed on the CG comprises a single link mechanism, and another is involved in a case in which the link mechanism displayed on the CG comprises a plurality of link mechanisms (cf. for example, FIG. 27), but the first links of all the link mechanisms but one are already selected. Hereinafter, these two cases will be explained.

Figure 29:
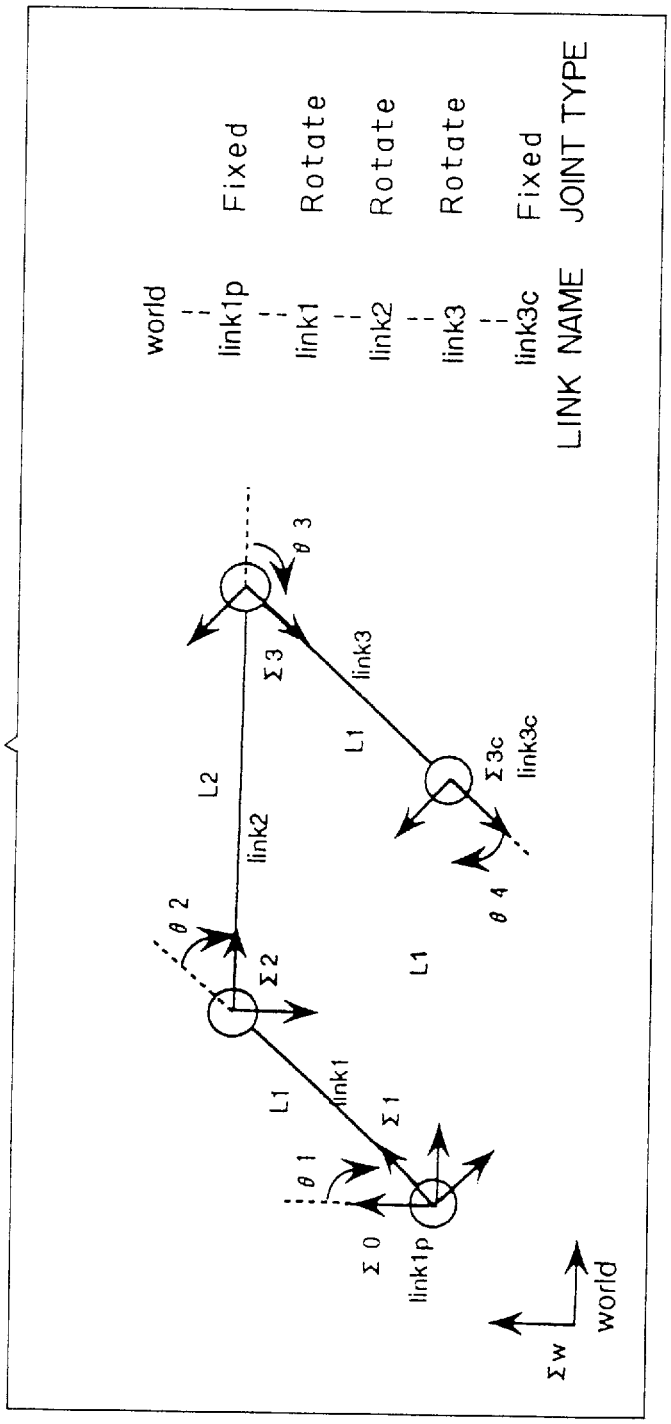
FIG. 29 is an explanatory view useful for understanding an automatic discrimination method for the first link in a case where a single parallel crank is displayed on a CG screen.
Figure 30:
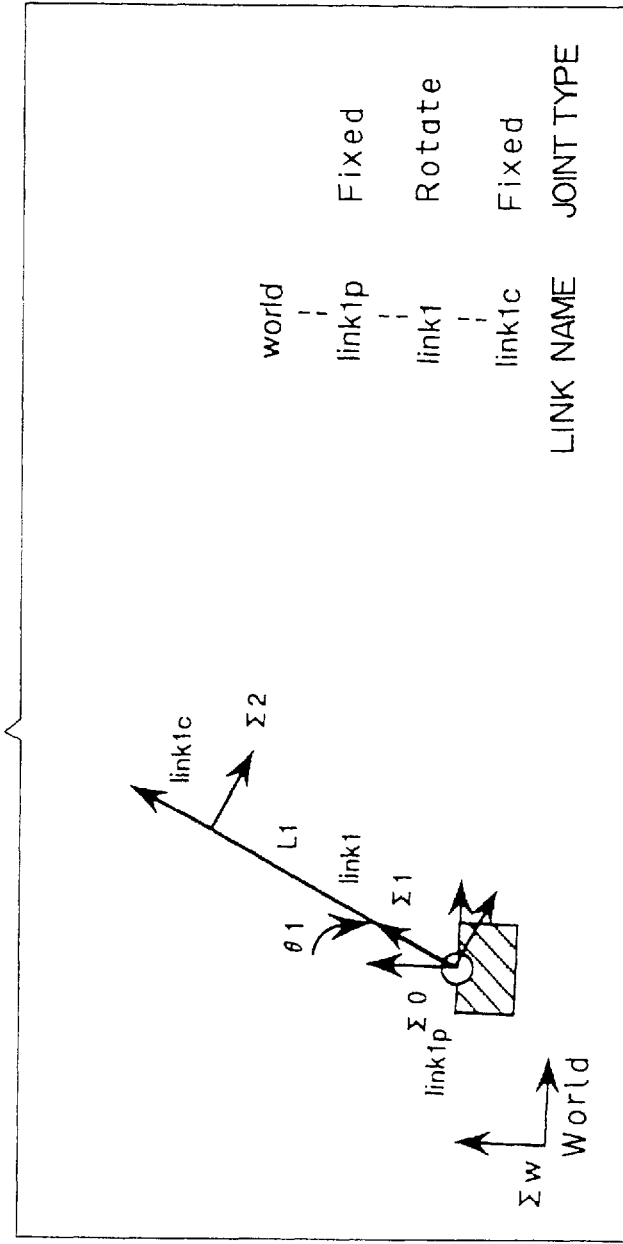
FIG. 30 is an explanatory view useful for understanding an automatic discrimination method for the first link in a case where a single one link is displayed on a CG screen.
Figure 31:
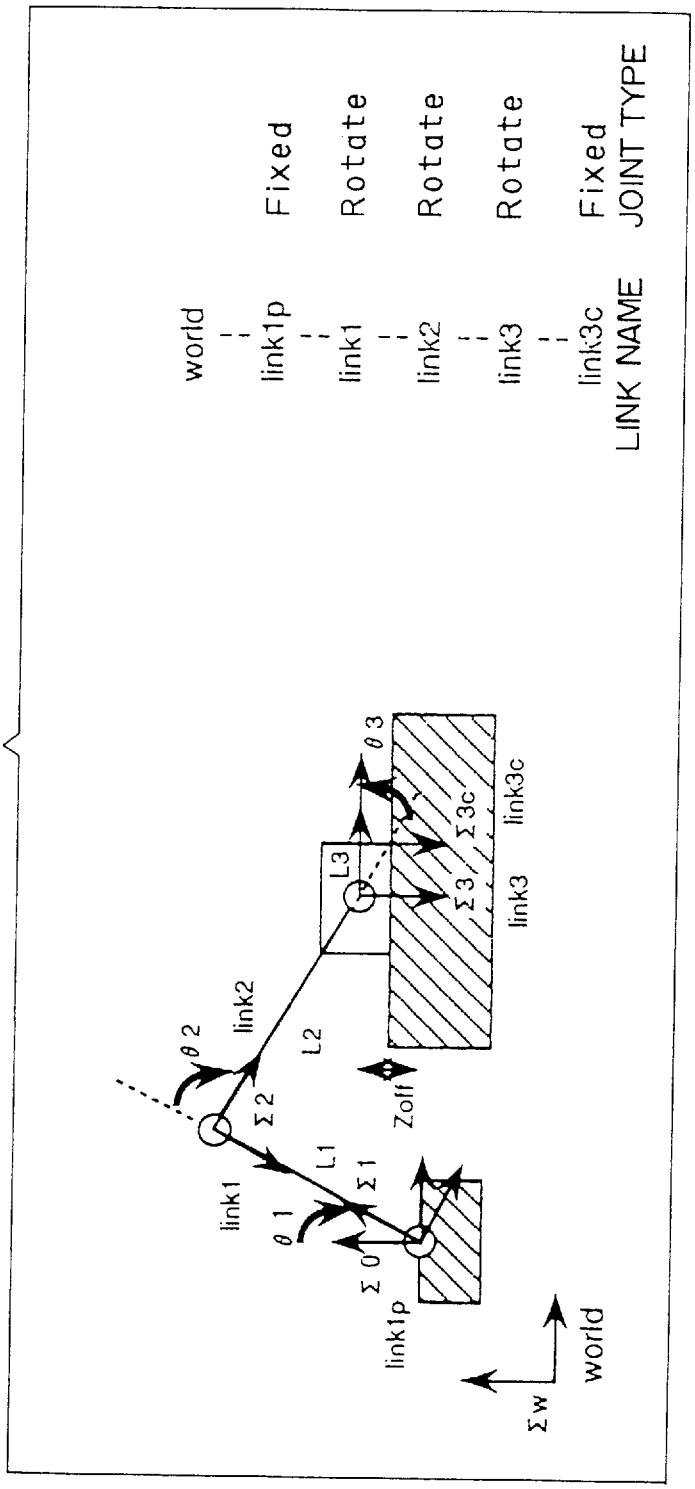
FIG. 31 is an explanatory view useful for understanding an automatic discrimination method for the first link in a case where a single crank is displayed on a CG screen.

FIG. 29 is an explanatory view useful for understanding an a automatic discrimination method for the first link in a case where a single parallel crank is displayed on a CG screen. FIG. 30 is an explanatory view useful for understanding an automatic discrimination method for the first link in a case where a single one link is displayed on a CG screen. FIG. 31 is an explanatory view useful for understanding an automatic discrimination method for the first link in a case where a single crank is displayed on a CG screen.

In any of the parallel crank, the one link and the crank, as shown in FIGS. 29–31, it is determined that when following in turn the memberships shown in FIGS. 29–31 starting from the world coordinates (world), the first rotary type of link is the first link "link 1".

Figure 32:
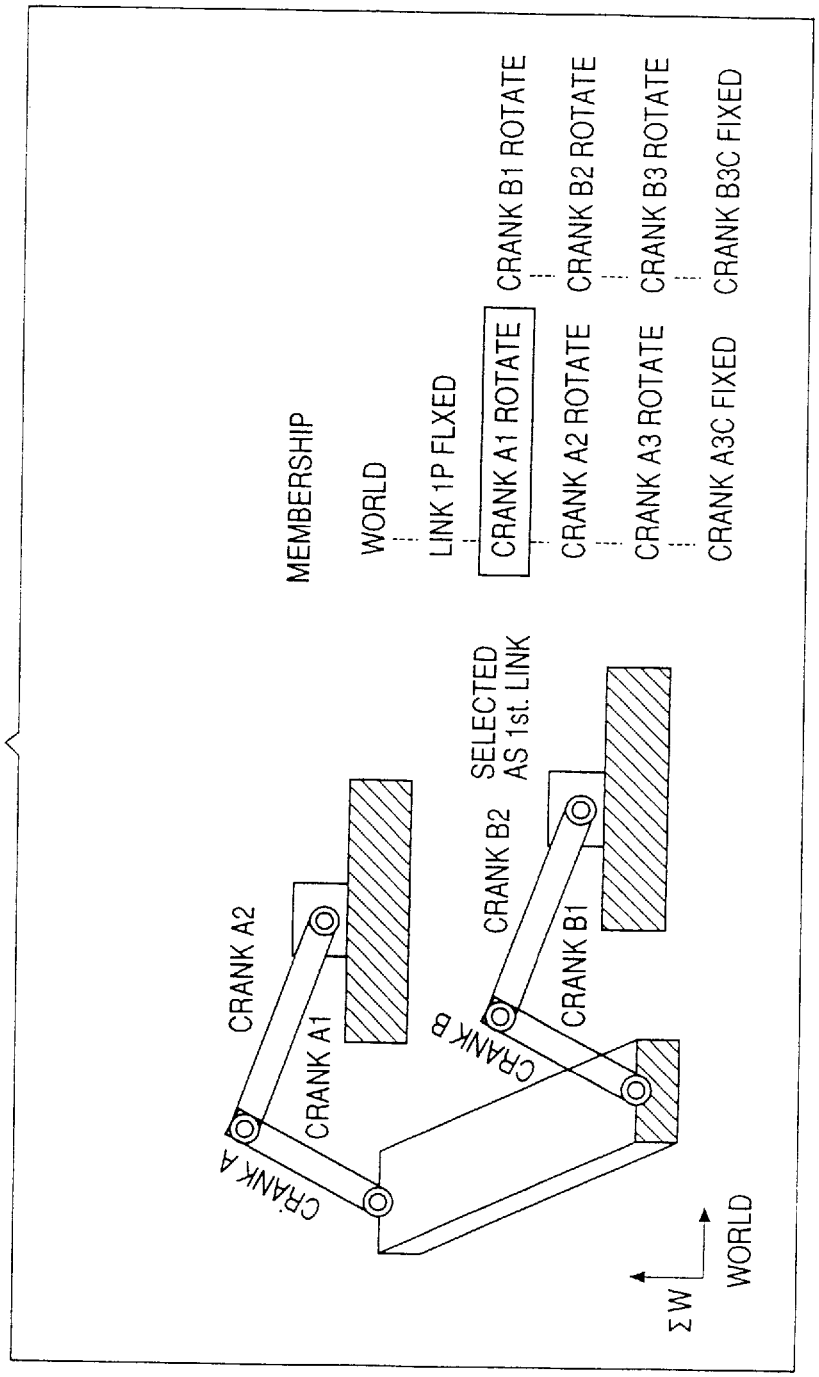
FIG. 32 is an explanatory view useful for understanding an automatic discrimination method for the first link in a case where when a link mechanism having two cranks is displayed on a CG screen, the first link of one of the two cranks has been already selected.

FIG. 32 is an explanatory view useful for understanding an automatic discrimination method for the first link in a case where when a link mechanism having two cranks is displayed on a CG screen, the first link of one of said two cranks has been already selected.

In a state that the first link of both the crank A and the crank B is not selected, there is a possibility that any of the crank A and the crank B becomes the first link. However, for example, in a case where the crank A is already selected in accordance with the above-mentioned method in which the user selects the first link, it is possible to automatically determine the first link of the crank B. A method of the automatic determination is similar to that of the above-mentioned method, that is, in accordance with which method when following in turn the memberships starting from the world, the link (crank B1), which is not yet selected as the first link, is selected as the first link, of the first rotary type of links. This is similar to the matter in which the crank B is the link mechanism other than the crank. This feature makes it possible to simplify operation by the user.

Next, there will be explained a technique of building a new link mechanism model through a combination of a plurality of link mechanism models. Here, there will be explained an example in which a new link mechanism model is built through a combination of two links and a crank of a plurality of link mechanism models which are prepared beforehand.

Here, first, in a similar fashion to that of the above, there are read geometry data and joint data for a link mechanism to be analyzed in which two links and a crank are combined, and the three-dimensional CG model based on the geometry data is displayed on a CG screen.

Figure 33A:
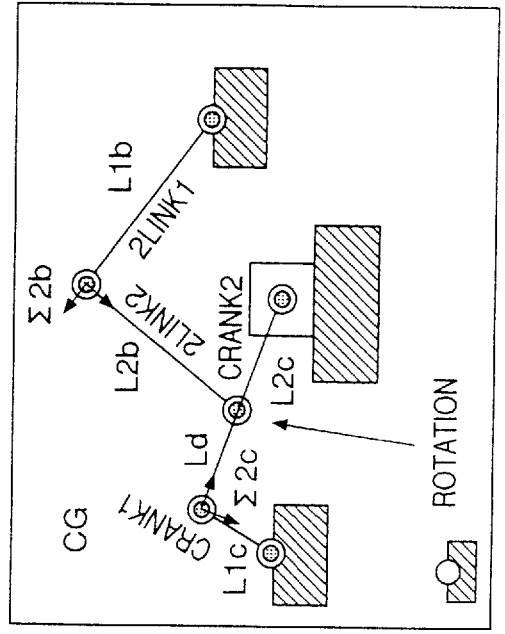
FIGS. 33(A) and 33(B) are illustrations showing a menu title group and a CG model displayed on a CG screen, respectively.
Figure 33B:
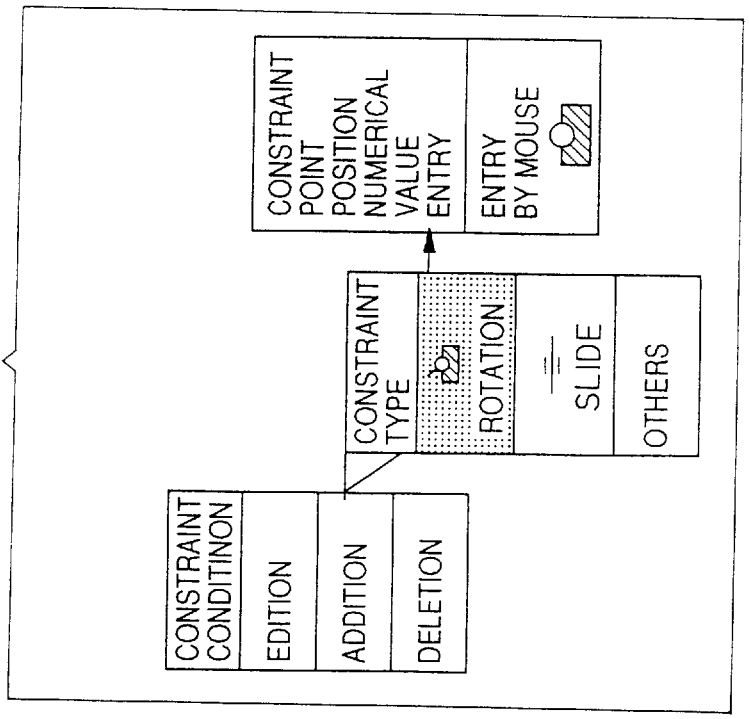
Figure 34A:
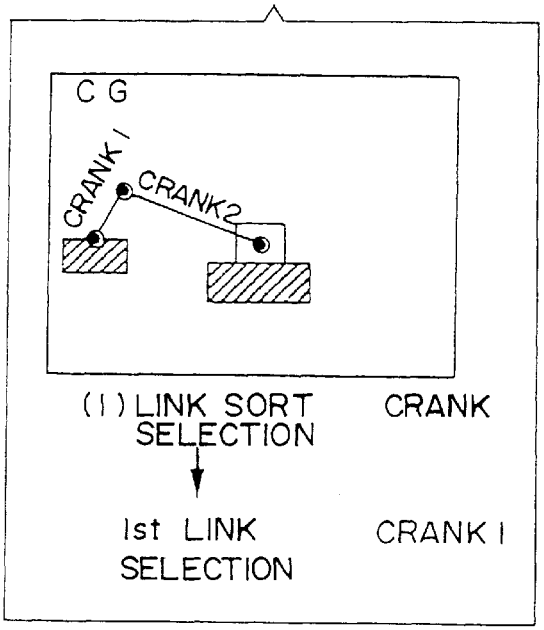
FIGS. 34(A) and 34(B) are illustrations in which the CG model shown in FIG. 32 is separated into the crank and two links.
Figure 34B:
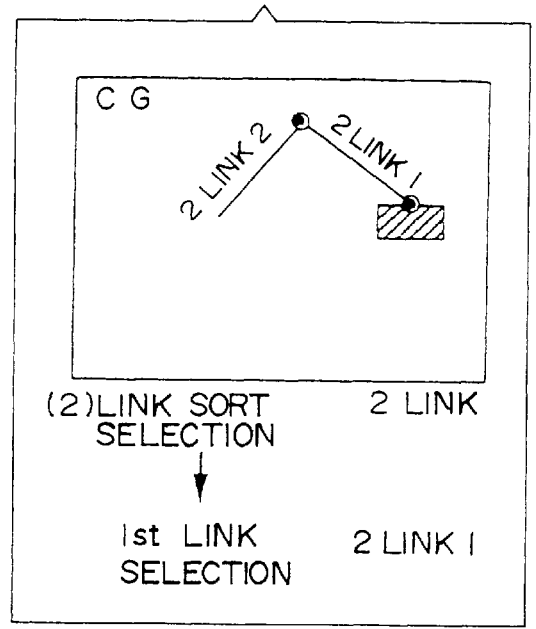

FIGS. 33(A) and 33(B) are illustrations showing a menu title group and a CG model displayed on a CG screen, respectively. FIGS. 34(A) and 34(B) are illustrations in which the CG model shown in FIG. 33 (B) is separated into the crank and two links. Incidentally, while the illustration of the CG model indicated here shows redundant information such as a name of the link other than the CG model, they are shown for the purpose of explanation and actually the CG models purely based on the geometry data are displayed.

The CG model shown in FIG. 33 (B) can be interpreted as a combination of the crank (A) and two links (B).

Here, first, as mentioned above, the link mechanism model of the crank is selected, and then picking of the first link "crank 1" of the crank portion is practiced on the CG screen. Subsequently, the link mechanism model of two links is selected, and then picking of the first link "2 link 1" of 2 link portion is practiced on the CG screen.

Information as to the link mechanism and the first link of the selected crank is saved even at the stage that the link mechanism model of 2 link is selected thereafter. Incidentally, it is similar as to the matter of selection of the link mechanism model for the purpose of the above-mentioned mechanism analysis. In some cases, a single link mechanism for analysis consists of a combination of a plurality of link mechanisms, and thus it is possible to simultaneously rise a plurality of link mechanism models.

Next, from a main menu (cf. FIG. 20), a "constraint condition" is selected; from among submenus an "edition", an "addition" and "deletion" displayed through a selection of the "constraint condition", the "addition" is selected; and from the submenu of the "addition", a "rotary constraint" is selected. As a result, as shown in FIG. 33 (B), there appears on the CG screen a figure representative of the constraint condition (rotary constraint). Here, the rotary constraint implies a coupling through a rotary joint.

At this stage, a constraint point position is inputted. That is, there is inputted information indicating as to what point of what link of the crank and what point of what link of 2 link are subjected to the rotary constraint.

According to the present embodiment, as the input scheme of the constraint point position, there are prepared two sorts of input schemes of "numerical value input" and "input through a mouse".

In case of the "numerical value input", the user inputs on a numerical value basis a link name (here, crank 2) of a link on which a constraint point of a crank exists and coordinates (here, (0, 0, Ld)) of the constraint point looking at the coordinates system Σ 2c (cf. FIG. 33) of the link "crank 2"; and a link name (here, 2 link 2) of a link on which a constraint point of 2 link 2 exists and coordinates (here, (0, 0, L2 b)) of the constraint point looking at the coordinates system Σ 2b (cf. FIG. 33) of the link "2 link 2". In this manner, the constraint point of the crank and the constraint point of 2 link are designated, and the constraint point-to-constraint point are coupled with each other via a rotary joint.

Figure 35:
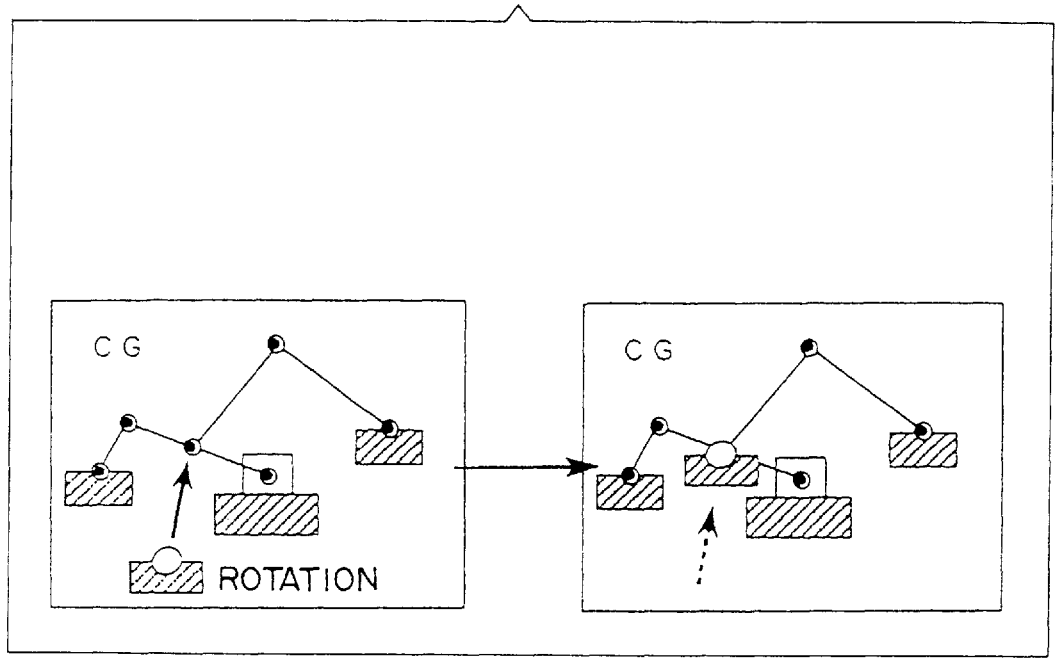
FIG. 35 is an explanatory view useful for understanding an "entry through a mouse" of a constraint point position.

FIG. 35 is an explanatory view useful for understanding an "entry through a mouse" of a constraint point position.

In case of the "entry through a mouse", the figure representative of the rotary constraint displayed on a CG screen is took with the mouse to be disposed at a rotary constraint position in which the crank and 2 link are coupled with each other.

Upon receipt of a termination of the disposing operation, the analyzer performs an identification of a link on which a constraint point of a crank exists and a computation of coordinates of the constraint point looking at the coordinates system Σ 2c of the link "crank 2" thus identified; and an identification of a link on which a constraint point of 2 link 2 exists and a computation of coordinates of the constraint point looking at the coordinates system Σ 2b of the link "2 link 2" thus identified.

In this manner, the analyzer recognizes the positions of the rotary constraint of the crank and 2 link.

Next, a registration of a new link mechanism model thus recognized is performed.

FIG. 36 is an explanatory view useful for understanding a registration method of a new link mechanism model.

From a main menu shown in FIG. 20, a "link mechanism information" is selected; from among submenus a "new mechanism registration" is selected; and a file name (here, "crank+2 link 2") and a link sort title (here, "2 link+crank") are inputted. As a result, the new link mechanism model thus built is saved in a file "crank+2 link. data". Here, there is considered a system in which the link mechanism model is classified with a degree of freedom. Since the crank is 1 degree of freedom, 2 link is 2 degree of freedom, and the constraint condition is one degree of freedom, the degree of freedom of this link mechanism model is classified into one degree of freedom.

An example of the file "crank+2 link. data" is shown in FIG. 36.

For a registration of the new link mechanism model in a similar state to that of the existing link mechanism model, only the save of the file "crank+2 link. data" is insufficient, and thus as will be explained hereinafter, there is a need to produce an illustration or the like for the new link mechanism model. Here, the legend "~. data" stands for a file of character column in which file there are "~. select", "~. drive" and the like having the same name "~".

FIG. 37 is an explanatory view useful for understanding a producing method for image data representative of an illustration of a new link mechanism model.

An image processing tool is used to display on a CG screen a side elevation as typically shown in FIG. 36 based on the geometry data. The CG screen is taken in in the form of a two-dimensional screen and saved into a file "crank+2 link 2. image". In this case, when "crank+2 link 2. image" is saved in a directory which is the same as "crank+2 link 2. data", as shown in FIG. 37, a menu title for the new link mechanism model is automatically displayed on a menu classified with a link sort in accordance with a degree of freedom.

FIG. 38 is an explanatory view useful for understanding an editing method for a first link selecting screen of a new link mechanism model.

In this case, a software for figure drawing is used to first call a first link selection screen of the crank and then call a first link selection screen of 2 link to practice an edition into the screen of the crank, thereby producing a screen for "2 link+crank" in which those screens are superimposed. The produced screen for "2 link+crank" is saved in the file name "crank+2 link 2. select".

Figure 39:
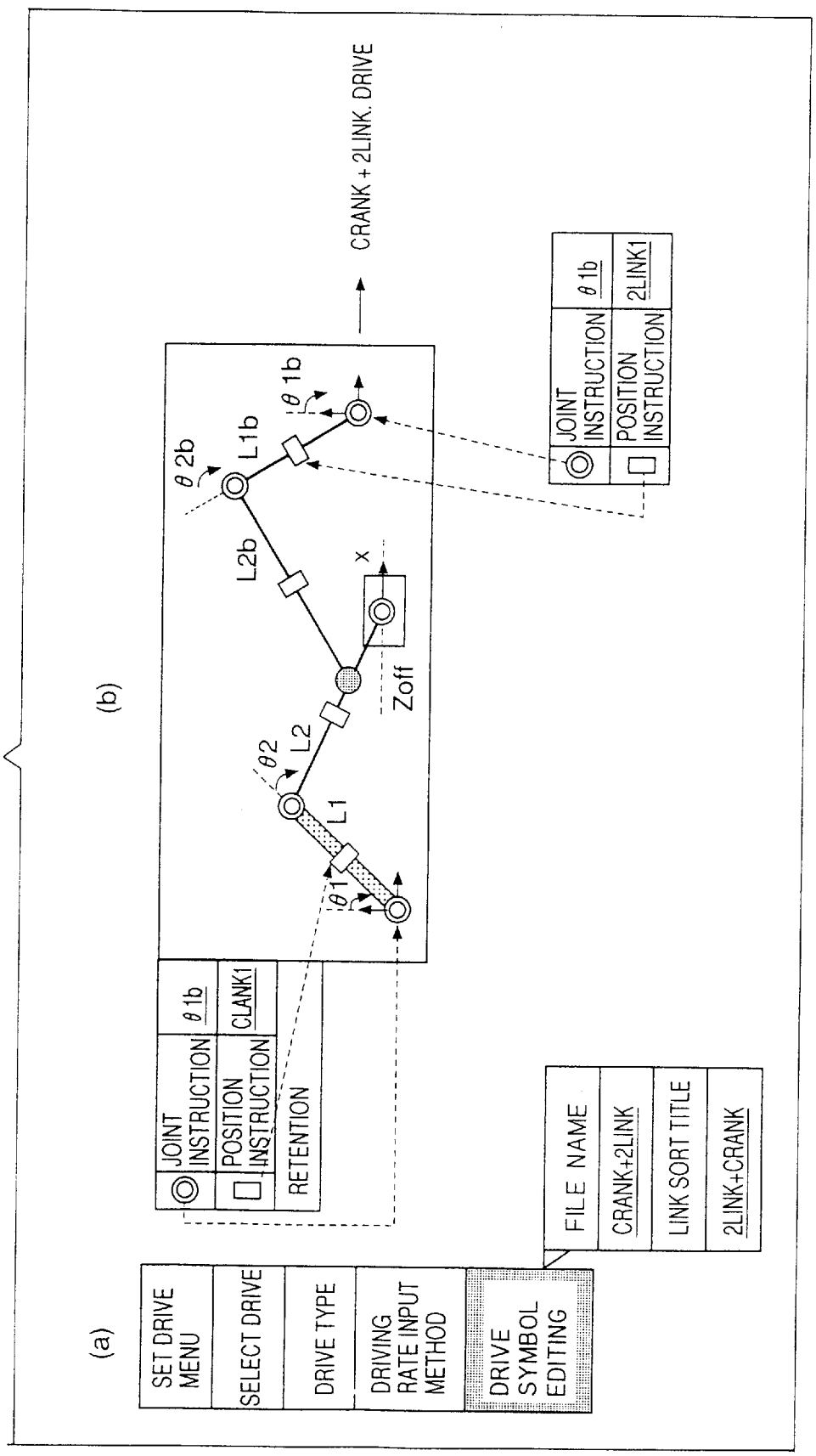
FIG. 39 is an explanatory view useful for understanding an editing method for a drive symbol selecting screen of a new link mechanism model.

FIG. 39 is an explanatory view useful for understanding an editing method for a drive symbol selecting screen of a new link mechanism model.

From a main menu shown in FIG. 20, a "set drive" is selected; from among submenus a "drive symbol editing" is selected; and a file name "crank+2 link 2. select" of the first link selection screen is inputted through operation of the keyboard 12 (cf. FIG. 3). As a result, symbols of the joint instruction and the position instruction are displayed. These joint instruction and the position instruction can be disposed at an optional position on the screen through the mouse. In case of the joint instruction, the symbol mark of the joint instruction is taken to be disposed at the joint on the illustration of the link mechanism displayed as the first link selection screen, and in addition the name of the joint, for example, θ1, θ2 or the like, is inputted through the keyboard. In case of the position instruction, the symbol mark of the position instruction is taken to be disposed at the link on the first link selection screen, and in addition the name of the first link of the associated link mechanism is inputted through the keyboard. In this manner, the drive symbol selecting screen is edited and then saved in the file "crank+2 link. drive".

The thus produced file group of "crank+2 link. data", "crank+2 link. image", "crank+2 link. select", and "crank+2 link. drive" is disposed in a predetermined directory.

Producing and registering the new link mechanism model in accordance with the above-mentioned manner makes it possible to deal with the new link mechanism model in a similar fashion to that of the existing link mechanism model, in the next analysis.

Figure 40:
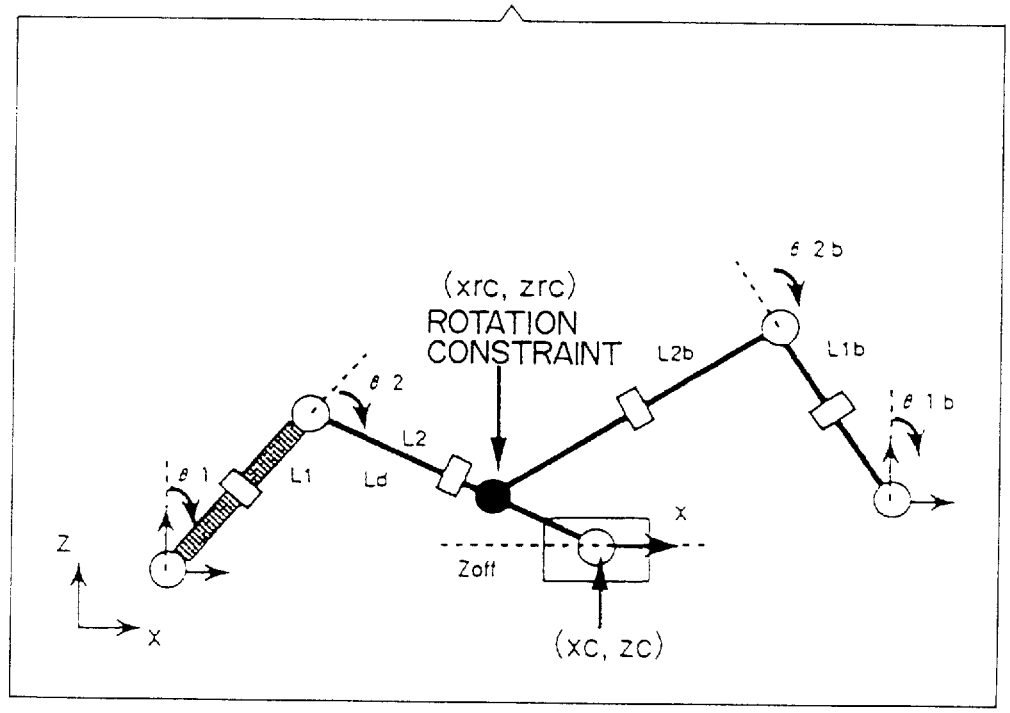
FIG. 40 is an explanatory view useful for understanding a computation method for forward kinematics and inverse kinematics of a new link mechanism model.

FIG. 40 is an explanatory view useful for understanding a computation method for forward kinematics and inverse kinematics of the new link mechanism model.

(In a case where the crank is driven)

The tip position $(X_c, Z_c)$ of the crank is computed with the forward kinematics of the crank, and the position $(X_{rc}, Z_{rc})$ of the rotary constraint is computed taking into account a length Ld up to the constraint point. Thereafter, the inverse kinematics of 2 link is computed so that the tip of 2 link is located at the position $(X_{rc}, Z_{rc})$, thereby evaluating $\theta_{1b}$ and $\theta_{2b}$.

(In a case where 2 link is driven)

The tip position of 2 link, or the position $(X_{rc}, Z_{rc})$ of the rotary constraint, is evaluated through the forward kinematics of 2 link, and the tip position $(X_c, Z_c)$ of the crank is evaluated taking into account a length Ld up to the constraint point of the crank end. Thereafter, the inverse kinematics of the crank is solved so that the tip of the crank is located at the position $(X_c, Z_c)$, thereby evaluating $\theta_1$ and $\theta_2$.

Thus, in this manner, if such an arrangement is provided that the user can additionally register the link mechanism model in common use, it is possible to reduce the time for setting the link mechanism model thereafter.

Next, there will be described embodiments of the second link mechanism analyzer different from the first link mechanism analyzer. Specifically, there will be explained a technique in which the kinetics is adopted instead of the inverse kinematics as in the embodiments of the first link mechanism analyzer as described above. What is meant by "the kinetics is adopted" is that a force acting on the joint torque or link is inputted to solve an equation of motion thereby evaluating an angle of a joint. Here, there will be explained a parallel crank by way of example. Incidentally, the kinetics itself is well known and thus redundant explanation will be omitted.

In general, an equation of motion of the mechanism can be expressed as follows. This equation of motion is derived from Newton's equation of motion and Euler's equation of motion (cf. for example, "ROBOTICS for mechanical systems" by Shigeki Tohyama, published by Sohgoh Densi Publishing Company). These equations of motion are used in rigid body mechanics.

$$\tau = M(\Theta)\ddot{\Theta} + V(\Theta, \dot{\Theta}) + G(\Theta) \qquad (1)$$

Where $\Theta$: n×1 vector of an angle of joint
$\tau$: n×1 vector of a torque of joint
$M(\Theta)$: n×n mass matrix
$V(\Theta, \dot{\Theta})$: n×1 vector representative of items of a centrifugal force and Coriolis force $\Theta$ and $\tau$ are expressed as follows:

$$\Theta = \begin{pmatrix} \theta 1 \\ \theta 2 \\ \cdot \\ \cdot \\ \cdot \\ \theta n \end{pmatrix} \quad \tau = \begin{pmatrix} \tau 1 \\ \tau 1 \\ \cdot \\ \cdot \\ \cdot \\ \tau n \end{pmatrix} \qquad (2)$$

The equation of motion given by expression (1) is solved (integrated) to evaluate angles $\theta$ i (i=1, 2, ..., n) of the joint. Thus, it is possible to evaluate angles of the joint without using the expression of the analytical inverse kinematics.

Here, the items, which appear on expression (1), $$M(\Theta), V(\Theta, \dot{\Theta}) \text{ and } G(\Theta),$$

are parameters different for each link mechanism. Those parameters are recorded beforehand for each link mechanism.

Hereinafter, there will be explained the parallel crank by way of example.

Figure 41:
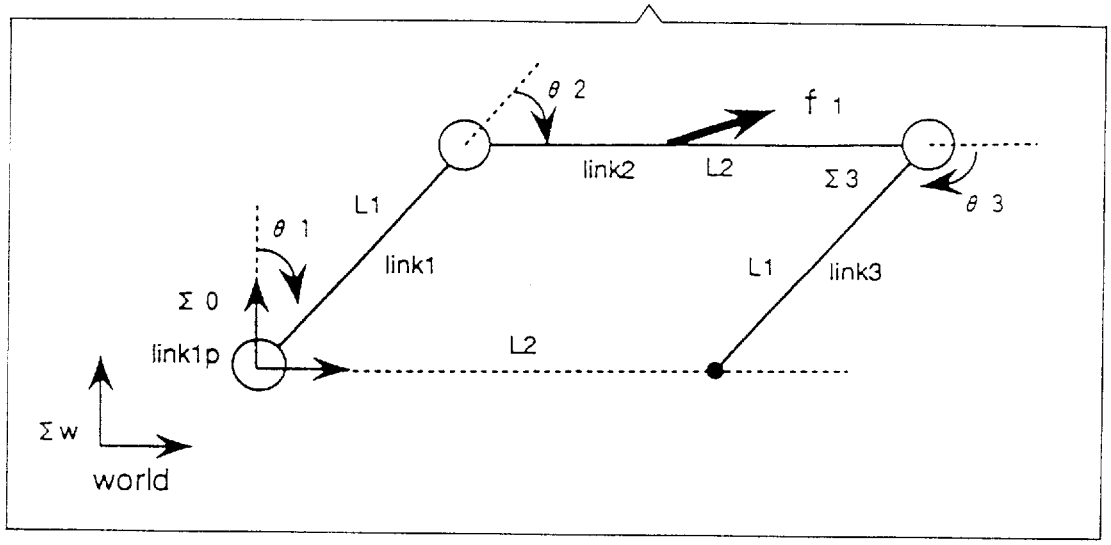
FIG. 41 is an illustration showing a link coordinate system of a parallel crank, and also an explanatory view useful for understanding a technique for evaluating an angle of joint in a case where an external force is applied to a link, through the use of kinetics.

FIG. 41 is an illustration showing a link coordinate system of a parallel crank, and also an explanatory view useful for understanding a technique for evaluating an angle of a joint in a case where an external force is applied to a link, through the use of kinetics.

First, in a similar fashion to that of the drive selection in the embodiment of the first link mechanism analyzer as mentioned above, the link setting and the first link selection are performed.

When the first link selection is performed, a link - parameter (link length: L1, L2; offset: $\Theta_{off}$; and the like) is set up on the basis of the D-H parameter. The link-parameter is adopted in the kinetics to evaluate the tip position of a link. In addition to the link-parameter, from among parameters for the equation of motion which are prepared beforehand, a parameter associated with the selected link mechanism is selected and substituted.

Hereinafter, there will be explained the parallel crank shown in FIG. 41 by way of example.

(drive selection)

In a similar to that of the drive selection in the embodiment of the first link mechanism analyzer as mentioned above, for example, the second link"link 2" is selected through "picking selection".

(set drive type)

In this case, there are displayed in the form of pull-down menu two kinds of menu titles one of which is involved in the item (this is referred to as an "external force to the link") indicative of how much and where the external force is applied onto the link (the second link "link 2") selected through the "drive selection", and another is involved in the item (this is referred to as a "joint torque") indicative of a torque of the joint of the base of the link (the second link "link 2") selected through the "drive selection". One of those two kinds of menus is selected.

FIG. 41 is an explanatory view useful for understanding a technique for evaluating an angle of joint in a case where the "external force to the link" is selected in the "set drive type".

"instruction value input method"

In a case where the "external force to the link" is selected, the mouse takes and moves an optional point on the link (the second link "link 2") selected as the drive. Here, it is assumed that a force proportional to a travel (the arrow of f1) of the mouse from the optional point is applied to the link. The force f1 is substituted for G ($\Theta$) (external force such as gravity) of equation (1) of motion. It is acceptable that this operation is carried out, for example, on the CG screen 30 shown in FIG. 3.

Figure 42:
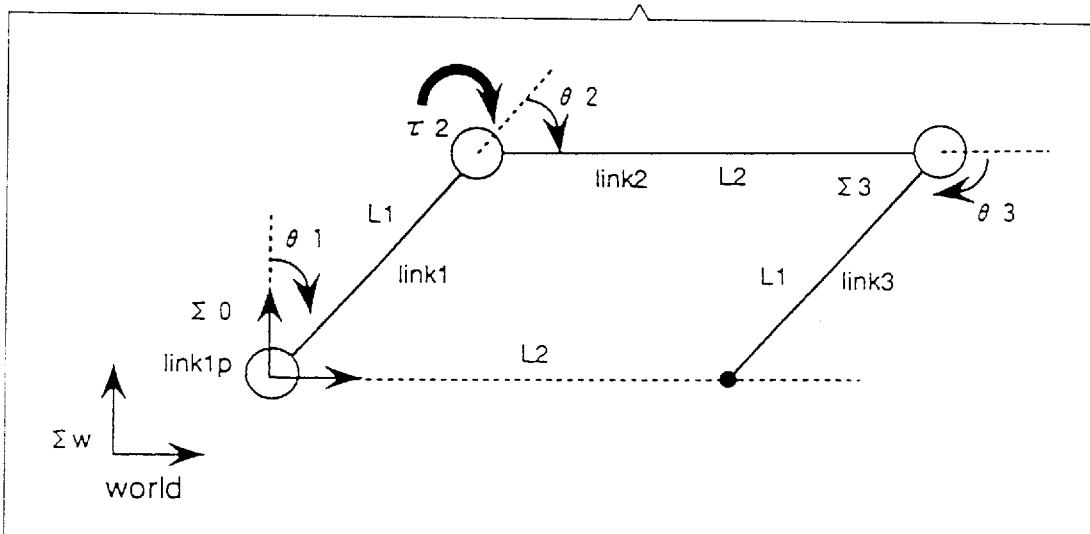
FIG. 42 is an illustration showing a link coordinate system of a parallel crank, and also an explanatory view useful for understanding a technique for evaluating an angle of a joint in a case where a torque occurs on the joint, through the use of kinetics.

FIG. 42 is an illustration showing a link coordinate system of a parallel crank, and also an explanatory view useful for understanding a technique for evaluating an angle of joint in a case where a torque occurs on the joint (or joint torque), through the use of kinetics. In this case, the "instruction value input method" is similar to that of an angle of the joint in the above-mentioned first link mechanism analyzer. However, in case of the "joint torque", the input method (cf. FIG. 13) through the cursor position is removed. In case of the "joint torque", torque $\tau$ 2 acting on the base of the link (the second link "link 2") selected through "drive selection" is substituted in equation (1) of motion (cf. expression (2)).

In this manner, equation (1) of motion, in which the external force to the link, or the joint torque is substituted, is solved (integrated) to evaluate angles $\theta$ i (i=1, 2, ..., n) of the joint. Thus, it is possible to evaluate angles of the joint without using the expression of the analytical inverse kinematics.

Figure 43:
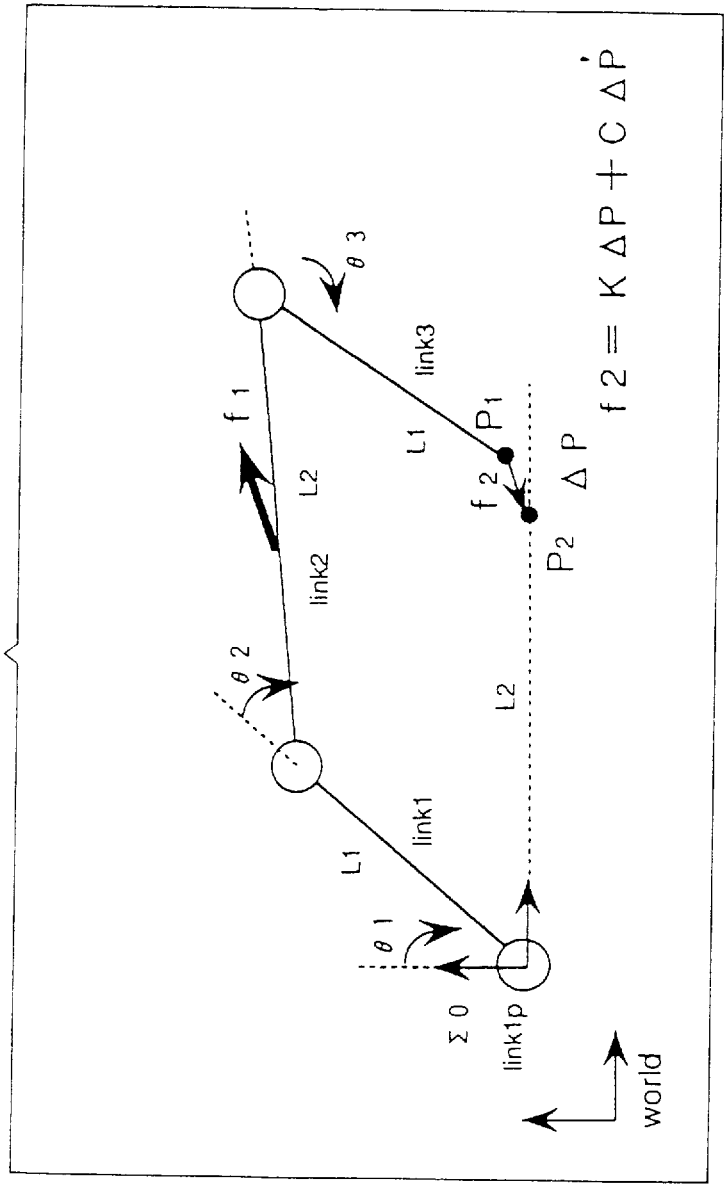
FIG. 43 is an illustration showing a link coordinate system of a parallel crank, and also an explanatory view useful for understanding a generation of a constraint force in a closed loop system of link mechanism.

While equation (1) of motion is in turn solved over and over after even the lapse of a minor amount of time, it happens that solving over and over equation (1) of motion may bring about, in case of a link mechanism having a closed loop, as shown in FIG. 43, a deviation in which the tip point P1 of a closed loop-link system consisting of link 1, link 2 and link 3 deviates from a point P2 to which the point P1 is to be originally fixed. In view of the foregoing, a force f2 directed toward the fixed point P2 is added to the tip point P1 to generate a constraint force serving to converge the tip point P1 into the fixed point P2, so that the closed loop is kept. In this case, the force f2 is a combined force of a force of a spring system proportional to a deviation rate $\Delta P$ between the fixed point P2 and the tip point P1 of the third link "link 3" and a force of a damper system proportional to the velocity $\Delta \dot{P}$ (referred to as $\Delta P$ dot).

$$f2 = K\Delta P + C\Delta \dot{P} \quad (3)$$

where K: spring constant
C: coefficient of viscosity

In case of the closed loop system, the force f2 is substituted for $G(\Theta)$ in equation (1) of motion. With respect to the external force or the joint torque, they are also substituted in a similar fashion to that of a case where no closed loop is included.

Figure 44:
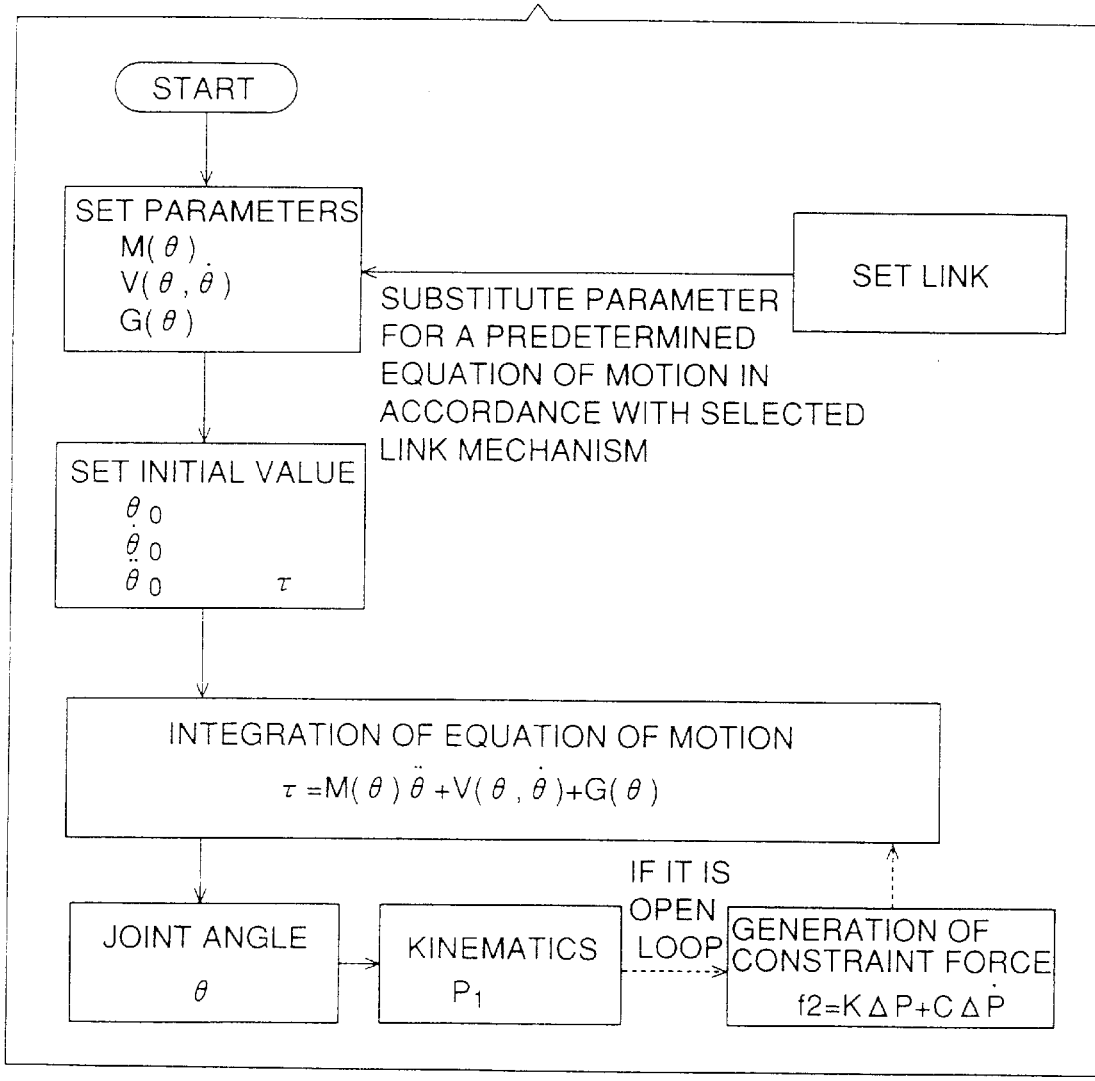
FIG. 44 is a flowchart useful for understanding evaluating an angle of a joint through the use of kinetics.

FIG. 44 is a flowchart useful for understanding evaluating an angle of joint through the use of kinetics.

First, from among the parameters for equation of motion prepared beforehand, parameters for equation of motion associated with the selected link mechanism are selected and substituted for $$M(\Theta), V(\Theta, \dot{\Theta}) \text{ and } G(\Theta)$$

Next, the following values are substituted in equation (1) of motion.

Initial value of angle of joint: $\Theta_0$
Initial value of angular velocity of joint: $\dot{\Theta}_0$ (referred to as $\Theta$ dot)
Initial value of angular acceleration of joint: $\ddot{\Theta}_0$ (referred to as $\Theta$ double dot)

In addition, the joint torque $\tau$ (or the external force f1 to the link) is inputted to solve the equation of motion so as to evaluate the angular acceleration of the joint ($\Theta$ double dot) on a numerical basis. The angular acceleration of the joint thus obtained is subjected to a double integral to evaluate the angle of the joint ($\Theta$), and the tip point P1 of the link mechanism is evaluated through kinematics. If the link mechanism includes a closed loop system, the constraint force 2f is generated. The numerical solution of the equation of motion is repeatedly performed no matter whether the link mechanism includes a closed loop system, or the constraint force 2f is generated. When the joint torque $\tau$ (or the external force f1 to the link) is updated, the updated joint torque $\tau$ (or the external force f1 to the link) is substituted and the numerical solution of the equation of motion is repeatedly performed. With respect to the numerical solution of the equation of motion, there are known several solutions. It is acceptable that any of those solutions is adopted for the present embodiments.

In this manner, the link mechanism analysis is performed using kinetics. The link mechanism analysis using kinetics has the following advantages as compared with the link mechanism analysis using inverse kinematics.

(1) The geometric inverse kinematics of the link mechanism often involves a difficult mathematical solution. On the contrary, a method of evaluating the equation of motion is of universality independently of the geometry of the link mechanism, and a technique of evaluating an angle of the joints is also generally independent of the geometry of the link mechanism. Thus, a method using kinetics is broader in applicability as compared with a method in which inverse kinematics is solved for each link mechanism.

(2) Evaluating the equation of motion used in kinetics is easier than is evaluating inverse kinematics, also in simple link mechanism.

(3) According to the use of kinetics, it is possible to contribute to a higher speed of computation depending on a scheme of the integral and an accuracy of parameters (e.g. such a means that the value of M ($\Theta$) is replaced by 1), while it is short of rigidity.

(4) According to the use of the kinetics, it is possible to visually verify a movement of the link mechanism, in a similar fashion to that of a case where inverse kinematics is solved, through solving the equation of motion to move the respective links of the link mechanism and displaying the motion of the link mechanism.

Next, there will be explained a link mechanism joint data arithmetic unit according to an embodiment of the present invention.

Hitherto, while it is described that FIG. 3 is a perspective view of a link mechanism analyzer according to one embodiment of the present invention, FIG. 3 is also a perspective view of a link mechanism joint data arithmetic unit according to one embodiment of the present invention. Specifically, in the computer system shown in FIG. 3 there are implemented both the link mechanism analyzer according to one embodiment of the present invention, and the link mechanism joint data arithmetic unit according to one embodiment of the present invention. From a CAD system (not illustrated), inputted is geometry data representative of three-dimensional geometry of a plurality of parts constituting a link mechanism to be analyzed. The link mechanism joint data arithmetic unit implemented in the computer system shown in FIG. 3 defines a coupling relation (joint) among the plurality of parts in accordance with the entered geometry data, thereby evaluating D-H parameters representative of a link coordinate system and a membership, and joint data consisting of parameter values of the D-H parameters. The joint data thus obtained and the geometry data entered from the CAD system (not illustrated) are passed to the above-mentioned link mechanism analyzer implemented in the computer system shown in FIG. 3.

The link mechanism joint data arithmetic apparatus according to the present embodiment is arranged to be suitable for both the cases, in one of which geometry data involved in a state that a plurality of parts constituting a link mechanism are assembled is inputted through the CAD system, and in another of which geometry data involved in a state that the plurality of parts are not assembled is inputted through the CAD system. Hereinafter, for the purpose of a simplification of the explanation and the illustration, with respect to the sort of joint, there will be explained typically three types of joints as set forth below.

The first one is a rotary type of joint in which a part coupled with the joint is capable of rotating on the joint. The second one is a slide type of joint in which a part coupled with the joint is capable of traveling on a straight line basis on the joint. The third one is a fixed type of joint in which a part is fixed on the joint.

Figure 45:
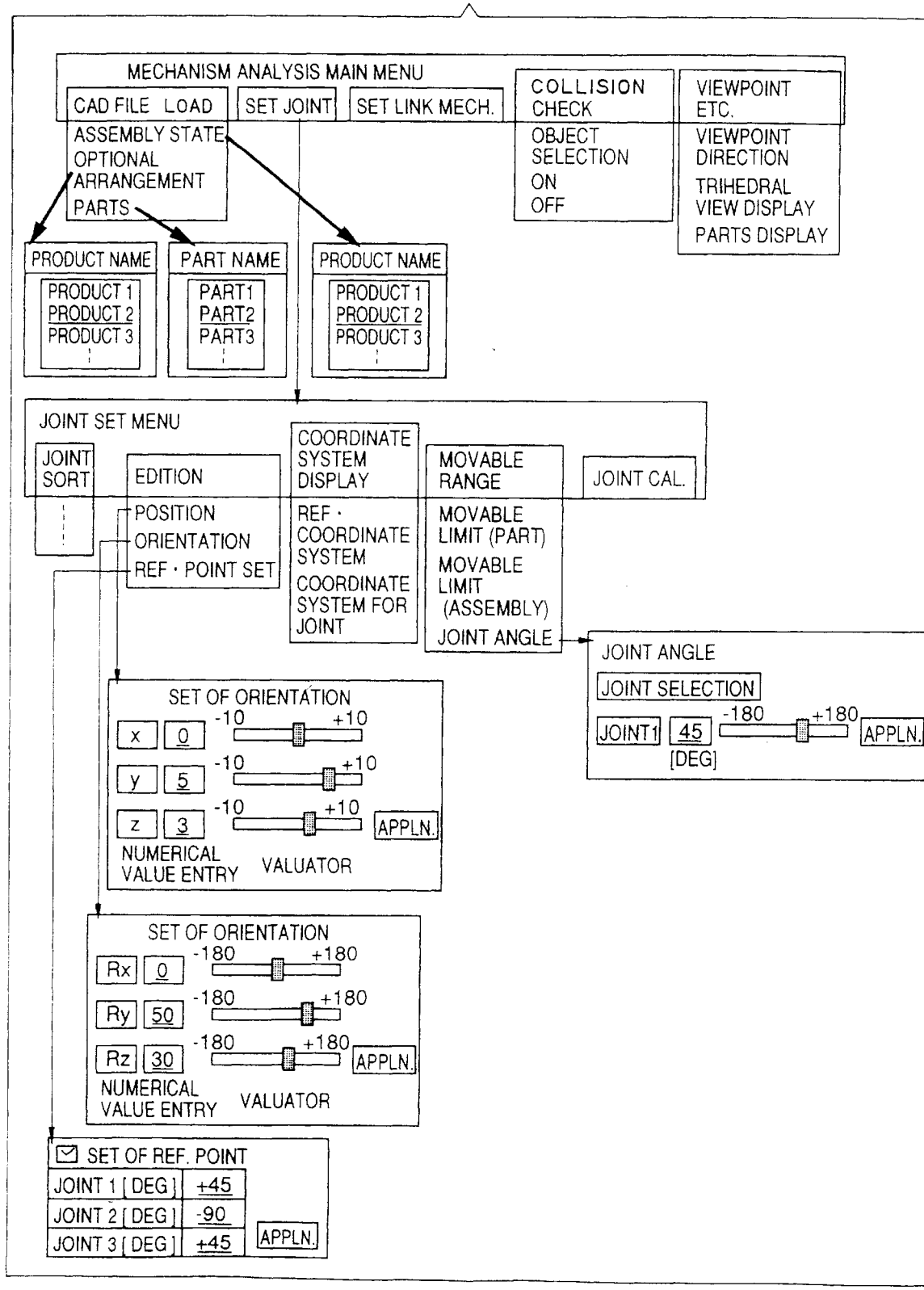
FIG. 45 is an explanatory view useful for understanding a flow of a menu screen.
Figure 46:
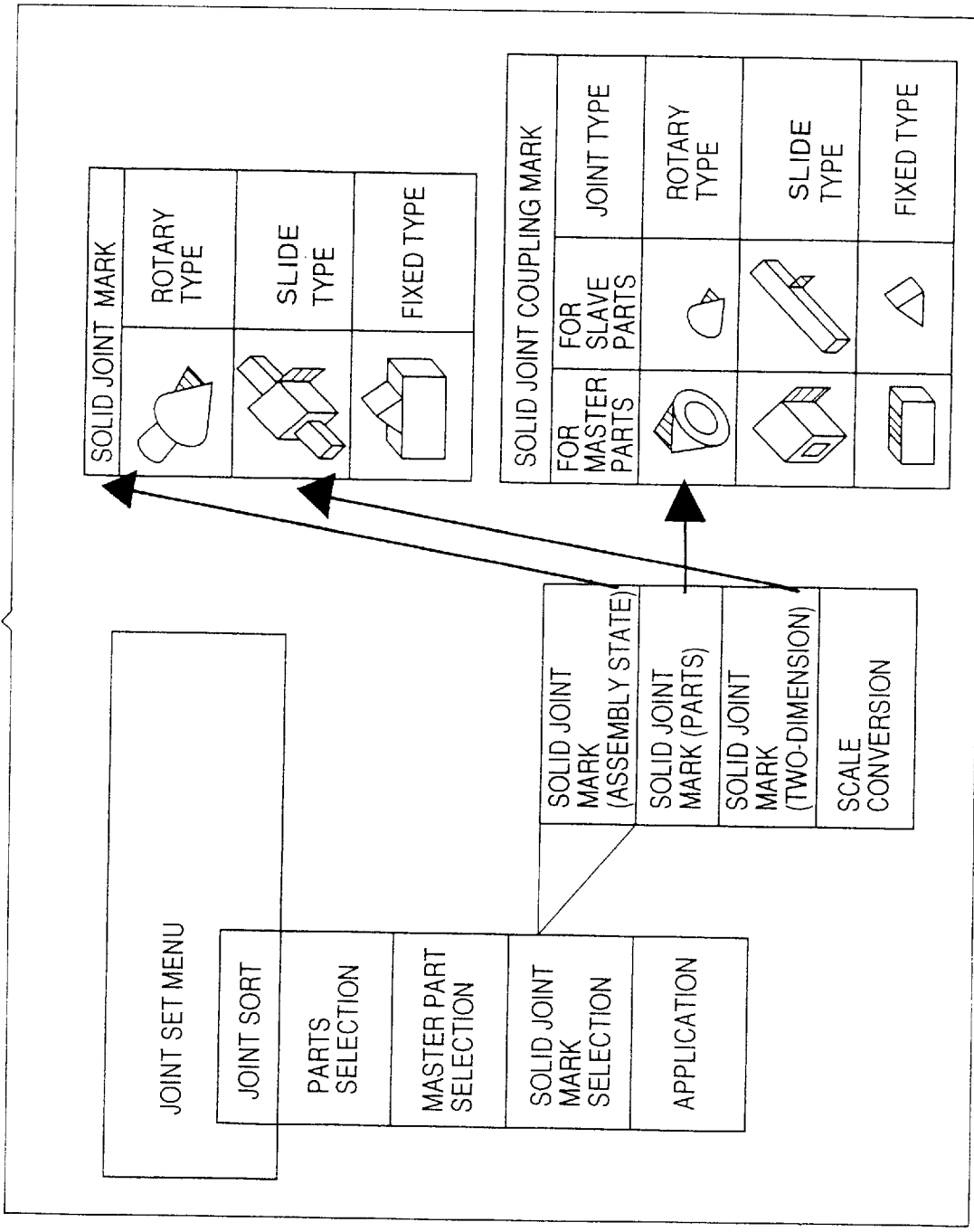
FIG. 46 is an illustration showing a submenu of a joint setting menu.
Figure 47:
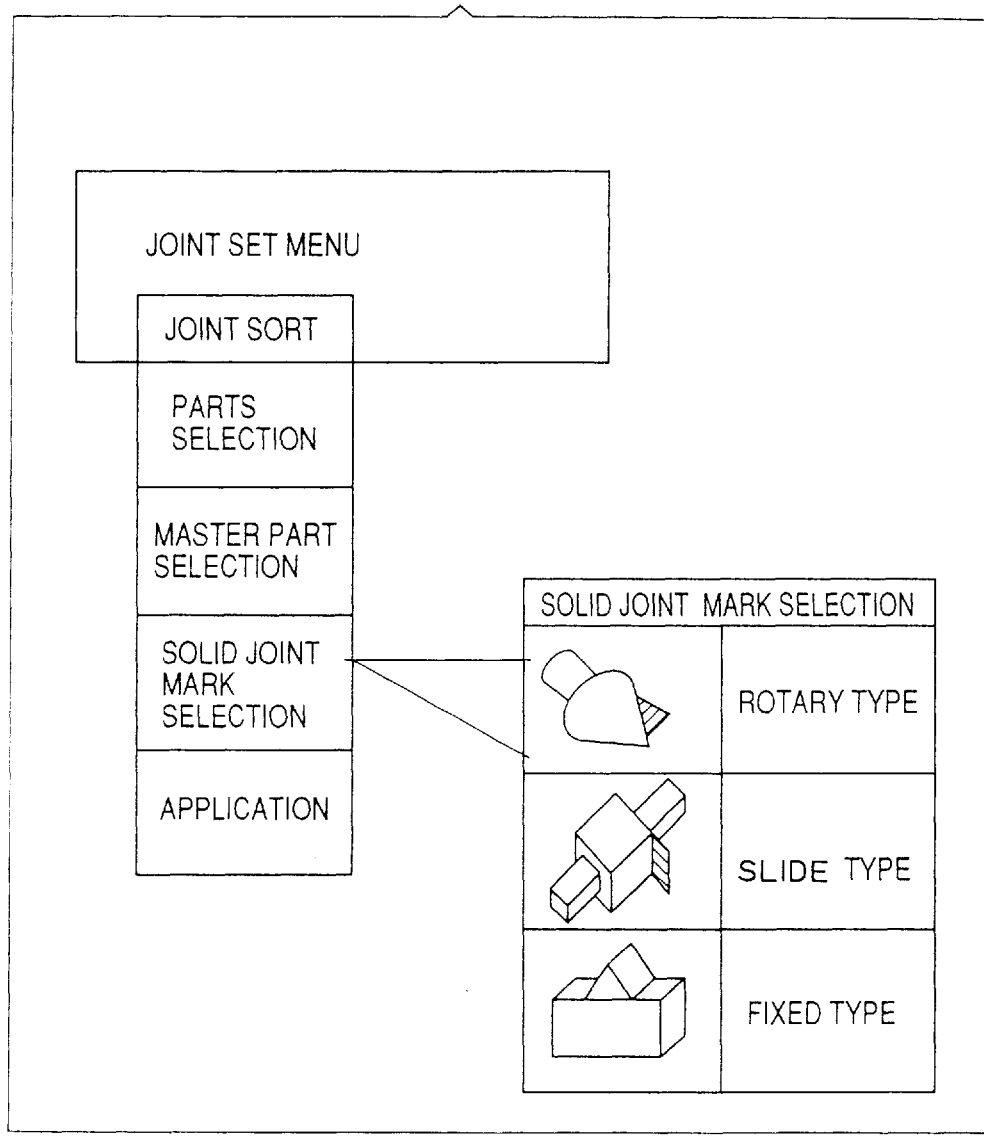
FIG. 47 is an illustration showing a modification of a submenu of a joint setting menu.
Figure 48:
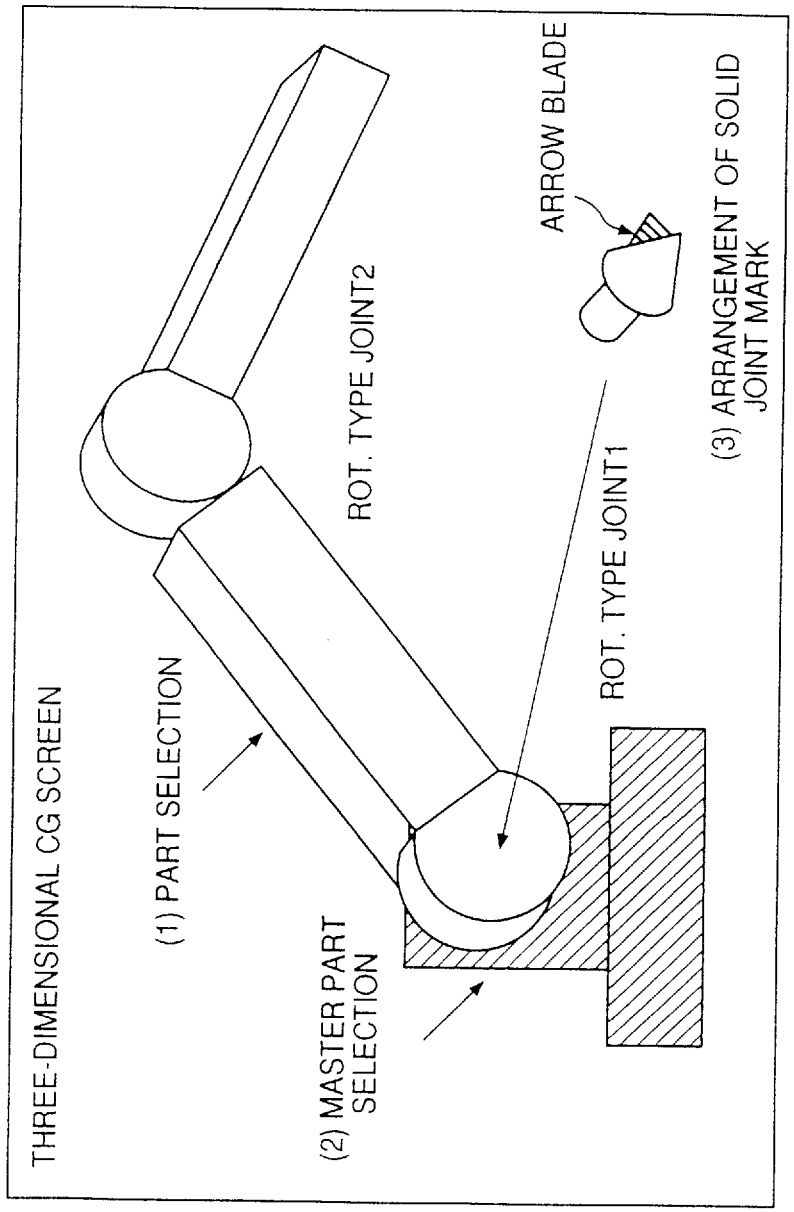
FIG. 48 is an illustration showing a CG screen based on geometry data as to a plurality of parts entered through a CAD system.

FIG. 45 is an explanatory view useful for understanding a flow of a menu screen. FIG. 46 is an illustration showing a submenu of a joint setting menu. FIG. 47 is an illustration showing a modification of a submenu of a joint setting menu. FIG. 48 is an illustration showing a CG screen based on geometry data as to a plurality of parts entered through a CAD system.

First, when the menu title "CAD file load" is selected in a mechanism analysis main menu shown in FIG. 45, there appear, as its pull-down menu, the menu titles "assembly state", "optional arrangement", and "parts". In this case, assuming that the CAD file in the "assembly state" is read, the menu title "assembly state" is selected, so that there appears the product name stored in the CAD file. Here, the respective "product" stands for the geometry data representative of the link mechanism of interest to be analyzed or after the analysis. Thus, when a predetermined product (e.g. "product 2") is selected, there is displayed on a CG screen a CG picture representative of a three-dimensional geometry of "product" comprising a plurality of products after the assembly as shown, for example, in FIG. 48. There will be explained the solid joint mark shown in FIG. 48, hereinafter.

Next, when the menu title "set joint" is selected in the mechanism analysis main menu shown in FIG. 45, there appear on the screen a joint set menu. Thus, when the menu title "joint sort" is selected, there appear, as its pull-down menu, as shown in FIG. 46, the menu titles "part selection", "master part selection", "solid join mark selection" and "application".

In this condition, first, the menu title "part selection" is selected, and the part on which a joint is to be defined is clicked with the mouse on the CG screen. Next, the menu title "master part selection" is selected, and the master part with which the part on which a joint is to be defined is coupled at the defined joint is clicked with the mouse on the CG screen. Next, the menu title "solid joint mark selection" is selected, and then there are displayed the menu title "solid joint mark (assembly state)", "solid joint mark (part)", "solid joint mark (two-dimensional)" and "scale conversion".

In this condition, when the menu title "solid joint mark (assembly state)" is selected, there appears a "solid joint mark" screen in which the menu titles "rotary type of joint", "slide type of joint" and "fixed type of joint" are displayed. Here, the menu title "rotary type of joint" is selected. As a result, as shown in FIG. 48, there appears on the CG screen a solid joint mark of the rotary type of joint. The solid joint mark of the rotary type of joint is of a configuration such that an arrow blade is appended to the a solid arrow which indicates a direction of an axis of rotation, a direction of the arrow blade indicating a reference point of the axis of rotation, that is, a direction in which an angle of joint of the rotary type of joint is given with zero.

Incidentally, according to the above-mentioned scheme, after the menu title "solid joint mark" is selected, the menu title "solid joint mark (assembly state)" is selected. In view of the fact that when the menu title "CAD file load" is selected in the mechanism analysis main menu, the menu title "assembly state" is selected, it would be understood that at that time point the joint is intended to be defined on the "one" in the assembly state.

Therefore, as shown in FIG. 47, it is acceptable to provide such an arrangement that when the menu title "solid joint mark selection" is selected, the display screen directly shifts to a menu title for selecting the solid joint mark.

After the designation of a "part" on which a joint is intended to be defined, its "master part" and a sort of its joint ("rotary type of joint") in the fashion as described above, the joint definition is given as follows.

Figure 49:
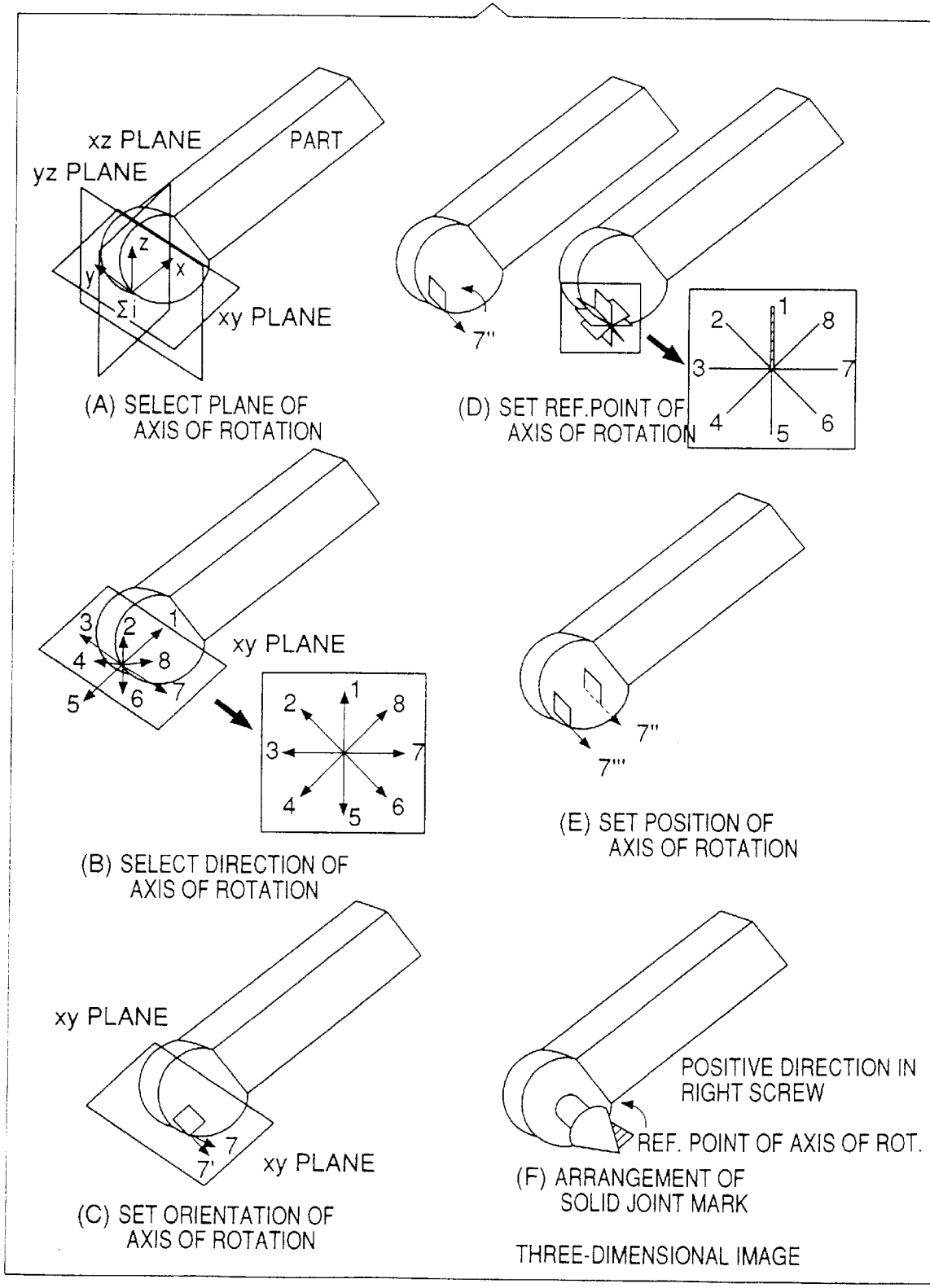
FIG. 49 is an explanatory view useful for understanding a procedure for giving a definition of a rotary type of joint.

FIG. 49 is an explanatory view useful for understanding a procedure for giving a definition of a rotary joint.

When the solid joint mark of the rotary type of joint is selected in accordance with the fashion as described above, there are displayed on the CG screen, as shown in FIG. 49(A), three orthogonal planes (xy plane, yz plane, and zx plane) including two axes of three axes x, y, and z of the geometric reference coordinate system of the part on which a joint is intended to be defined. From among these three planes, a plane on which an axis of rotation of the rotary type of joint to be defined is placed is subjected to the picking. Alternatively, a name of the plane is inputted through the keyboard. Incidentally, even when an axis of rotation of the rotary type of joint is placed on none of these three planes, for the time being, a plane near the plane including the axis of rotation is selected, and thereafter a fine adjustment is carried out.

When any one of those three planes is selected, two planes other than the selected plane disappear, instead, there are displayed, as shown in FIG. 49(B), eight arrows (straight line or solid) pointing to eight directions at intervals of 45° on the selected plane. It is acceptable that these arrows are replaced by twelve arrows pointing to twelve directions at intervals of 30° for instance. Those arrows are for selecting a direction of an axis of rotation in the selected plane, of the rotary type of joint. The direction of an axis of rotation of the rotary type of joint is selected in such a manner that one of a plurality of arrows displayed as shown in FIG. 49(B) is subjected to a picking; a number of the arrow is inputted through the keyboard; or only a certain arrow is color-changed as a default value and an arrow key is depressed, so that a change of color of the arrows is sequentially shifted to the adjacent arrow.

Next, if necessary, as shown in FIG. 49(C), a fine adjustment is carried out as to a direction of an axis of rotation of the rotary type of joint. In order to perform the fine adjustment, the menu title "edition" is selected from among the joint setting menu shown in FIG. 45. As a result, there appear the pull-down menu titles "position", "orientation" and "set reference point". Here, the menu title "orientation" is selected for the purpose of the fine adjustment of the orientation of the joint. Thus, there is displayed the screen "set of orientation" as shown in FIG. 45. Then, the mouse is operated to take and move the valuator; after the mouse choosing of either Rx, Ry or Rz in the screen, the numerical value is inputted through the keyboard; or after the mouse choosing of either Rx, Ry or Rz in the screen, the mouse operation is performed in a similar fashion to that of increment and decrement of a value of an angle of rotation explained referring to FIG. 16, so that the orientation of an axis of rotation of the rotary type of joint is fine-adjusted. Rx, Ry and Rz stand for angles of rotation around an x-axis, a y-axis and a z-axis, respectively. When the menu title "application" is selected in the screen "set of orientation", the orientation of joint is fine-adjusted, and the CG screen is changed to the screen of FIG. 49(D). When there is no need of the fine adjustment, the CG screen is changed to the screen of FIG. 49(D), without opening the screen "set of orientation", through picking of the button "application" in the joint setting menu (cf. FIG. 46).

Here, a reference point of an axis of rotation determined in the procedure as mentioned above, or a direction of an angle "zero" of a joint, is determined. For the purpose of determination of the reference point of an axis of rotation, there are displayed the planes indicative of eight directions at intervals of 45° as shown in FIG. 49(D), one of which is selected by either of the picking, the number input or movement of the plane subjected to a change of color by the arrow key on the keyboard. To perform the fine adjustment of the reference point of an axis of rotation, the menu title "edition" is selected in the joint setting menu as shown in FIG. 45, and in addition, the menu title "set reference point" is selected, so that the screen the "set reference point" is opened. The screen "set reference point" shown in FIG. 45 by way of example is for a screen in which a plurality of joints are adjusted on a batch basis. In this case, since "joint 1" shown in FIG. 48 is designated, "joint 1" is subjected to being chosen, the fine adjustment of the reference point of an axis of rotation is performed through the mouse operation, or the entry of the numerical value. Incidentally, here, it is assumed that the direction of rotation of the rotary type of joint is defined with the direction of the right screw as the forward direction. In a case where the fine adjustment of the reference point of an axis of rotation is implemented in this manner, the button "application" in the screen "set reference point" is depressed, so that the screen changes to a screen of set position of axis of rotation as shown in FIG. 49(E). On the other hand, if no fine adjustment is needed, the button "application" (cf. FIG. 48) in the joint setting menu is depressed, so that the screen changes to a screen of set position of axis of rotation as shown in FIG. 49(E). Here, a position of an axis of rotation is adjusted. In a similar fashion to that of the previous adjustment, the menu title "edition" is selected in the joint setting menu as shown in FIG. 45, and in addition the menu title "position" is selected, so that the screen "set joint position" is displayed. Thus, in a similar fashion to that of the fine adjustment of the joint orientation as mentioned above, an adjustment of the joint position is performed. Picking of the button "application" in the screen "joint position setting" makes it possible, as shown in FIG. 49(F), to arrange the solid joint mark so as to be adapted to the position of an axis of rotation and orientation which are selected in accordance with the previous procedure. On the other hand, if there is no need of an adjustment of the joint position, depression of the button "application" in the joint setting menu without opening the screen "joint position setting" makes it possible to arrange the solid joint mark so as to be adapted to the position of an axis of rotation and orientation selected in accordance with the previous procedure.

In this manner, joints are sequentially defined for the respective parts constituting a link mechanism. After completion of the definition of the whole joints for the whole parts, the computer system shown in FIG. 3 serves to evaluate joint data involved in the link mechanism thus defined, that is, D-H parameters and their associated parameter values. The joint data thus obtained are used, in conjunction with the geometry data of the link mechanism, for the above-mentioned link mechanism analysis.

Figure 50:
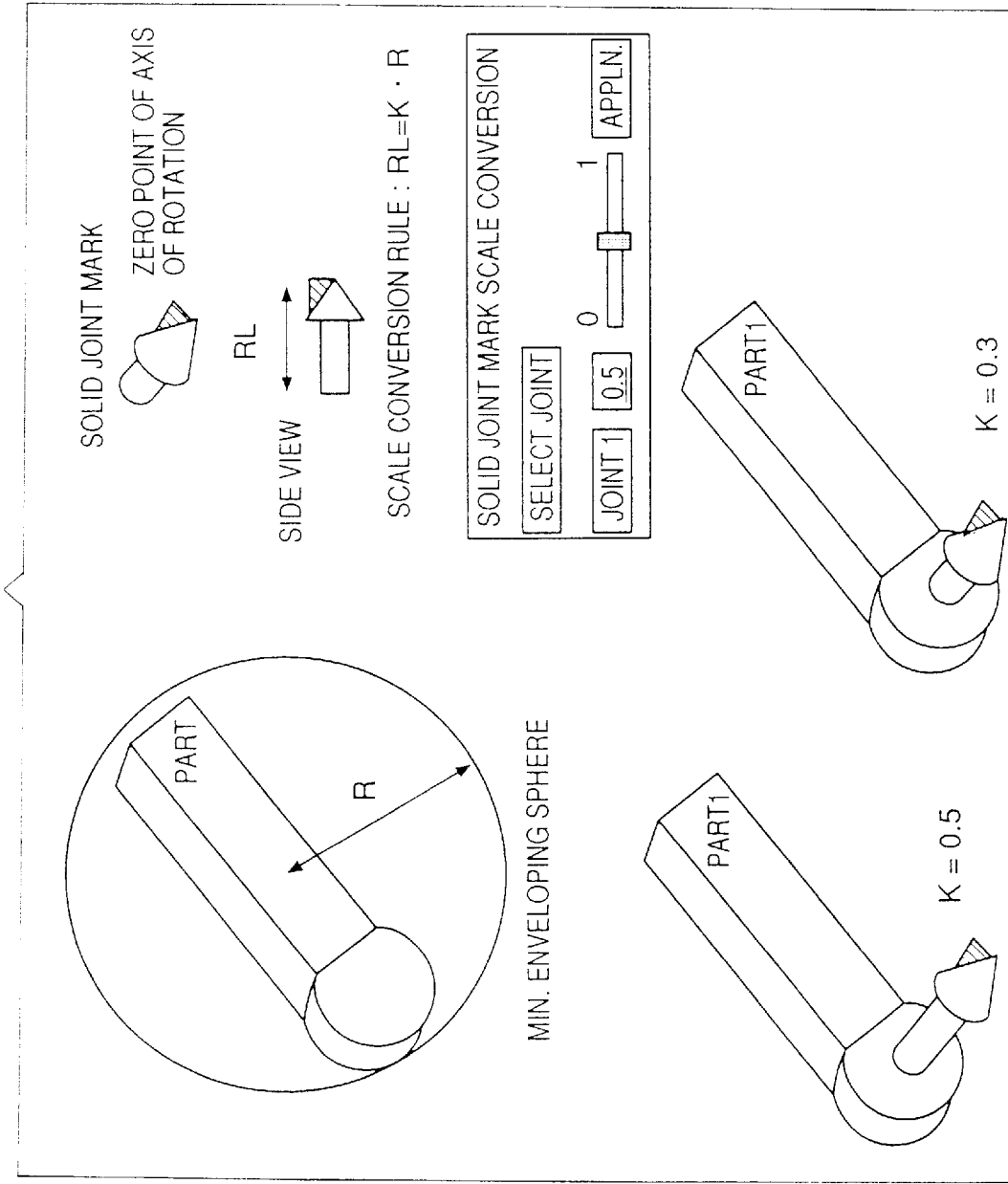
FIG. 50 is an explanatory view useful for understanding a scale conversion of the solid joint mark.

FIG. 50 is an explanatory view useful for understanding a scale conversion of the solid joint mark.

It is preferable that a size RL of a solid joint mark is set up to a size easy to see to meet the size of a part. For this reason, now, let us consider a minimum enveloping sphere enveloping a part to which the solid joint mark is intended to be arranged. With respect to such an enveloping sphere, the size RL of the solid joint mark is determined in accordance with an expression RK=K×R where R is a radius of the enveloping sphere, and K is the constant.

To perform the scale conversion of the solid joint mark, first, the menu title "joint sort" of the joint setting menu shown in FIG. 45 is selected, then the menu title "solid joint mark selection" of the pull-down menu of "joint sort" shown in FIG. 46 is selected, and then the menu title "scale conversion" of the pull-down menu of the "solid joint mark selection" is selected. As a result, the screen "solid joint mark scale conversion" is displayed as shown in FIG. 50. Then, the button "select joint" in the screen "solid joint mark scale conversion" is depressed, and the solid joint mark of interest in scale conversion is designated through picking, of the solid joint marks allocated to the position of the defined joint and its orientation (in some cases, a plurality of solid joint marks are arranged, since the solid joint mark is allocated for each joint) on the CG screen. Alternatively, after the button "select joint" is depressed, the joint name (e.g. "joint 1" in case of the example of FIG. 50) is inputted through the keyboard, so that the solid joint mark of interest in scale conversion is designated.

Thus, after designation of the solid joint mark to be subjected to the scale conversion, the value of the above-mentioned constant K is inputted through control of a volume of the valuator in the screen "solid joint mark scale conversion" by the mouse operation, or through a numerical input by the keyboard. Thereafter, when the button "application" in the screen "solid joint mark scale conversion" is depressed, the designated solid joint mark is converted in size into the designated size RL=K×R. In the relation with the part, when the solid joint mark is too small, or too large, the constant K is re-set up.

Figure 51:
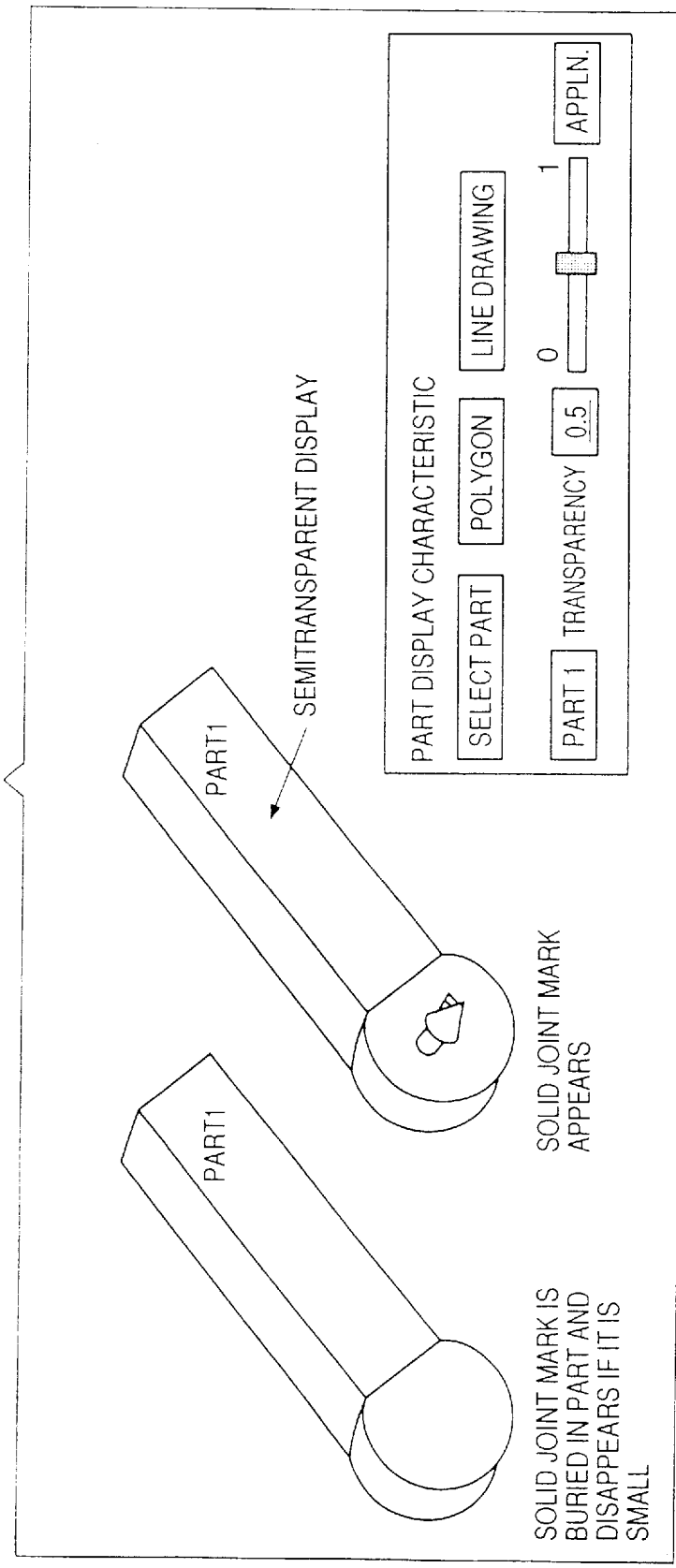
FIG. 51 is an explanatory view useful for understanding a display state of a CG screen.

FIG. 51 is an explanatory view useful for understanding a display state of a CG screen.

Now returning to the mechanism analysis main menu, when the menu title "viewpoint etc." in the mechanism analysis main menu is selected, there are displayed in the pull-down menu the menu titles "viewpoint direction", "trihedral view display", and "parts display". When the menu title "parts display" is selected of these items, the screen "parts display characteristic" shown in FIG. 51 is displayed. In this screen, there are buttons "select part", "polygon" and "line drawing", and a valuator for indicating a transparency. First, the button "select part" is depressed to select a desired part through picking of the part on the CG screen, or through inputting a part name. Next, the button "polygon" is selected. In this condition, the transparency valuator is varied in value, so that the value of the valuator is substituted for a transparency parameter for indicating a transparency of parts, and the resultant value is passed to a CG drawing tool. The CG drawing tool serves to draw a picture through varying a degree of a transparency of the designated part in accordance with the transparency parameter in such a manner that when the transparency parameter is given with "1", the part is completely opaque, and when the transparency parameter is given with "0", the part is completely transparent. In this manner, a control of display of the part in transparency makes it possible to avoid such an inconvenience that the solid joint mark is buried in the part and thus disappears from sight. On the other hand, when the "line drawing" is selected instead of the "polygon", there is displayed a line drawing which is subjected to a hidden-line process in which the other side of the part is hidden.

Next, there will be explained as to how the slide type of joint is defined.

Figure 52:
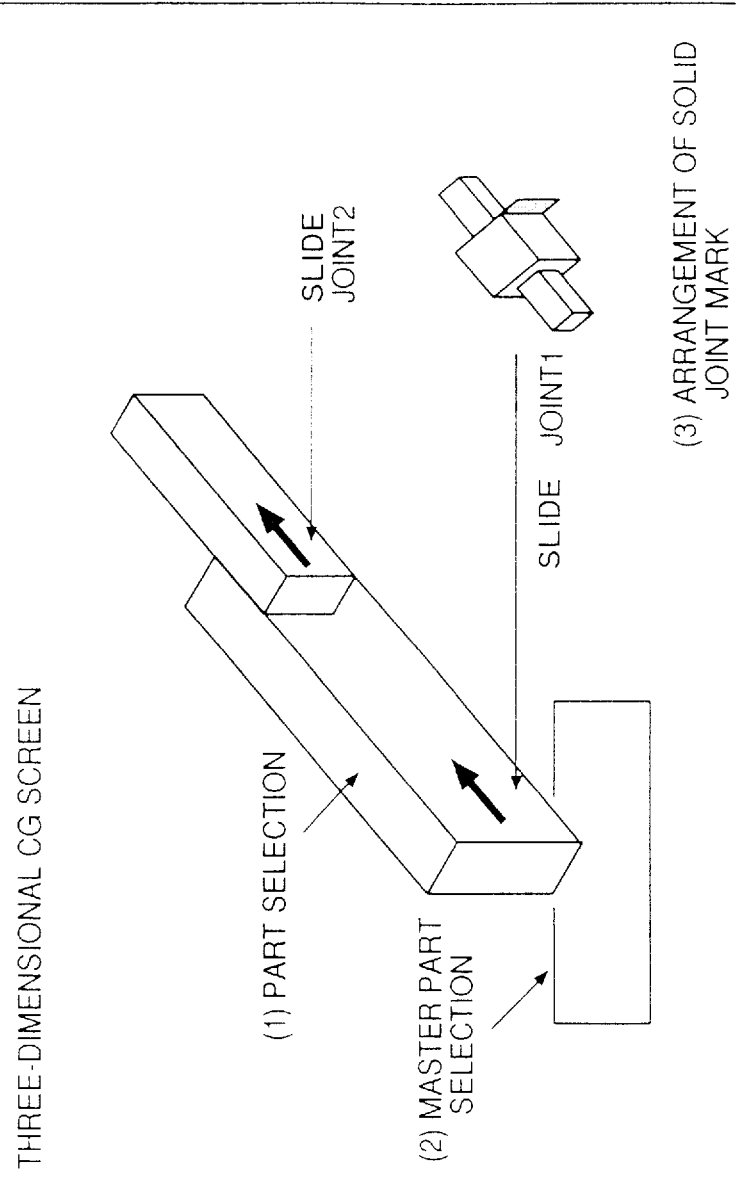
FIG. 52 is an illustration showing a CG screen based on geometry data entered through a CAD system.
Figure 53:
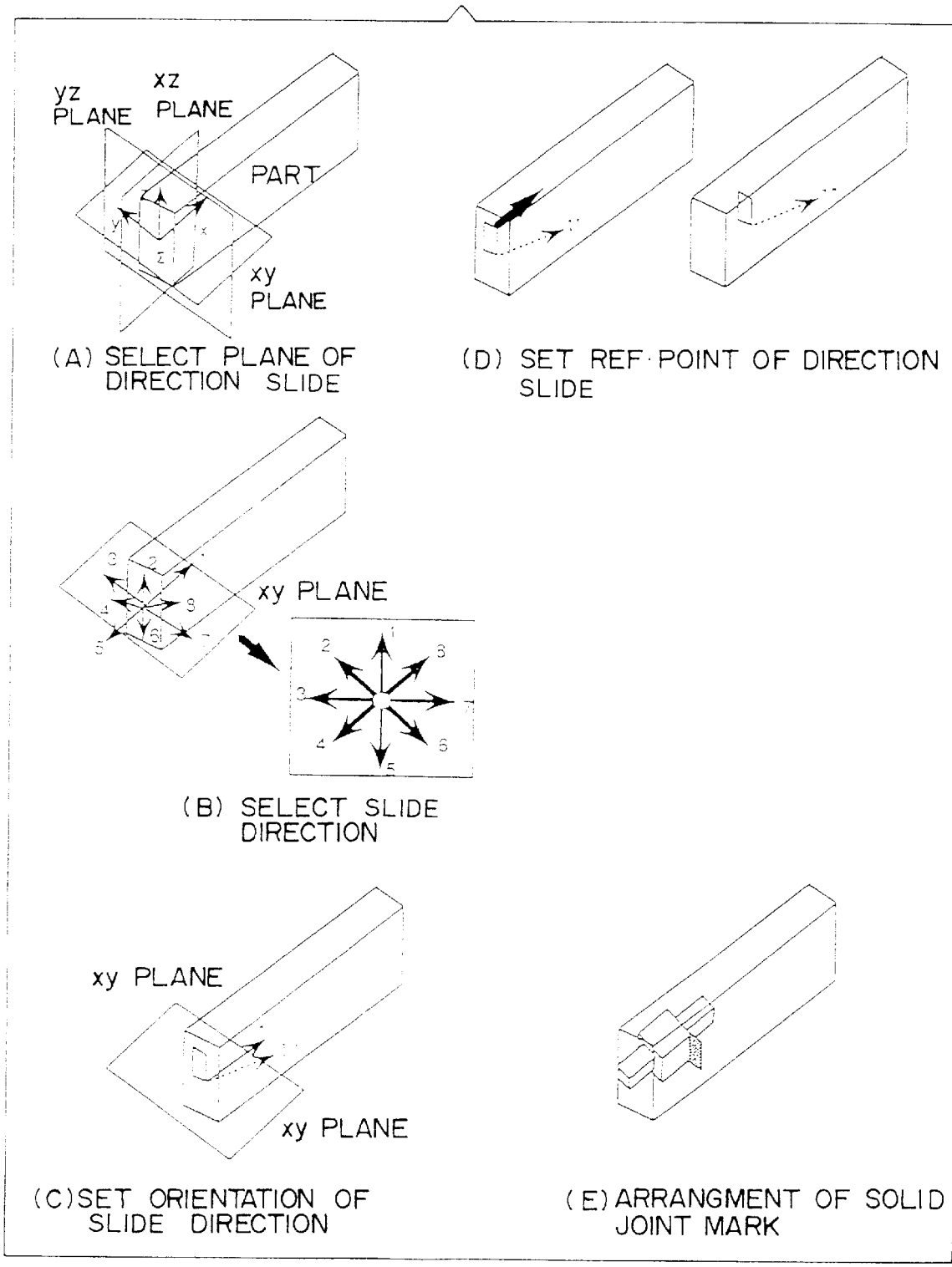
FIG. 53 is an explanatory view useful for understanding a procedure for giving a definition of a slide type of joint.

FIG. 52 is an illustration showing a CG screen based on geometry data entered through a CAD system. FIG. 53 is an explanatory view useful for understanding a procedure for giving a definition of a slide joint.

In a similar fashion to that of the definition of the rotary type of joint as mentioned above, there is displayed on the CG screen a three-dimensional graphic image of "product" after assembly as shown in FIG. 52. Further, in a similar fashion to that of the definition of the rotary type of joint as mentioned above, there are performed a selection of the part on which the slide type of joint to be defined is arranged, a selection of its master part and a selection of the solid joint mark of the slide type of joint.

Then, in a similar fashion to that of the definition of the rotary type of joint, there is displayed on the CG screen the orthogonal three planes as shown in FIG. 53(A). Among from those three planes, a plane including a slide direction of the slide joint is selected.

Thus, there are displayed a plurality of arrows directed to a plurality of directions (here, eight directions) as shown in FIG. 53(B). One of those arrows is selected to designate a slide direction of the slide joint. Next, if necessary, as shown in FIG. 53(C), a fine adjustment of the orientation of the slide direction is performed. And in addition, as shown in FIG. 53(D), a slide reference point is set up and the button "application" is depressed to arrange the solid joint mark of the slide type of joint at the position thus set up.

Figure 54:
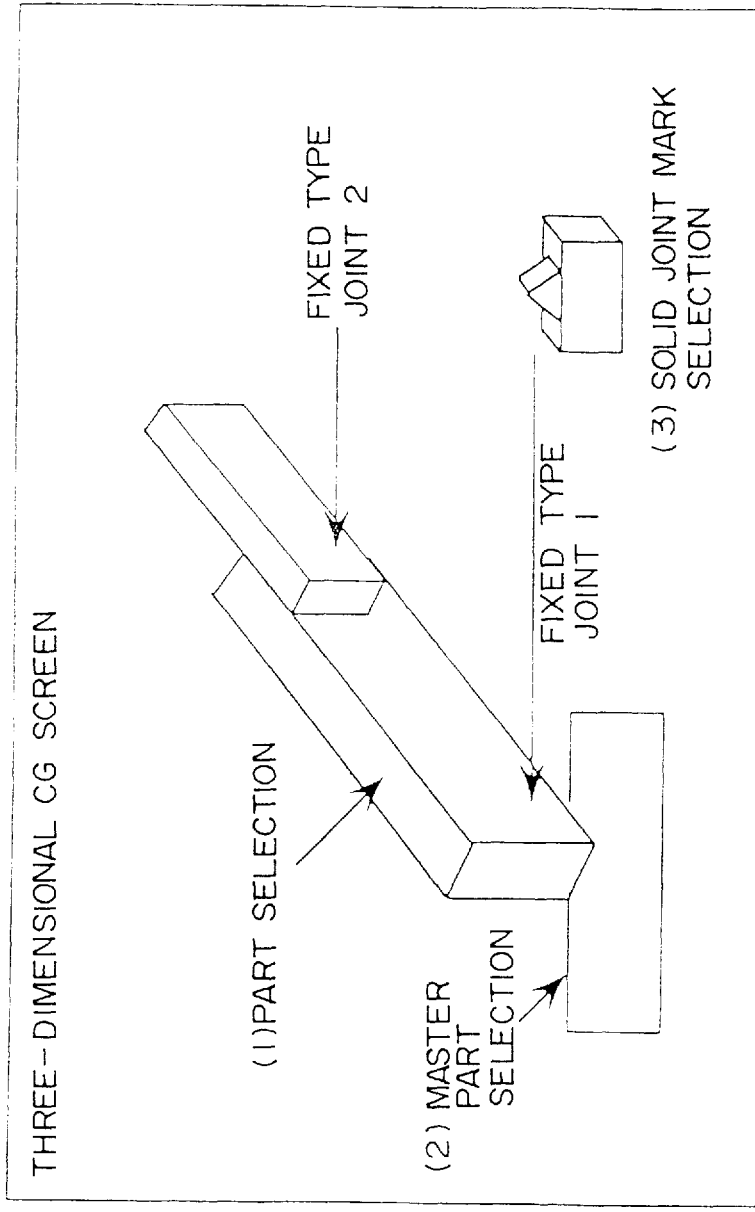
FIG. 54 is an illustration showing a CG screen based on geometry data entered through a CAD system.

FIG. 54 is an illustration showing a CG screen based on geometry data entered through a CAD system. Here, there will be explained as to the definition of a fixed type of joint.

In a similar fashion to that of the definition of the rotary type of joint as mentioned above, there are performed a "selection of the part", a "selection of its master part" and a "selection of the solid joint mark" (here, a selection of the solid joint mark of the fixed type of joint). In this case, a graphic image after the assembly is displayed. Since the fixed type of joint is for fixing the selected part on the selected master part, it is acceptable that the solid joint mark of the fixed type of joint is disposed at an optional position and in an optional orientation. Consequently, there is no need of the work for determining an axis of rotation and a direction of the slide, as in the rotary type of joint and the slide type of joint as described above. The solid joint mark of the fixed type of joint is arranged at the origin of the reference coordinates of the master part on the part on which the fixed type of joint is intended to be defined.

According to the above-mentioned explanation, while a definition of the rotary type of joint, a definition of the slide type of joint, and a definition of the fixed type of joint are separately explained, it is acceptable that a plurality of sorts of joints are mixed in a single link mechanism.

At the time point that the definitions of the whole joints are completed, when the button "application" or the button "joint computation" is depressed, the joint data of the link mechanism is evaluated.

Next, there will be explained a technique of performing a definition of joints in a state that parts are separately read from the CAD file.

Figure 55:
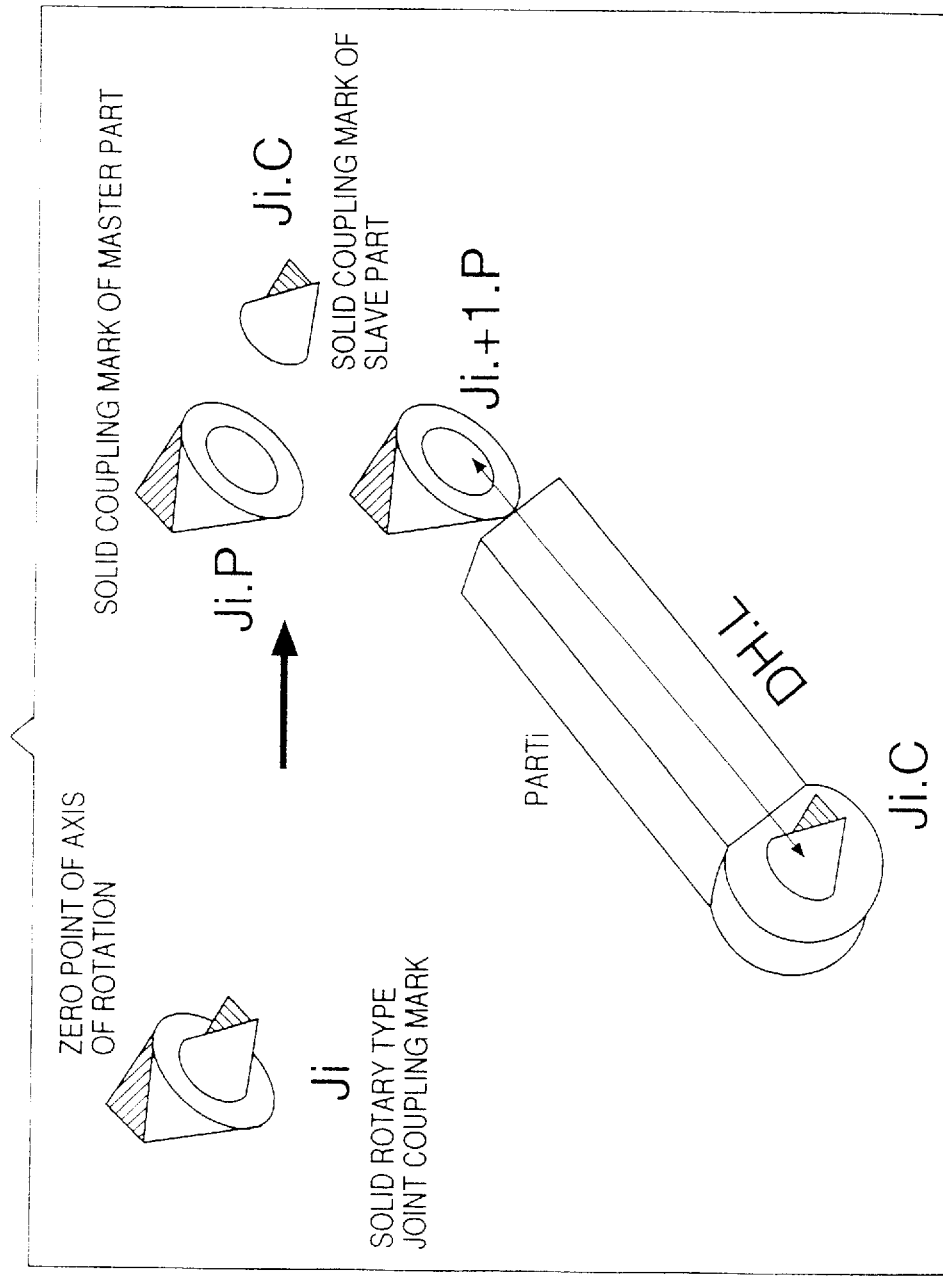
FIG. 55 is an explanatory view useful for understanding a technique of defining a joint involved in disconnected parts.
Figure 56:
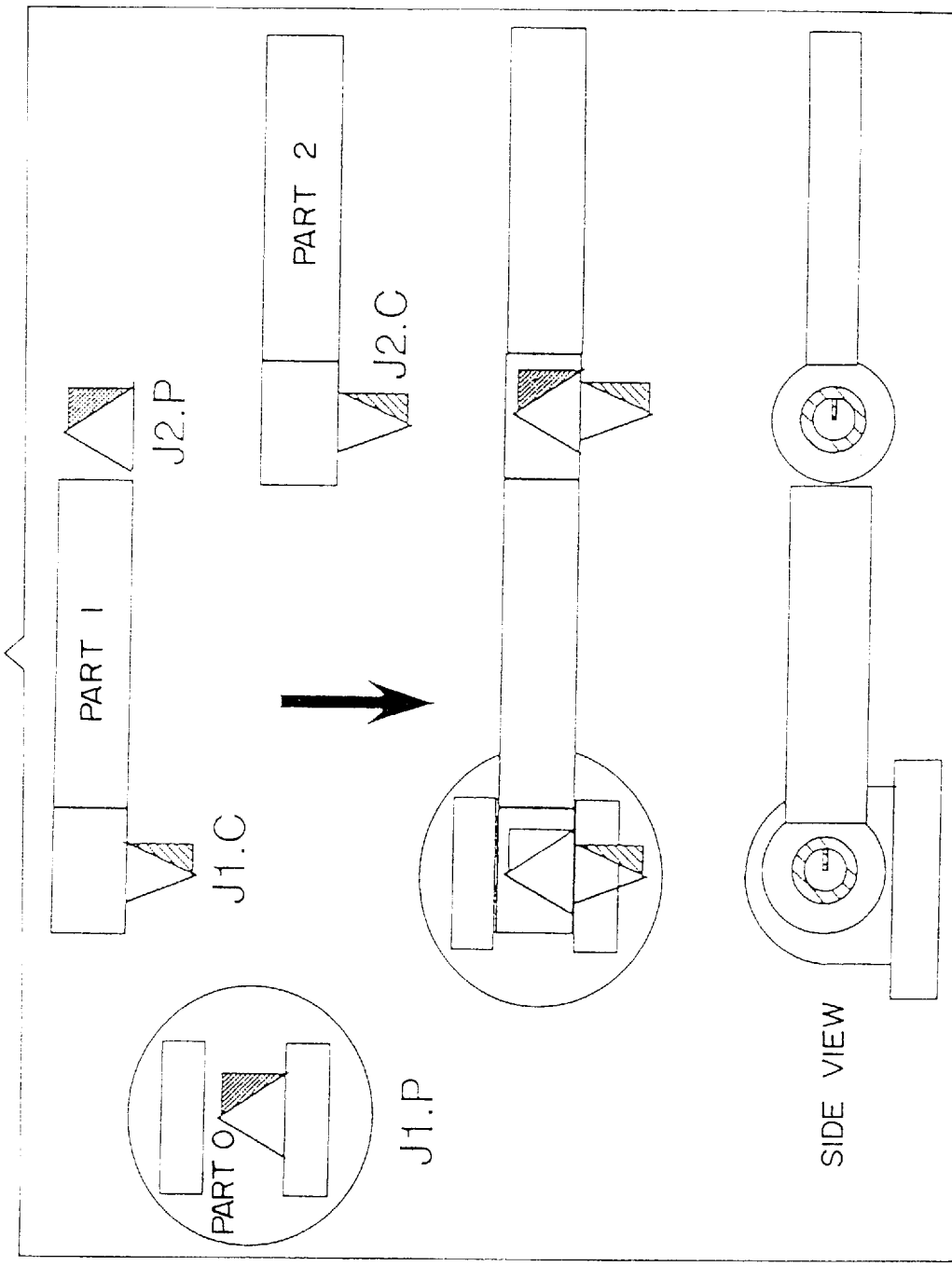
FIG. 56 is an explanatory view useful for understanding a technique of defining a joint involved in disconnected parts.

FIGS. 55 and 56 are each an explanatory view useful for understanding a technique of defining a joint involved in disconnected parts.

In the mechanism analysis main menu shown in FIG. 45, the "CAD file load", the "parts" and the "part name" (here, "part 2") are selected in the named order, and thus the part are displayed on the CG screen. This performance is repeated to display on the CG screen a plurality of parts.

Next, the "set joint" is selected to open the joint setting menu. Thus, the "joint sort" is selected in the joint setting menu, the "part selection" is selected in the pull-down menu of the joint setting menu shown in FIG. 46 to designate the part on the CG screen, and the "master part selection" is selected to designate the master part on the CG screen.

Further, when the "solid joint mark selection" is selected and the "solid joint mark (part)" is selected in its pull-down menu, there is displayed the screen "solid joint coupling mark" shown in FIG. 46, and thus the sort of the joint (here, the rotary type of joint) to be defined is selected.

The solid joint coupling mark comprises, as shown in the screen "solid joint coupling mark" of FIG. 46 and as shown in FIG. 55, a solid joint coupling mark (a solid joint mark) for a master part and a solid joint coupling mark (a solid joint mark) for a slave part. As shown in FIG. 55, there are arranged a solid joint coupling mark Ji.C for a slave part at a joint in which with respect to a certain part i, oneself becomes a slave part and couples with its master part i−1, and also arranged a solid joint coupling mark Ji+1.P for a master part at a joint in which with respect to a certain part i, oneself becomes a master part and couples with its slave part i+1. A distance DH.L between the solid joint coupling mark Ji.C for a slave part and the solid joint coupling mark Ji+1.P for a master part is defined as a length of link of the part i.

A computation is carried out based on the three-dimensional position and the orientation of the solid joint mark in accordance with a notational rule of D-H parameters, and the resultant value is substituted for the D-H parameter.

As shown in FIG. 56, while a plurality of parts are displayed, a solid joint coupling mark J1.P for a master part is arranged for coupling position and orientation of the master part (part 0) with respect to oneself (part 1), and a solid joint coupling mark J1.C for a slave part is arranged for coupling position and orientation of the slave part (part 1) with respect to the master part (part 0). Likely, for oneself (part 1), arranged is a solid joint coupling mark J2.P for a master part which couples with the slave part (part 2) with respect to oneself (part 1); and for the slave part (part 2) with respect to oneself (part 1), arranged is a solid joint coupling mark J2.C for a slave part which couples with the oneself (part 1). With respect to ways of an arrangement of the solid coupling marks for master parts and slave parts, it is the same as those in which the solid coupling marks are not distinguished between the master part use and the slave part use, as explained referring to FIG. 49. Thus, redundant explanation will be omitted.

Thus, in a state that the solid coupling mark for the master part and the solid coupling mark for the slave part are arranged, when the button "application" in the joint setting menu shown in FIG. 46 is depressed, the solid coupling mark for the master part or the solid coupling mark for the slave part is traveled on the CG screen together with the part to which the mark is appended. Thus, as shown in FIG. 56, there is provided a state that the mutually associated solid coupling mark for the master part and solid coupling mark for the slave part are coupled with one another.

In this manner, even in the event that the parts are separately read, but not in the state of after assembly, the combination use of the solid coupling mark for the master part and the solid coupling mark for the slave part makes it possible to define the joint.

In case of the combination use of the solid coupling mark for the master part and the solid coupling mark for the slave part, it often happens that the solid coupling mark for the master part and the solid coupling mark for the slave part are disposed in contact with a surface of the part. In this case, in order to implement readily an arrangement of the solid joint mark (including the solid coupling marks for master part and slave part) on the surface of the part, it is preferable that a "collision check" is performed.

Figure 57:
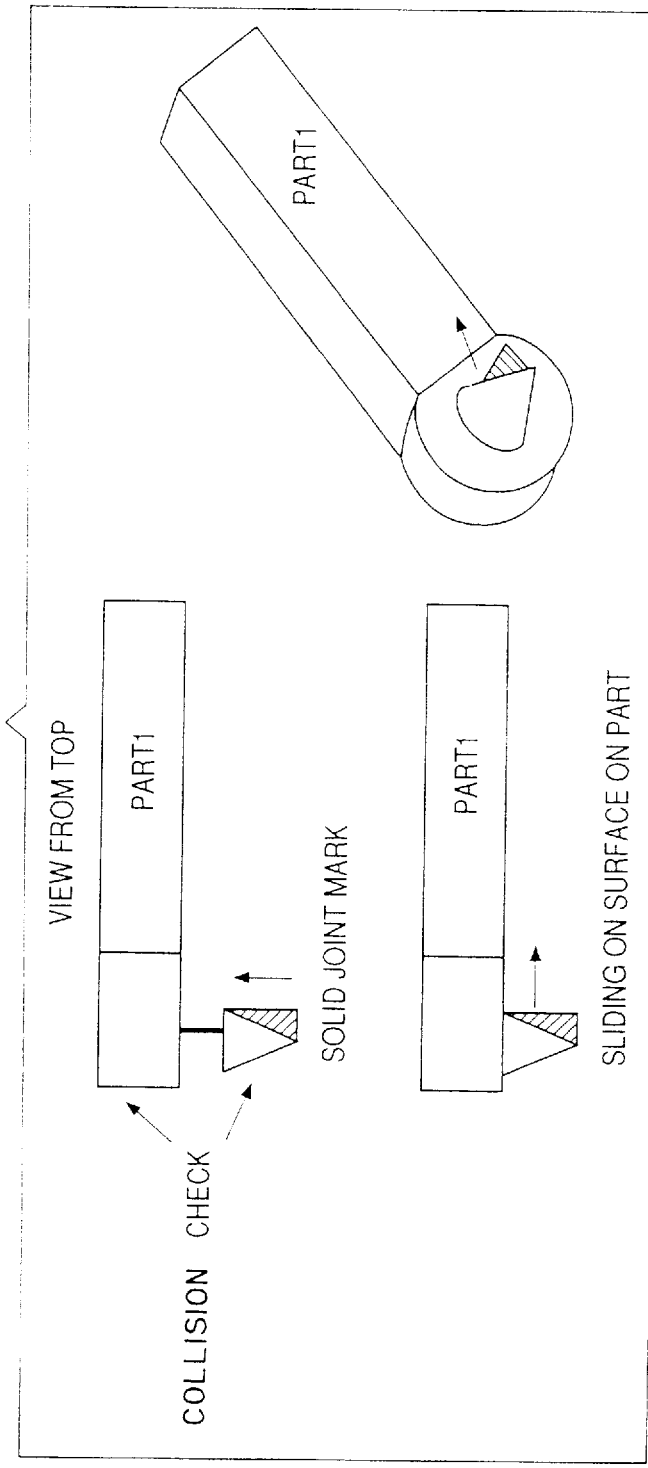
FIG. 57 is an explanatory view useful for understanding a collision check between a solid joint mark and a part.

FIG. 57 is an explanatory view useful for understanding a collision check between a solid joint mark and a part.

The "interference check" implies it is automatically checked as to whether the solid joint mark is located separately from the part, or as to whether they are collided with one another. The use of the "collision check" makes it possible to automatically stop the solid joint mark at a position whereat the solid joint mark is in contact with a surface of a part when the solid joint mark approaches the part, without entering into the part, and also makes it possible to slide the solid joint mark on the surface of the part, while the solid joint mark remains in contact with the part. Thus, it is possible to readily dispose the solid joint mark at a desired position in which the solid joint mark is in contact with the part.

To implement the "collision check", the button "collision check" in the mechanism analysis main menu shown in FIG. 45 is depressed to open the pull-down menu and select "object selection". Upon selection of the menu "object selection", the part (e.g. part 1 in FIG. 57) of interest in the collision check and the solid joint mark are subjected to picking on the CG screen through the mouse operation. Next, "ON" in the pull-down menu of the "collision check" is selected. The selection of the "ON" initiates the collision check between two figures (e.g. part 1 and the solid joint mark) subjected to picking. When the collision check is initiated, there is displayed on the CG screen a line by which those two figures are coupled with one another in the shortest distance. The solid joint mark can travel on the CG screen through the mouse operation or opening the screen the "joint position setting" shown in FIG. 45 and moving the valuator. However, when the collision (a distance between those two figures is zero) occurs, the solid joint mark is prevented from moving over the limit, even if the solid joint mark is intended to further move so as to approach the part 1. Thus, it is possible to readily dispose at the surface of the part without entering the part.

Figure 58:
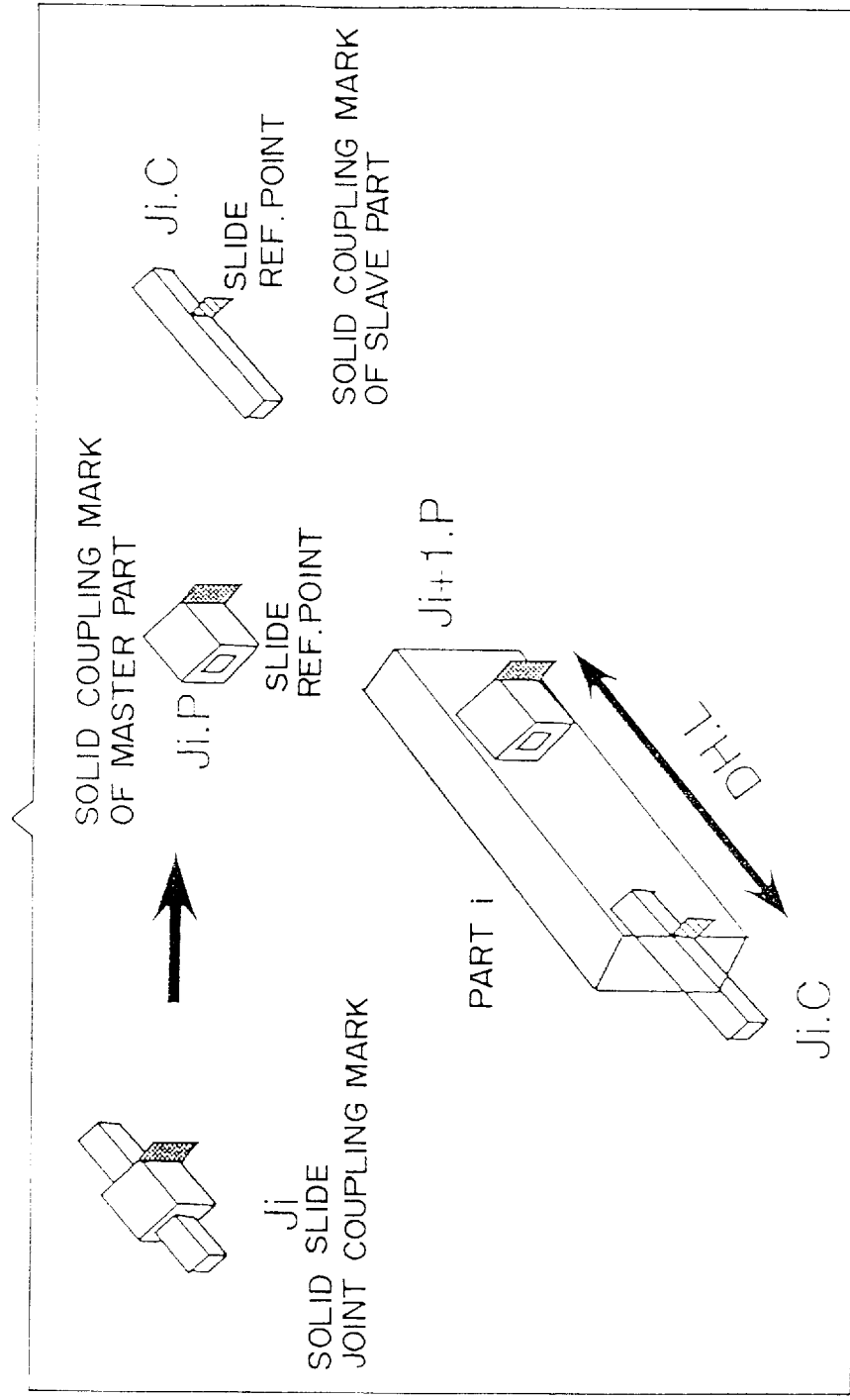
FIG. 58 is an explanatory view useful for understanding a technique of defining a slide type of joint involved in disconnected parts.
Figure 59:
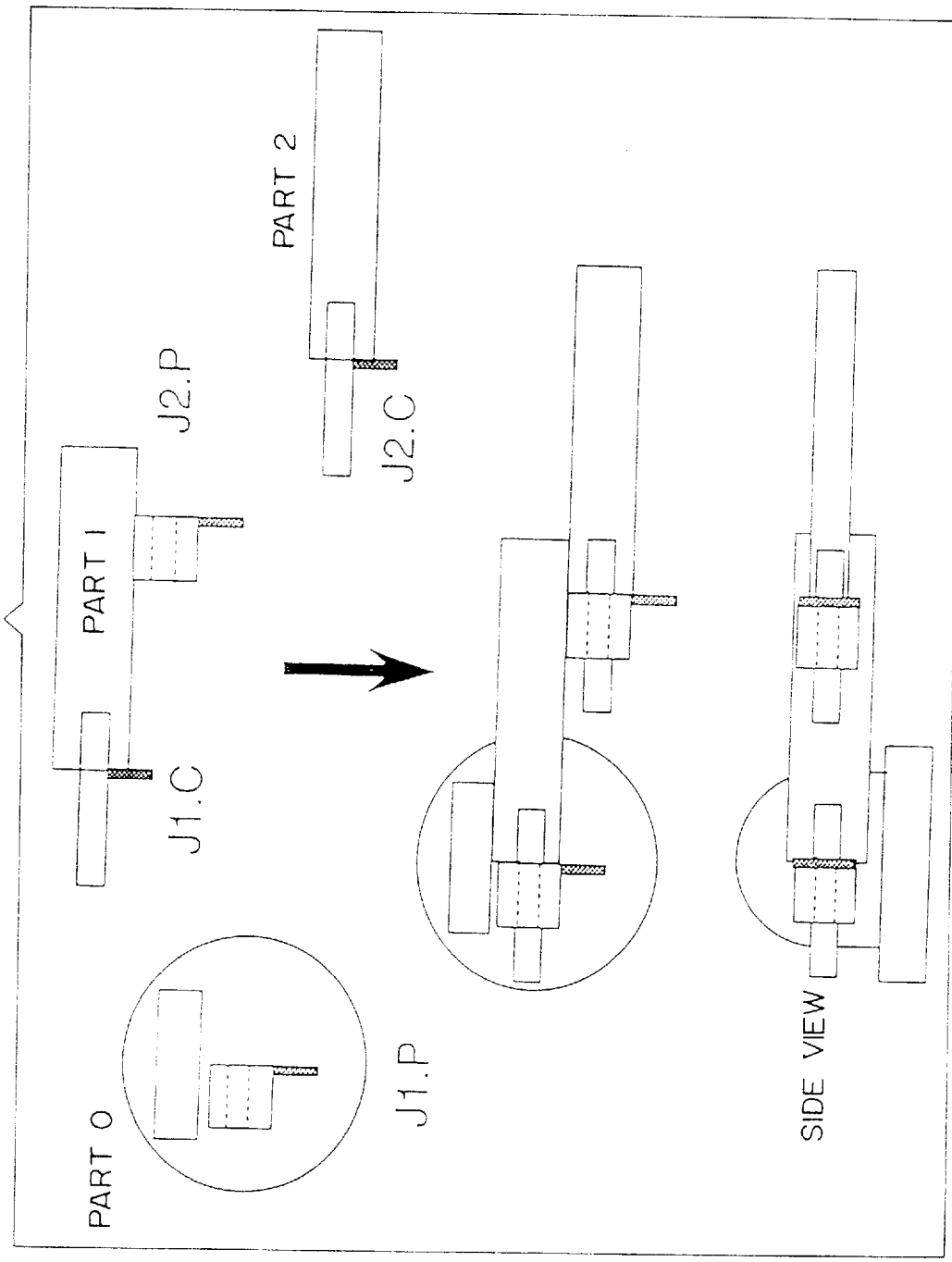
FIG. 59 is an explanatory view useful for understanding a technique of defining a slide type of joint involved in disconnected parts.
Figure 60:
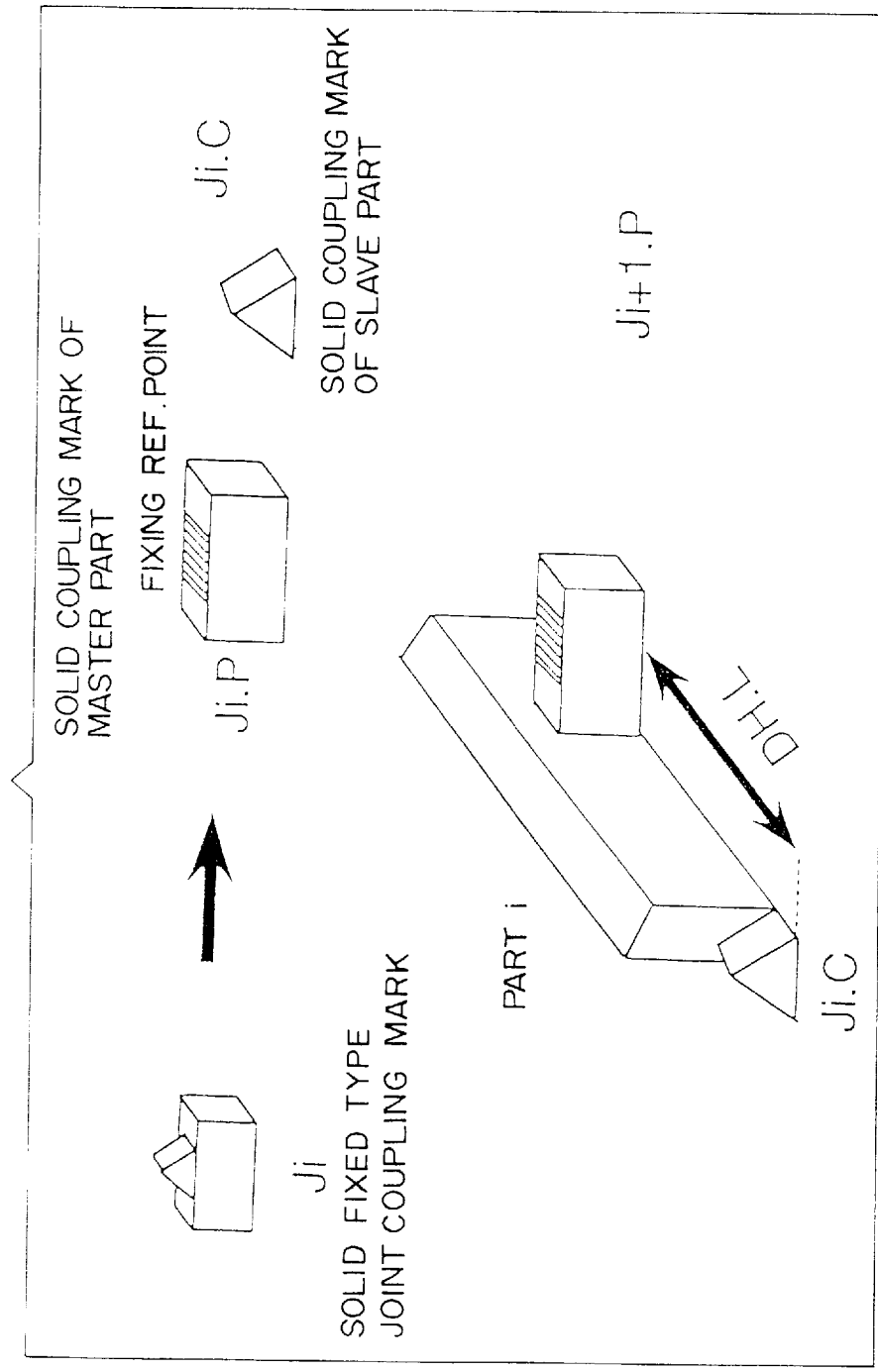
FIG. 60 is an explanatory view useful for understanding a technique of defining a fixed type of joint involved in disconnected parts.
Figure 61:
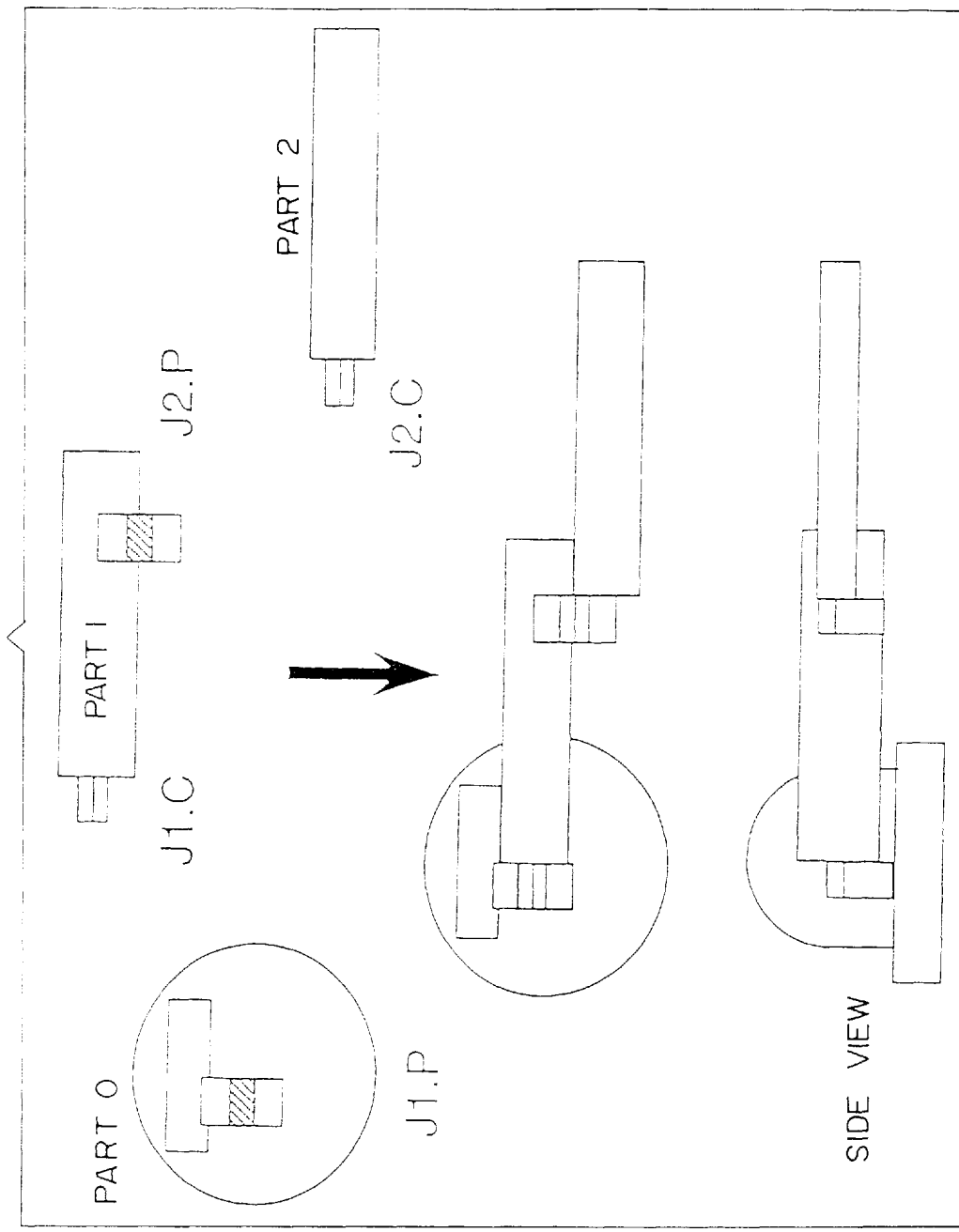
FIG. 61 is an explanatory view useful for understanding a technique of defining a fixed type of joint involved in disconnected parts.

FIGS. 58 and 59 are each an explanatory view useful for understanding a technique of defining a slide type of joint involved in disconnected parts. FIGS. 60 and 61 are each an explanatory view useful for understanding a technique of defining a fixed type of joint involved in disconnected parts.

These techniques are different from that explained referring to FIGS. 55 and 56 only in the point that the "direct acting type of joint" or the "fixed type of joint" is selected instead of selection of the "rotary type of joint" explained referring to FIGS. 55 and 56. Thus, the redundant explanation will be omitted. Incidentally, also in this case, it is acceptable that a plurality of sorts of joints are mixed in a single link mechanism.

Next, there will be explained a technique of setting a traveling limit (referred to as a "joint limit") of the part coupled by the joint defined in the fashion as mentioned above.

Figure 62:
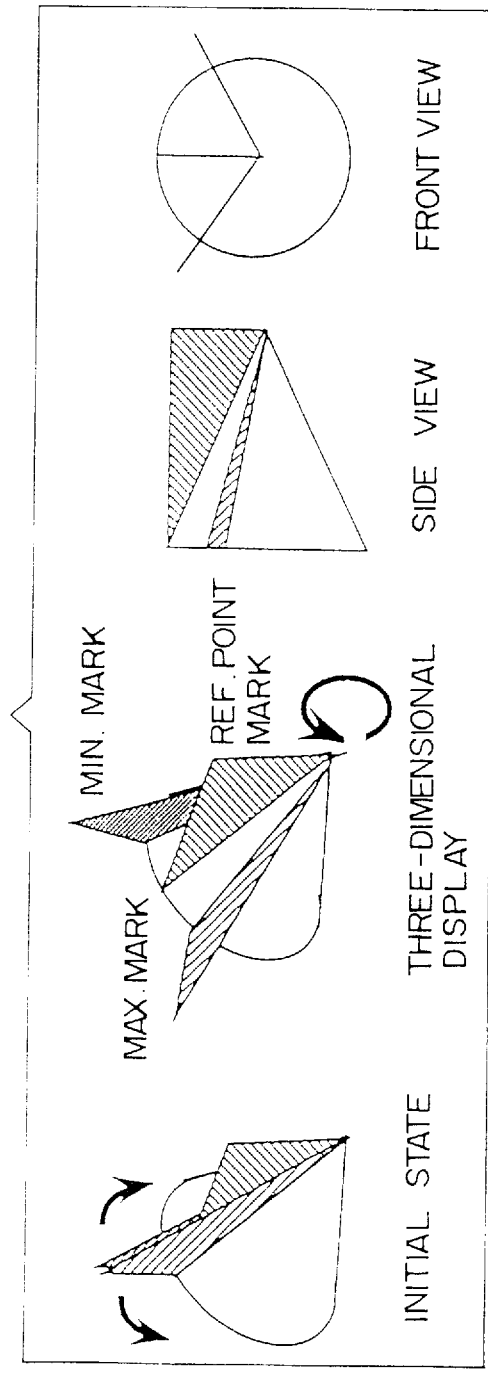
FIG. 62 is an illustration showing a solid joint mark for a joint limit setting (a solid joint mark of a rotary type of joint)

FIG. 62 is an illustration showing a solid joint mark for a joint limit setting (a solid joint mark of a rotary type of joint).

The menu title "movable range" of the joint setting menu shown in FIG. 45 is selected to open the pull-down menu "movable limit (part)", "movable limit (assembly)" and "angle of joint", and then the menu title "movable limit (part)" is selected. As a result, with respect to all the solid joint marks (except the solid joint mark of the fixed type of joint) arranged on the CG screen, or all the solid joint marks for slave parts arranged on the CG screen, there are displayed, as shown in FIG. 62, the maximum mark and the minimum mark on the conic portion of the tip of the respective solid joint mark (including the solid coupling mark for slave part). Simultaneously, the screen "joint limit" is displayed.

Figures 63A, 63B, 63C:
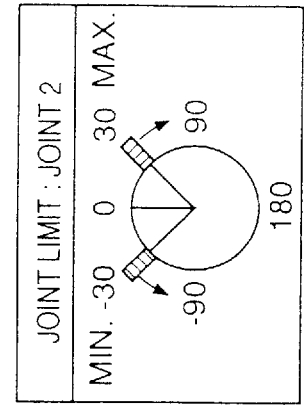
FIGS. 63(A), (B) and (C) are each an exemplary illustration of a screen of "joint limit"

FIGS. 63(A), (B) and (C) are each an exemplary illustration of a screen of "joint limit". While it is acceptable that any one of these screens of "joint limit" is prepared, it is preferable to provide such an arrangement that all the screens of "joint limit" are prepared so that a desired one is optionally used on a switching basis.

Incidentally, in setting of the joint limit, the solid joint mark for a master part is coupled to the solid joint mark for a slave part to form a unitary solid joint mark. Consequently, there is no need to set the joint limit to the solid joint mark for a master part.

The solid joint mark (including the solid coupling mark for slave part) displayed as an "initial state" in FIG. 62 is selected through picking by the mouse operation. Alternatively, a name of joint (e.g. "joint 2") is inputted through operation of the keyboard. Thus, there is designated a joint on which the joint limit is intended to be set. Then, the "joint 2" is displayed on the screen "joint limit" shown in FIGS. 63(A)–63(C) (here, the screen "joint limit" shown in FIG. 63(A)). Next, the mouse is moved in such a way that the maximum value mark (or the minimum value mark) in the solid joint mark thus selected is taken to open, so that the maximum value mark (or the minimum value mark) is moved on the CG screen in synchronism with a movement of the mouse.

Now, assuming that the screen "joint limit" shown in FIG. 63(A) is displayed, when the maximum value mark (or the minimum value mark) is moved in a fashion as mentioned above, the angle value corresponding to the travel is displayed on the screen "joint limit" shown in FIG. 63(A). In this manner, the maximum value or the minimum value of the joint limit is roughly set up through the mouse operation, and if it is out of the proper value, then the exact value is entered through the keyboard.

Alternatively, a control of the valuator through display of the screen "joint limit" shown in FIG. 63(B) makes it possible also to set up the maximum value or the minimum value of the joint limit. This scheme according to the valuator is effective in a case where it is difficult to select the maximum value mark or the minimum value mark through picking by the mouse operation. Operation of the valuator causes the maximum value mark or the minimum value mark to move in compliance with the operation of the valuator.

The screen "joint limit" shown in FIG. 63(C) is also effective in a case where it is difficult to practice picking by the mouse of the maximum value mark or the minimum value mark of the solid joint mark displayed on the CG screen. According to this scheme, the maximum value mark or the minimum value mark (tangs of the valuator traveling on the circle) is taken with the mouse to move, thereby setting up the maximum value or the minimum value of the joint limit.

The scheme of FIG. 63(C) has also such an advantage that the angle of the maximum value or the minimum value of the joint limit can be visually grasped on an intuitive basis.

Figure 64:
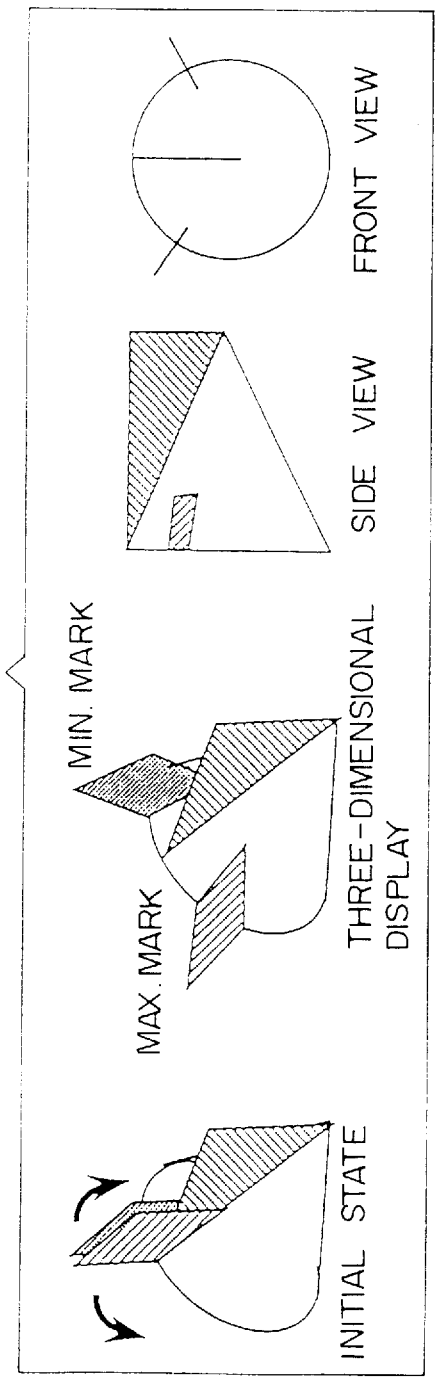
FIG. 64 is an exemplary illustration of the maximum value mark and the minimum value mark which are appended to the solid joint mark.
Figure 65:
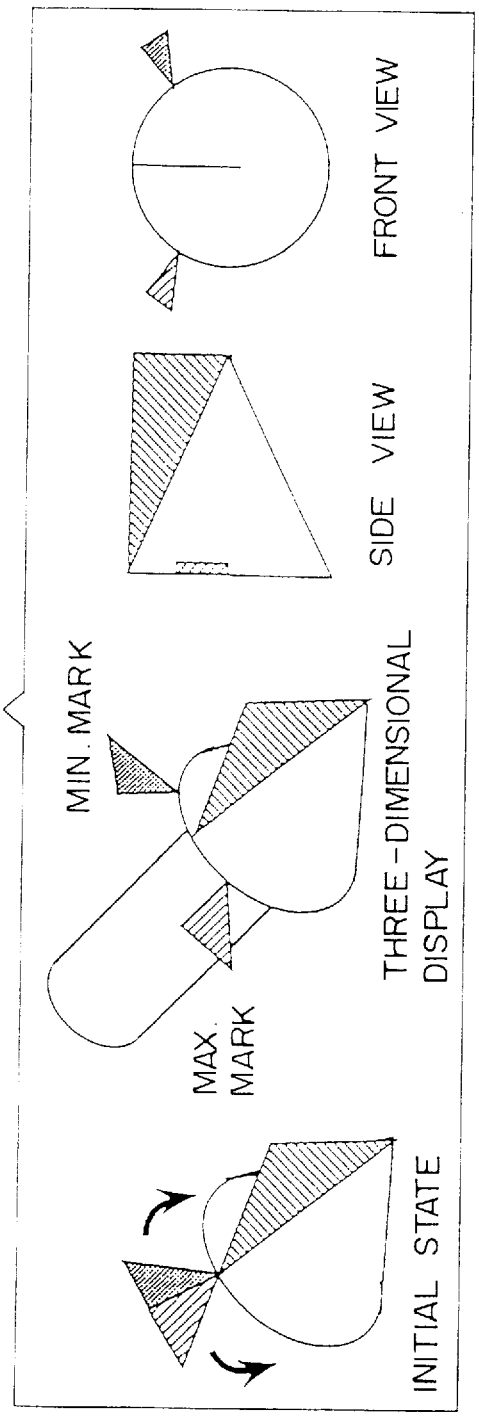
FIG. 65 is an exemplary illustration of the maximum value mark and the minimum value mark which are appended to the solid joint mark.

FIGS. 64 and 65 are each an exemplary illustration of the maximum value mark and the minimum value mark which are appended to the solid joint mark. The maximum value mark and the minimum value mark have variations as shown in FIGS. 62, 64 and 65 in accordance with the present embodiments. The easy-to-see configuration of marks may be optionally adopted.

Figure 66:
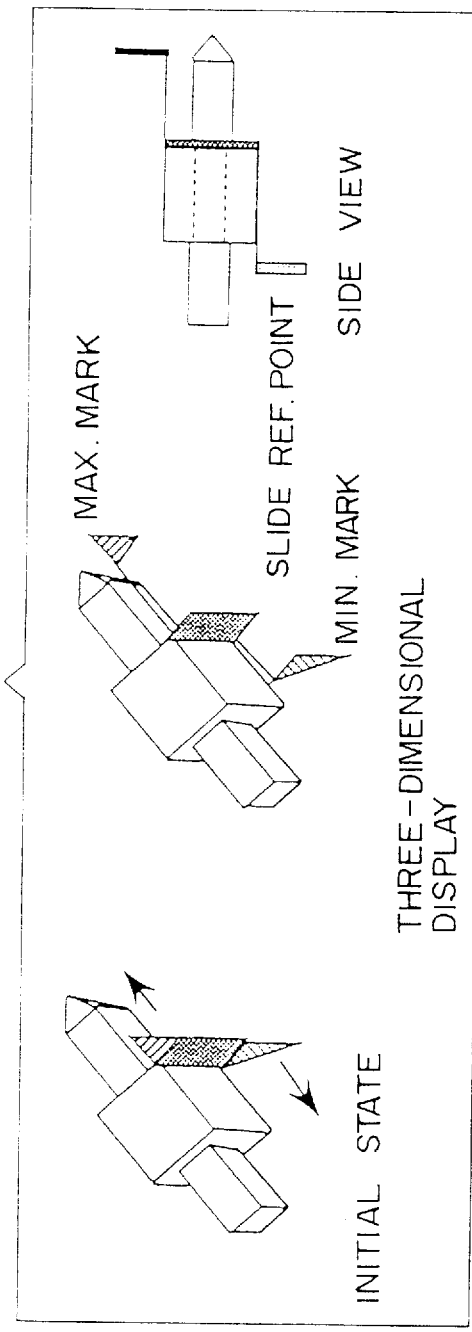
FIG. 66 is an illustration of the solid joint mark for joint limit setting as to the slide type of joint.

FIG. 66 is an illustration of the solid joint mark for joint limit setting as to the slide type of joint. FIGS. 67(A) and (B) are each an exemplary illustration of a screen of "joint limit" as to the slide type of joint. In case of the slide type of joint, the parts moves on a slide basis. For this reason, with respect to the slide type of joint, there is not prepared the screen of "joint limit" corresponding to FIG. 63(C) as to the rotary type of joint.

Figure 69:
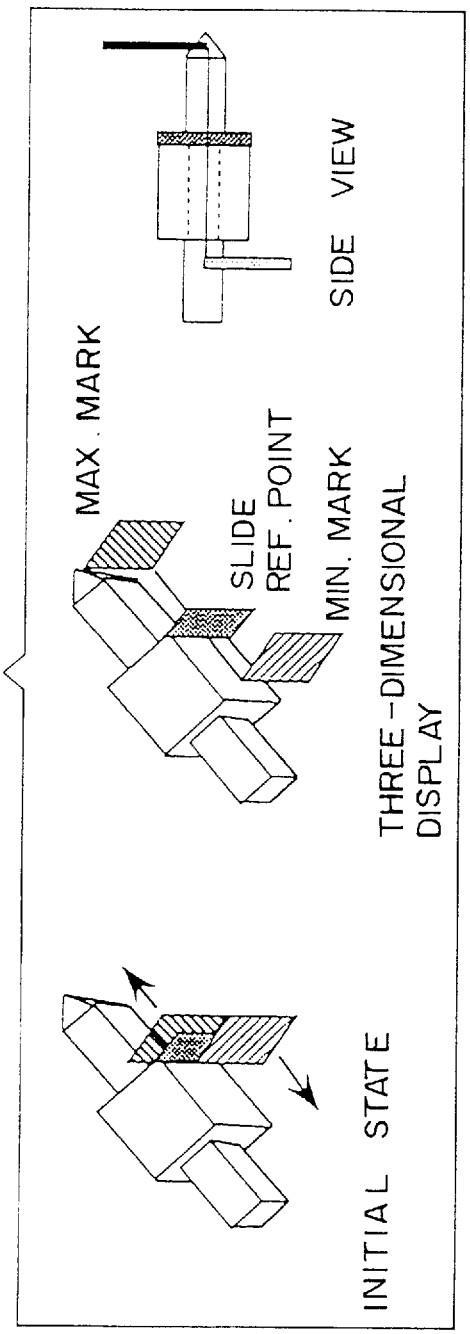
FIG. 69 is an exemplary illustration of the maximum value mark and the minimum value mark which are appended to the slide type of joint.

FIGS. 68 and 69 are each an exemplary illustration of the maximum value mark and the minimum value mark which are appended to the slide type of joint. Also with respect to the slide type of joint, the maximum value mark and the minimum value mark have variations as shown in FIGS. 66, 68 and 69 in accordance with the present embodiments. The easy-to-see configuration of mark may be optionally adopted.

Figure 70:
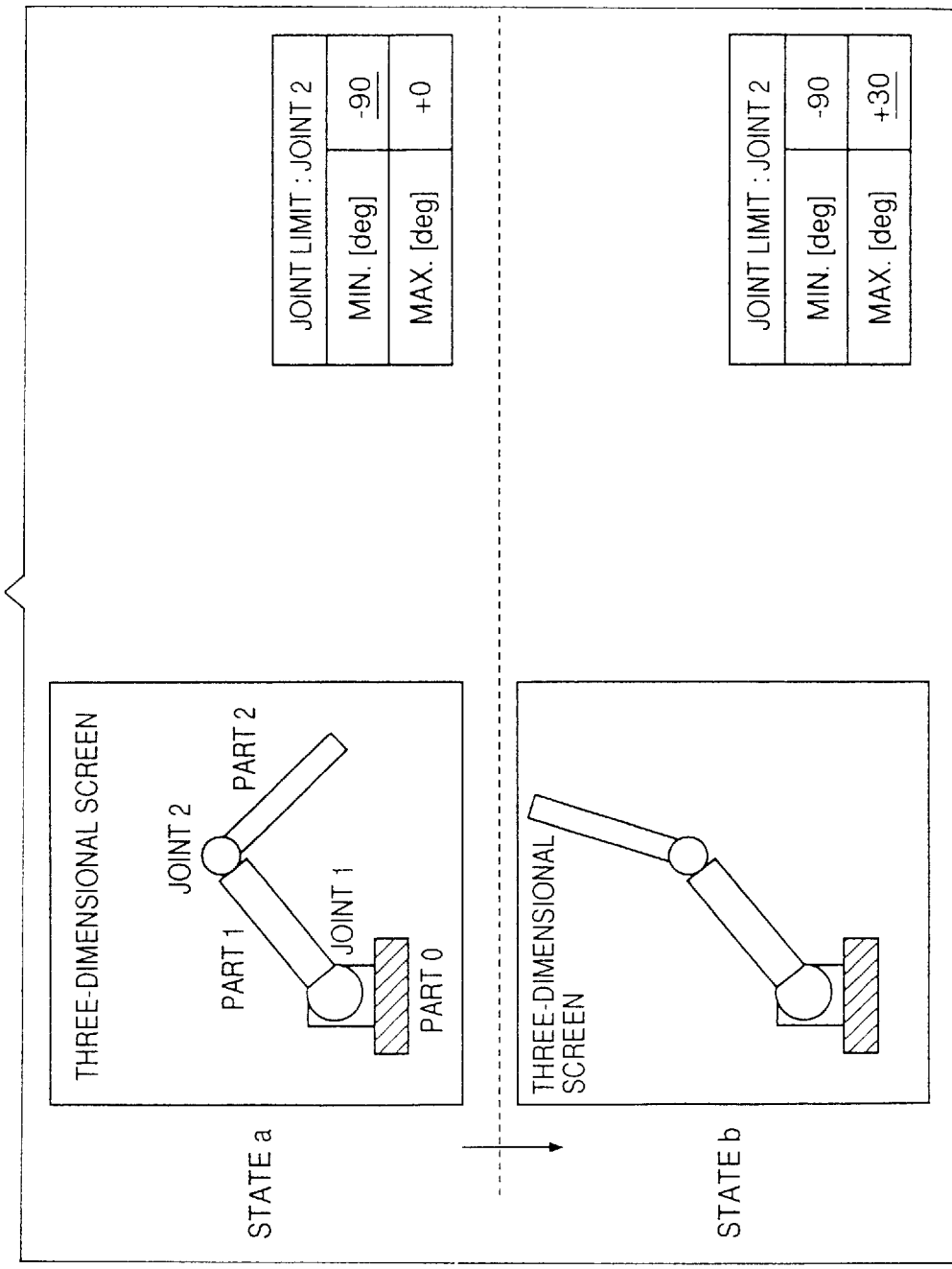
FIG. 70 is an explanatory view useful for understanding a joint limit setting scheme.

FIG. 70 is an explanatory view useful for understanding a joint limit setting scheme as another example.

After the termination of all the settings, when the button "joint computation" (cf. FIG. 45) is depressed, all the solid joint marks disappear from the CG screen. Thereafter, in the flowchart of the menus shown in FIG. 45, the button "variable range" of the joint setting menu is depressed to open its pull-down menu, and the menu "variable limit (assembly)" is selected. Then, the screen "joint limit" is displayed. In the flowchart of the menus shown in FIG. 45, when the menu "joint angle" is selected, the screen "joint angle" is displayed. The button "joint selection" in the screen "joint angle" is depressed and then the part on the CG screen is subjected to picking through the mouse. Assuming that the "part 2" on the CG screen is subjected to picking, there is displayed the "part 2" on the screen "joint angle" shown in FIG. 45 and "joint limit" shown in FIG. 70. While the "part" appears on the screen "joint angle", here, the "part" may be replaced by the "part 2". Alternatively, it is acceptable to input a name of parts through the keyboard, instead of picking of the part on the CG screen.

The joint angle is inputted through moving the valuator in the screen "joint angle", or through an entry of the numerical values from the keyboard. As a result, the part (here, "part 2"), which is designated on the CG screen, travels in accordance with the inputted angle. The inputted angle is displayed with the numeral in the screen "joint angle". If an operator determines that it is suitable to set up such an angle as the minimum value of the joint limit, the operator moves a cursor (shown in FIG. 70 with underline) for a numerical value input at an angle input position for the minimum value in the screen "joint limit" shown in FIG. 70, and then inputs the angle on a numerical value basis through the keyboard.

Next, likely, the designated part (here, "part 2") is moved, and the maximum value is inputted on a numerical value basis, thereby setting up the joint limit involved in the joint of the designated part ("part 2"). The above-mentioned procedure is sequentially carried out on the respective joints.

Figure 71:
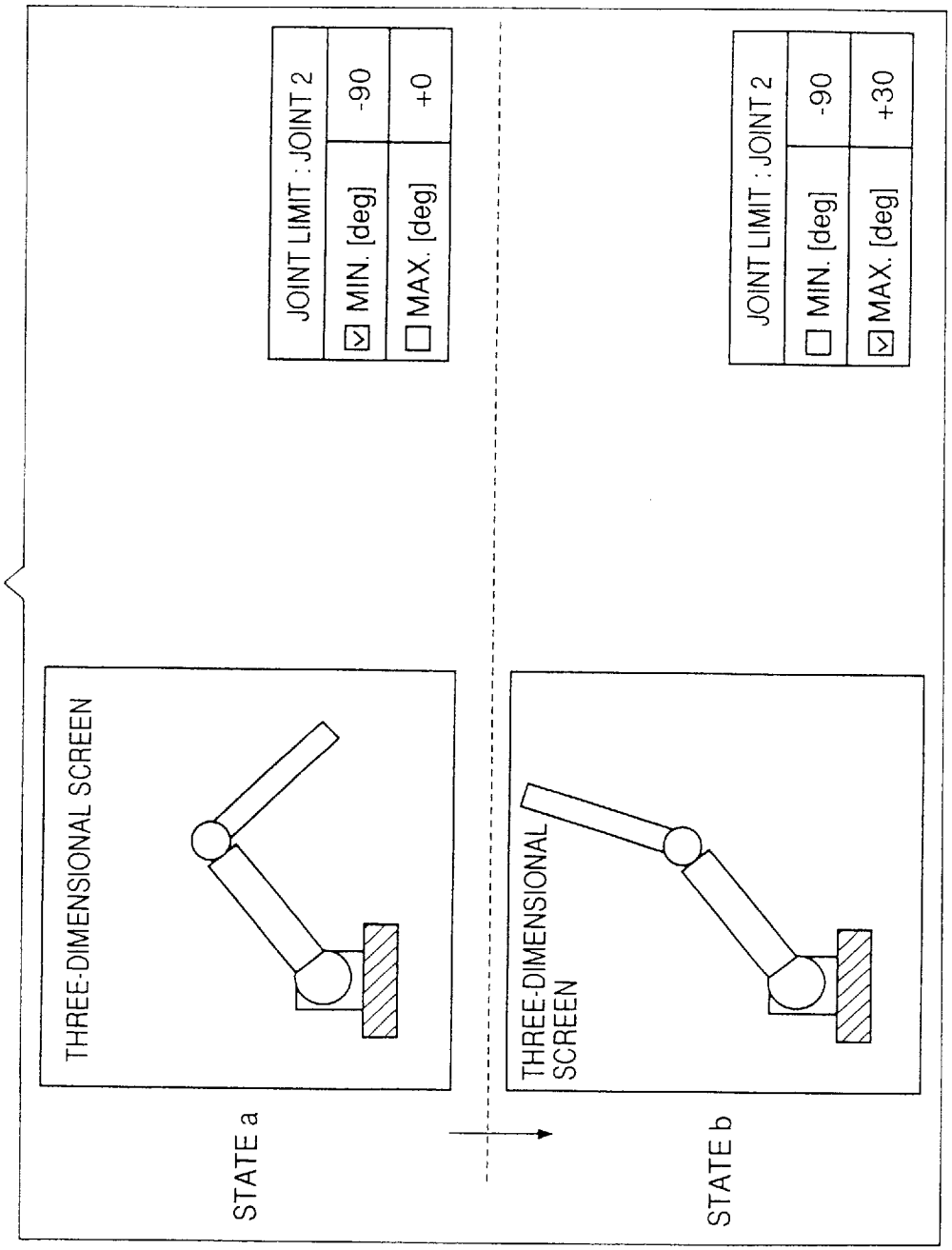
FIG. 71 is an explanatory view useful for understanding a modification of the joint limit setting scheme explained referring to FIG. 70.

FIG. 71 is an explanatory view useful for understanding a modification of the joint limit setting scheme explained referring to FIG. 70.

The screen "joint limit" shown in FIG. 71 is provided with frames for designation at columns "maximum value" and "minimum value", respectively. An angle of rotation is inputted through controlling the valuator in the screen "angle of joint" shown in FIG. 45 or through an entry of numerical value from the keyboard, so that the angle is set up as the minimum value or the maximum value. In this case, the frame for the minimum value or the maximum value in the screen "joint limit" shown in FIG. 71 is subjected to picking. As a result, the angle displayed in the screen "angle of joint" is inputted into the column of the numerical value input of the minimum value or the maximum value in the screen "joint limit", and is also displayed.

Incidentally, while there is described exemplarily the rotary type of joint, it is possible to set up the joint limit regarding also the slide type of joint in a similar fashion to that of the rotary type of joint. Thus, the redundant explanation will be omitted.

Figure 72:
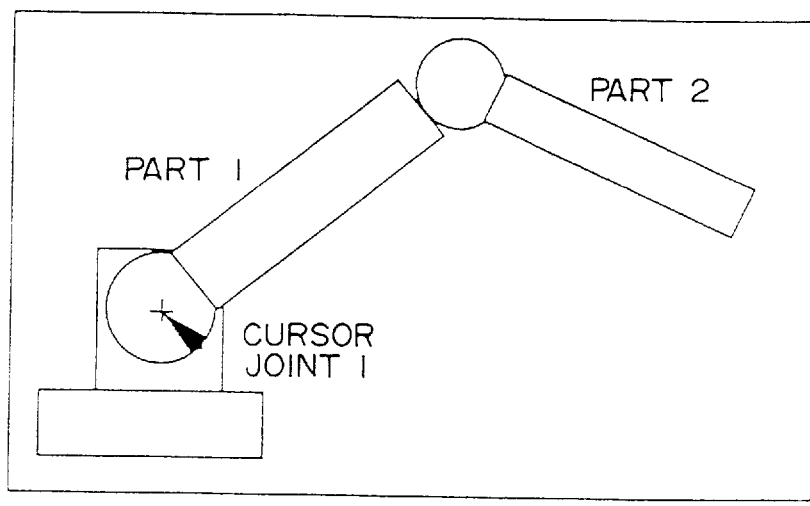
FIG. 72 is a typical illustration of parts displayed on a two-dimensional basis on a CG screen.
Figure 73:
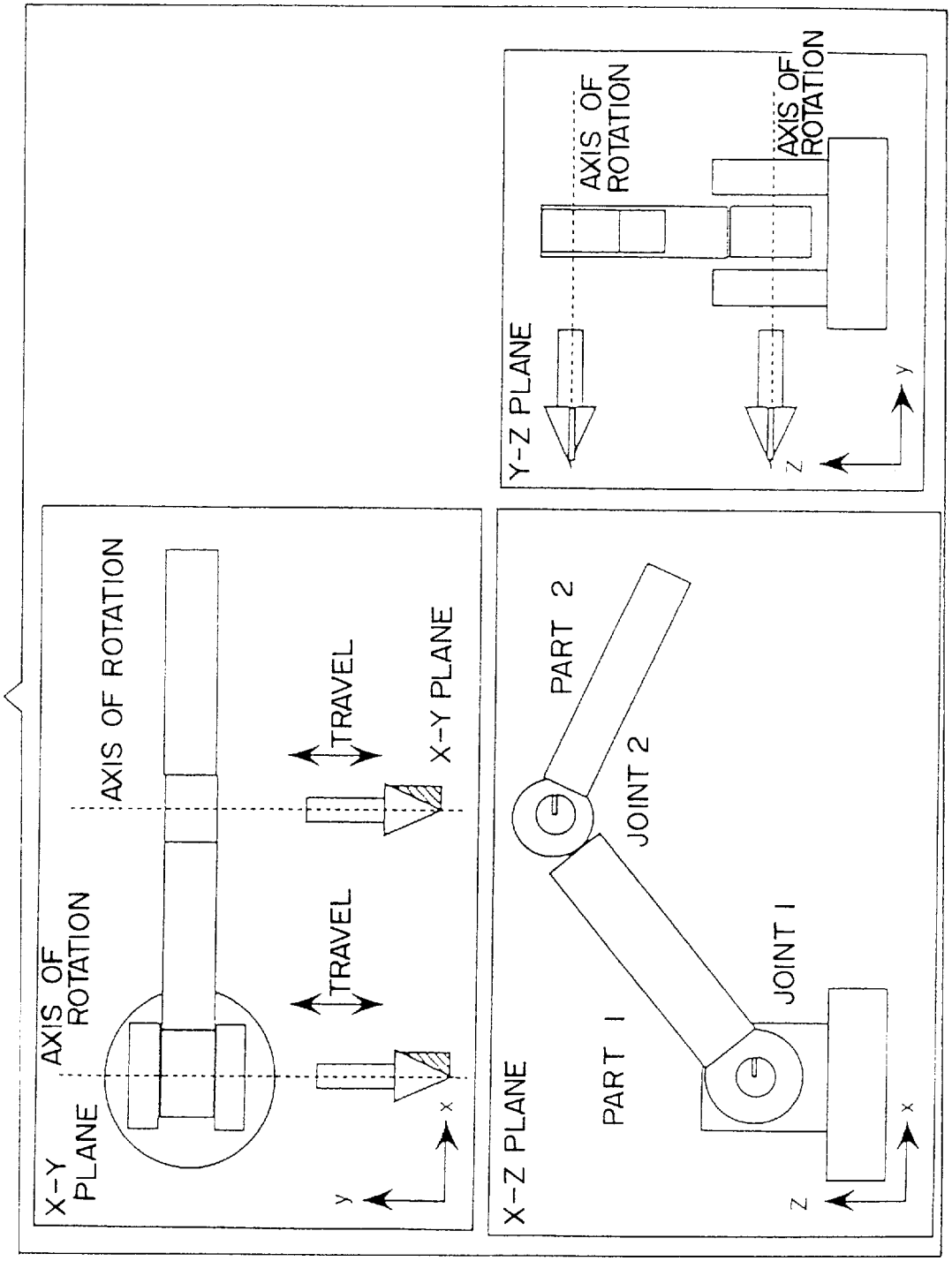
FIG. 73 is a typical illustration showing that a solid joint mark displayed on a two-dimensional basis is arranged onto the parts displayed on a two-dimensional basis on a CG screen.

FIG. 72 is a typical illustration of parts displayed on a two-dimensional basis on a CG screen. FIG. 73 is a typical illustration showing that a solid joint mark displayed on a two-dimensional basis is arranged onto the parts displayed on a two-dimensional basis on a CG screen.

The button "viewpoint etc." in the mechanism analysis main menu shown in FIG. 45 is depressed to open the pull-down menu, and select the menu "trihedral view display". As a result, there are displayed on the CG screen the trihedral views (an x-y plane view, a y-z plane view, an x-z plane view), which are drawn on a two-dimensional basis. Incidentally, FIG. 72 shows only the x-y plane view. The trihedral views are preferable, since it possible to exactly perform positioning of the solid joint mark (here, the solid joint mark displayed on a two-dimensional basis).

Next, the button "joint sort" in the joint setting menu shown in FIG. 45 is depressed to open the pull-down menu shown in FIG. 46; and "solid join mark selection" is selected to open its pull-down menu; and then "solid joint mark (two-dimension)" is selected to open the menu "solid joint mark" and select a desired joint (here, "rotary type of joint").

When a cursor moves onto an axis of rotary on any one (e.g. an x-z plane in FIG. 72 and FIG. 73) of the trihedral views displayed through the mouse operation and then the mouse button is depressed, the cursor position at that time is determined as a position of the axis of rotation of the rotary type of joint, and the solid joint mark of the rotary type of joint is displayed at that position. When the axis of rotation is designated on the x-z plane in FIG. 72, as seen in the x-y plane and the y-z plane of FIG. 73, it happens in some cases that the solid joint mark is located too apart from the part. In such a case, the screen "joint position setting" shown in FIG. 45 is opened, and the solid joint mark is moved with the valuator only in a direction of axis of rotation.

A direction of axis of rotation is reversed through the mouse button operation in a depth direction (or a direction directed backward the sheet or the screen), where a forward direction (or a direction directed forward the sheet or the screen) on a plane (here, the x-z plane) in which an axis of rotation is designated is given as a default value. A direction of rotation is given, as mentioned above, as positive with a forward direction of the right screw.

At this stage, only the axis of rotation is determined, but a reference point of the axis of rotation (a direction in which an angle of rotation of the joint is zero) is not yet set up and a part (a slave part), which is to be coupled with the joint having the axis of rotation thus determined, and the master part are not yet designated. With respect to a direction of the reference point of the axis of rotation, it is possible to set up the direction in the similar fashion to that explained referring to FIG. 49(D).

With respect to a designation of the part (a slave part), which is to be coupled with the joint, and the master part, likely, it is possible to implement the designation through picking of the part on the CG screen after selection of the "part selection" or "master part selection".

Alternatively, it is acceptable to select the part (a slave part) and the master part in accordance with scheme as set forth below.

Figure 74:
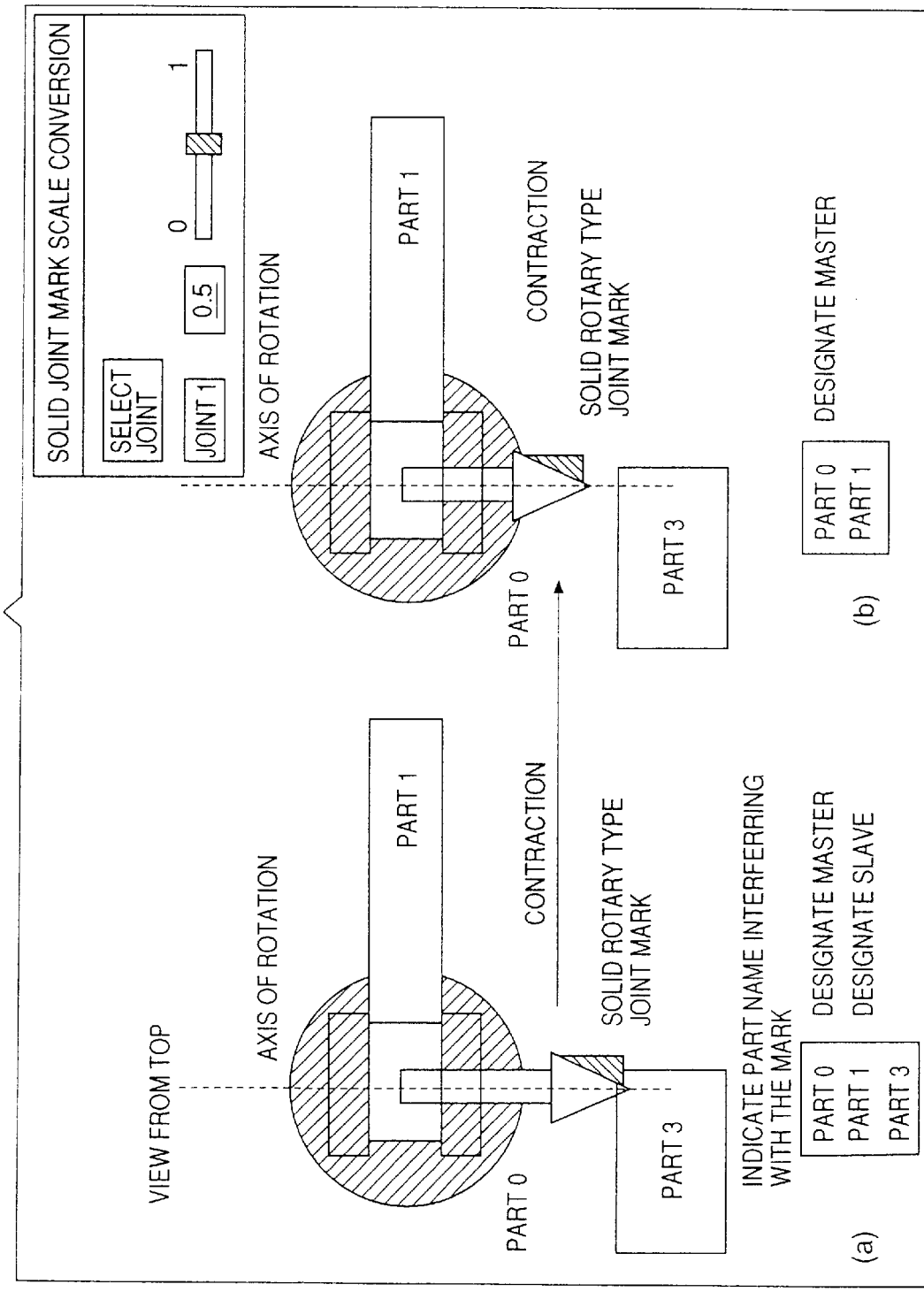
FIG. 74 is an explanatory view useful for understanding one technique for designation of parts (slave parts) and the master parts.

FIG. 74 is an explanatory view useful for understanding one technique for designation of parts (slave parts) and the master parts.

The menu "scale conversion" in the menus shown in FIG. 46 is selected. Then, there are displayed the screen "solid joint mark scale conversion" shown in FIG. 74 and in addition a list (e.g. "part 0", "part 1", "part 3" in Part (a) of FIG. 74) of parts which collide with the solid joint mark. Now, when the size of the solid joint mark is shortened, the parts, which collide with the solid joint mark, become only two pieces of the "part 0" and "part 1". At this stage, if one of these two parts is subjected to picking and is designated as the master part through inputting a name of parts and the like, then the remaining part is automatically designated as the slave part.

After the solid joint marks are allocated to all the joints in a similar fashion as mentioned above, if the button "application" shown in FIG. 46 is depressed, or if the "joint computation" shown in FIG. 45 is selected, joint data (a D-H parameter and a value of such parameter) is computed.

Figure 75:
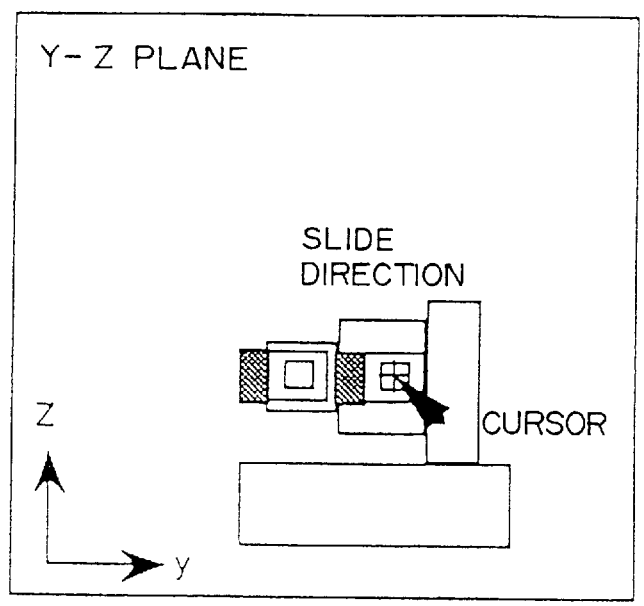
FIG. 75 is a typical illustration of parts displayed on a two-dimensional basis on a CG screen.
Figure 76:
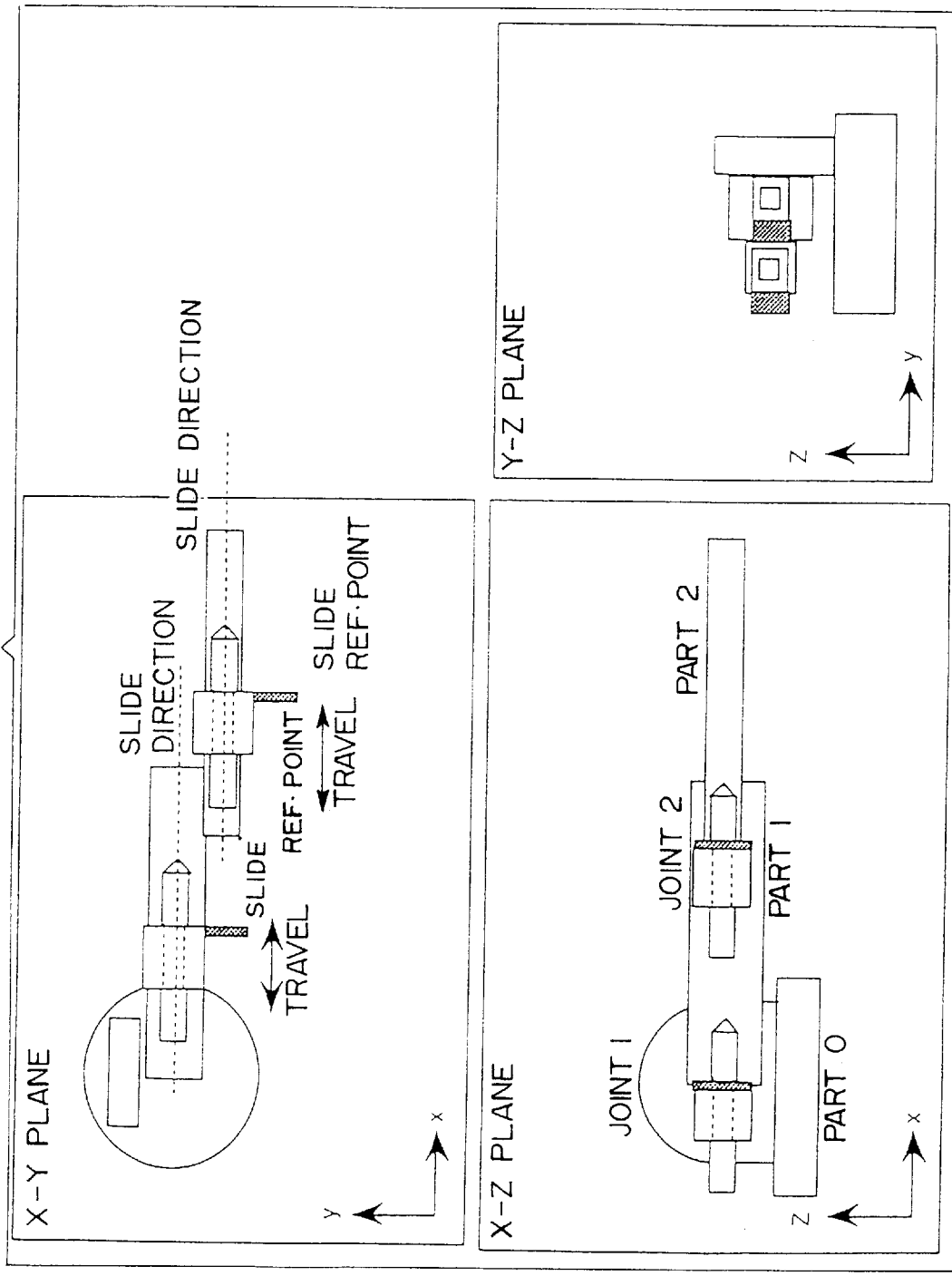
FIG. 76 is a typical illustration showing that a solid joint mark (for a slide type of joint) displayed on a two-dimensional basis is arranged onto the parts displayed on a two-dimensional basis on a CG screen.

FIG. 75 is a typical illustration of parts displayed on a two-dimensional basis on a CG screen. FIG. 76 is a typical illustration showing that a solid joint mark (for a slide type joint) displayed on a two-dimensional basis is arranged onto the parts displayed on a two-dimensional basis on a CG screen.

In FIG. 75, the y-z plane is shown. After the "slide type of joint" is selected in the screen "solid joint mark" shown in FIG. 46, the cursor is moved on a joint point in the y-z plane shown in FIG. 75 to designate the joint position. As a result, the solid joint mark of the slide type joint is disposed at the designated position. When the position of the solid joint marks on the the x-y plane and the x-z plane other than the y-z plane is deviated, the screen "joint position" shown in FIG. 45 is opened to travel the solid joint mark in the slide direction, thereby performing a positioning. The subsequent processing is the similar as to the matter of the rotary type of joint, and thus the redundant explanation will be omitted. Further, also as to the fixed type of joint, the similar procedure is applicable thereto, and thus the redundant explanation will be omitted. In case of the fixed type of joint, as mentioned above, the arrangement position and the orientation are not specified.

Next, there will be explained a procedure of joint definition in a case where in the CAD end there are inputted not only geometry data of parts constituting a link mechanism, but also data involved in a coordinate system which data is representative of the joint in conjunction with the geometry data, wherein the position and orientation of the part are designated through the coordinate system.

Here also, first, there will be explained the case of an entry of geometry data involved in a state that a plurality of parts are assembled, and then the case of an entry of geometry data involved in disconnected parts.

Figure 77:
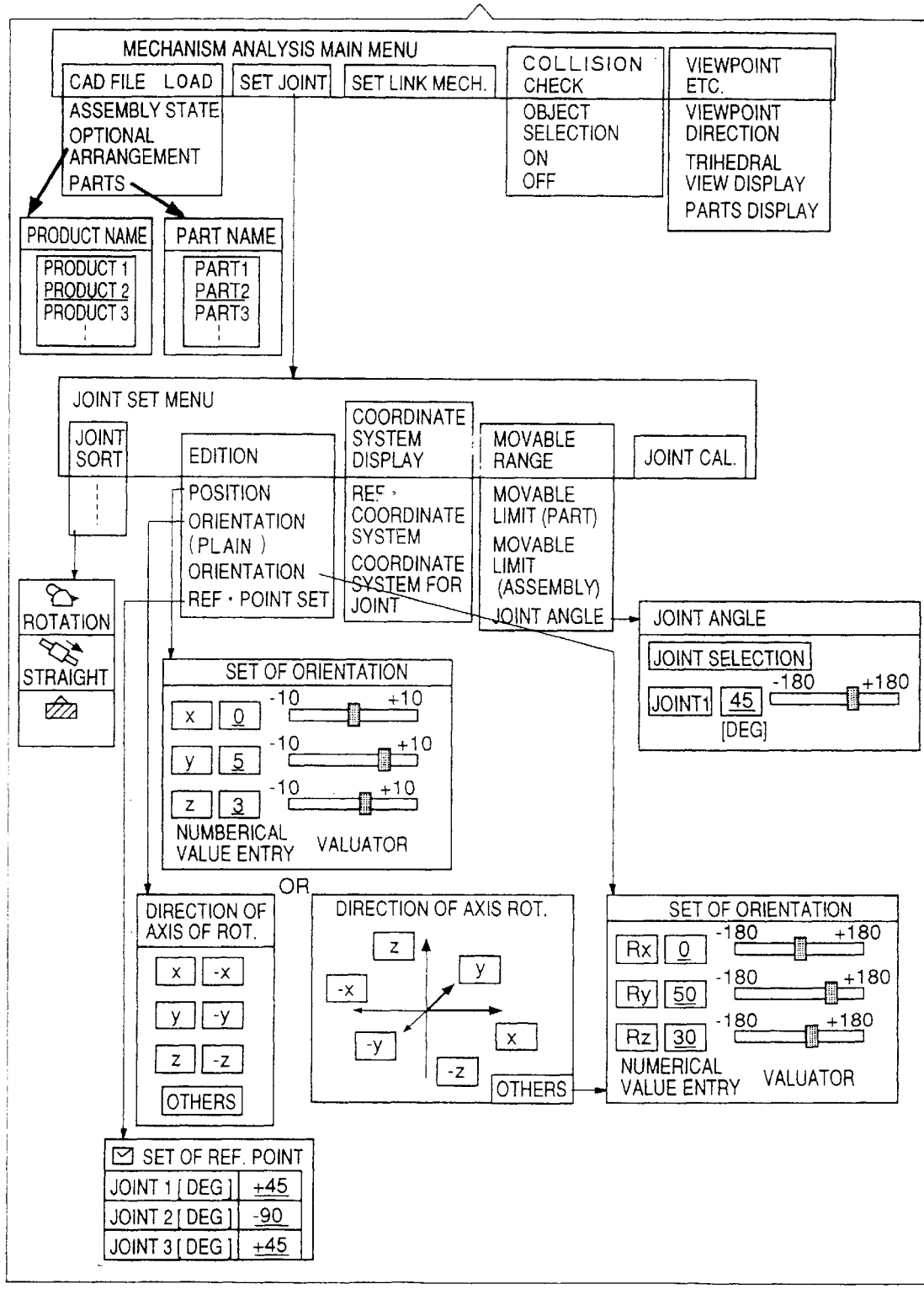
FIG. 77 is an explanatory view useful for understanding a flow of menus.
Figure 78:
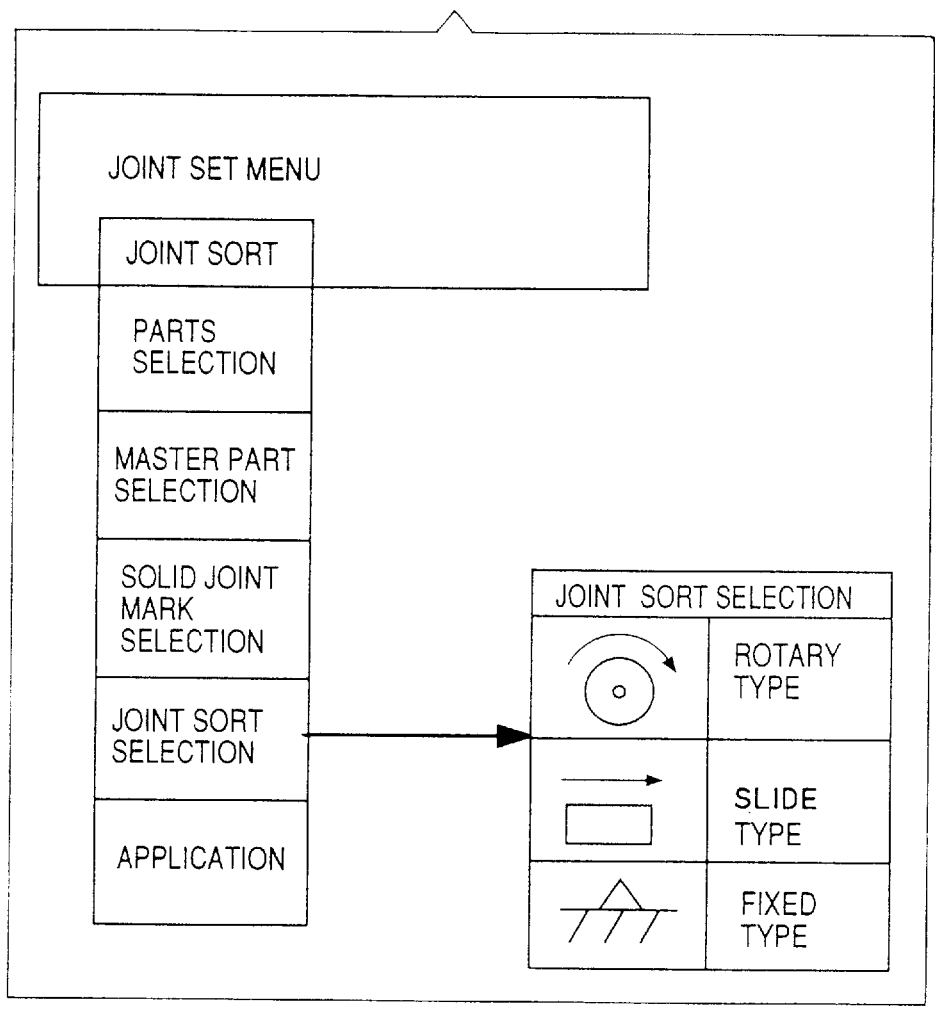
FIG. 78 is an illustration showing a pull-down menu of a joint setting menu.
Figure 79:
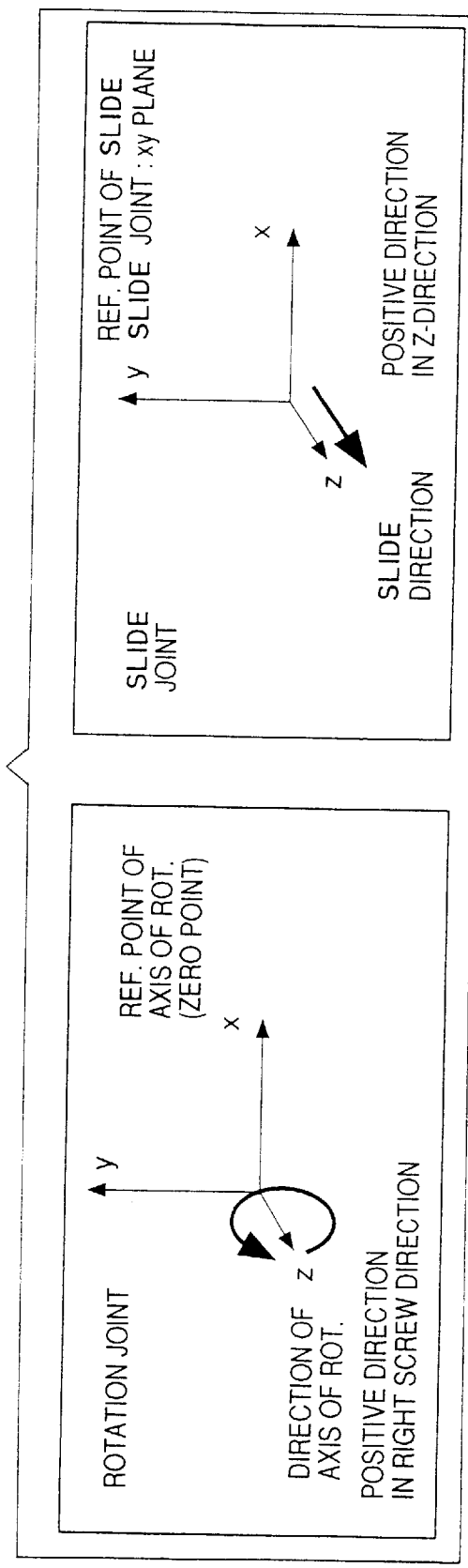
FIG. 79 is an explanatory view useful for understanding a creating rule of the link coordinate system.

FIG. 77 is an explanatory view useful for understanding a flow of menus. FIG. 78 is an illustration showing a pull-down menu of a joint setting menu. FIG. 79 is an explanatory view useful for understanding a creating rule of the link coordinate system.

Figure 80:
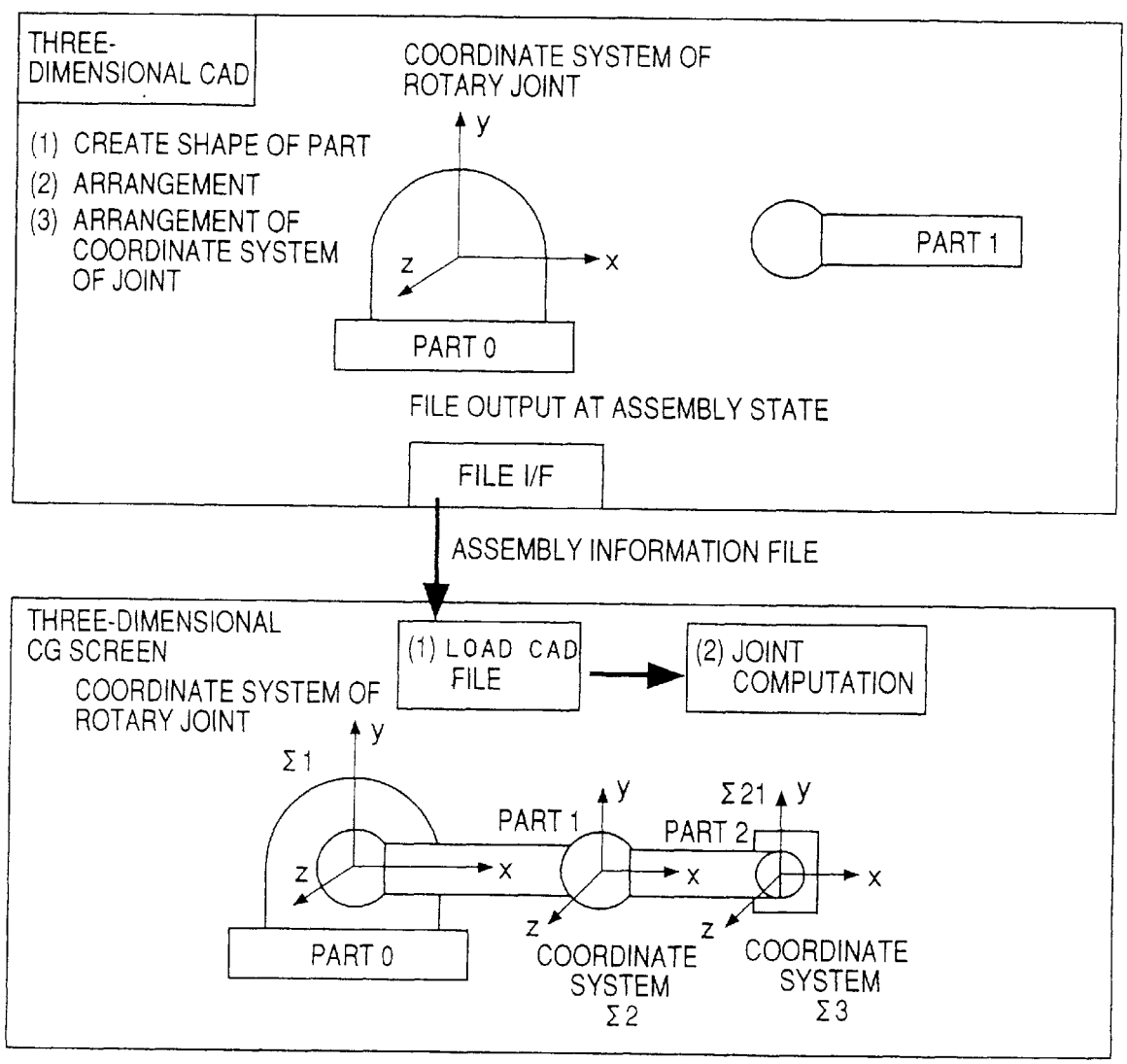
FIG. 80 is an explanatory view useful for understanding a joint definition scheme in a case where geometry data involved in the assembled state is entered.
Figure 81:
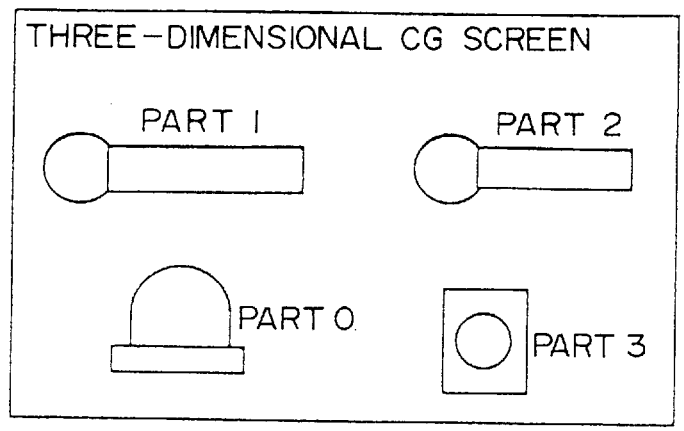
FIGS. 81–85 are each an explanatory view useful for understanding a procedure for setting a joint through loading geometry data involved in disconnected parts.

FIG. 80 is an explanatory view useful for understanding a joint definition scheme in a case where geometry data involved in the assembled state is entered.

As shown in FIG. 80, it is assumed that the CAD system is required to satisfy the following conditions:

(1) To create part geometry data.
(2) To create part assembly data.
(3) Designers consider joints such as axes of rotary or the like and arrange coordinates for position and orientation of the rotary type of joint and the slide type of joint. It is needed for an arrangement of the joint coordinates to accord with the following rules, as shown in FIG. 79. In case of the rotary type of joint, the z-axis is given as a direction of axis of rotation, and a direction of rotation is given with a clockwise direction as a forward direction. Further, the x-axis is given as a rotary reference point (a direction in which an angle of rotation is zero). In case of the slide type of joint, the z-axis is given as a forward traveling direction, and the xy plane is given as a slide reference point.

(4) Geometry data of the assembled parts, and information as to names, positions and orientations of the respective coordinates are filed and outputted.

Assuming that the CAD system satisfies the above-mentioned conditions, according to the present embodiment, the joints are defined in accordance with the following procedure.

(1) Load of a CAD file including geometry data of parts in the assembled state:

The menu "CAD file load" in the mechanism analysis main menu shown in FIG. 77 is selected to open the pull-down menu, and then the button "assembling state" is depressed. As a result, the menu "product name" is displayed. Thus, a desired product name (e.g. "product 2") is selected to load geometry data involved in the state that the selected product is assembled, and the geometry data thus loaded is displayed on the CG screen.

(2) Selection of coordinate system for joints:

The button "coordinate system display" in the joint setting menu shown in FIG. 77 is depressed to open the pull-down menu, and then the button "coordinate system for joints" is depressed. As a result, the coordinate system for joints, as shown in FIG. 80, is displayed on the CG screen, on the basis of data of the CAD file.

(3) Set joints:

The button "joint sort" in the joint setting menu shown in FIG. 77 is depressed. As a result, the pull-down menu as shown in FIG. 78 is displayed. Then, the menu "select joint sort" is selected so that the screen "select joint sort" is displayed. Thus, a desired type of joint (e.g. "rotary type of joint") is selected, and then from among the coordinate systems for joints which are displayed on the CG screen, a coordinate systems for joints to which the selected type of joint is intended to be assigned is designated through picking by the mouse operation. The designated coordinate systems for joints is color-changed into, for example, red, for the purpose of clarification of the fact that a designation is made.

Next, the "part selection" shown in FIG. 78 is selected, so that the associated part (e.g. "part 1") on the CG screen shown in FIG. 80 is selected through picking by the mouse operation.

Likely, the "master part selection" shown in FIG. 78 is selected, so that the associated part (e.g. "part 0") on the CG screen shown in FIG. 80 is selected through picking.

In this manner, a desired type of joint of solid joint mark is displayed.

The above procedure is repeatedly carried out so that a desired type of joint of solid joint mark is displayed for each coordinate system for joints. Thereafter, the button "joint calculation" shown in FIG. 77 is depressed to evaluate joint data consisting of a D-H parameter and its parameter value.

Next, there will be explained a case where geometry data of disconnected parts is loaded. In this case, the CAD system is released from condition (2) such that part assembly data is created, of the above-mentioned conditions (1)–(3) which are set to the CAD system in a case where when geometry data after assembly is loaded.

FIGS. 81–85 are each an explanatory view useful for understanding a procedure for setting a joint through loading geometry data involved in disconnected parts.

The menu "CAD file load" in the mechanism analysis main menu shown in FIG. 77 is selected, and then the button "part" in the pull-down menu is depressed to load a file of three-dimensional geometry data created in the CAD system. The file i s read for each part. The parts thus read are disposed at the optional position and orientation on the CG screen through, for example, the valuator and numerical value entry (cf. FIG. 81). Alternatively, the button "optional arrangement" is selected by the mouse from the pull-down menu of "CAD file load", and then the product name of the file is selected. As a result, a plurality of parts constituting the product thus selected are disposed at the positions and orientations written in the output file of the CAD system, and the product is displayed.

Figure 82:
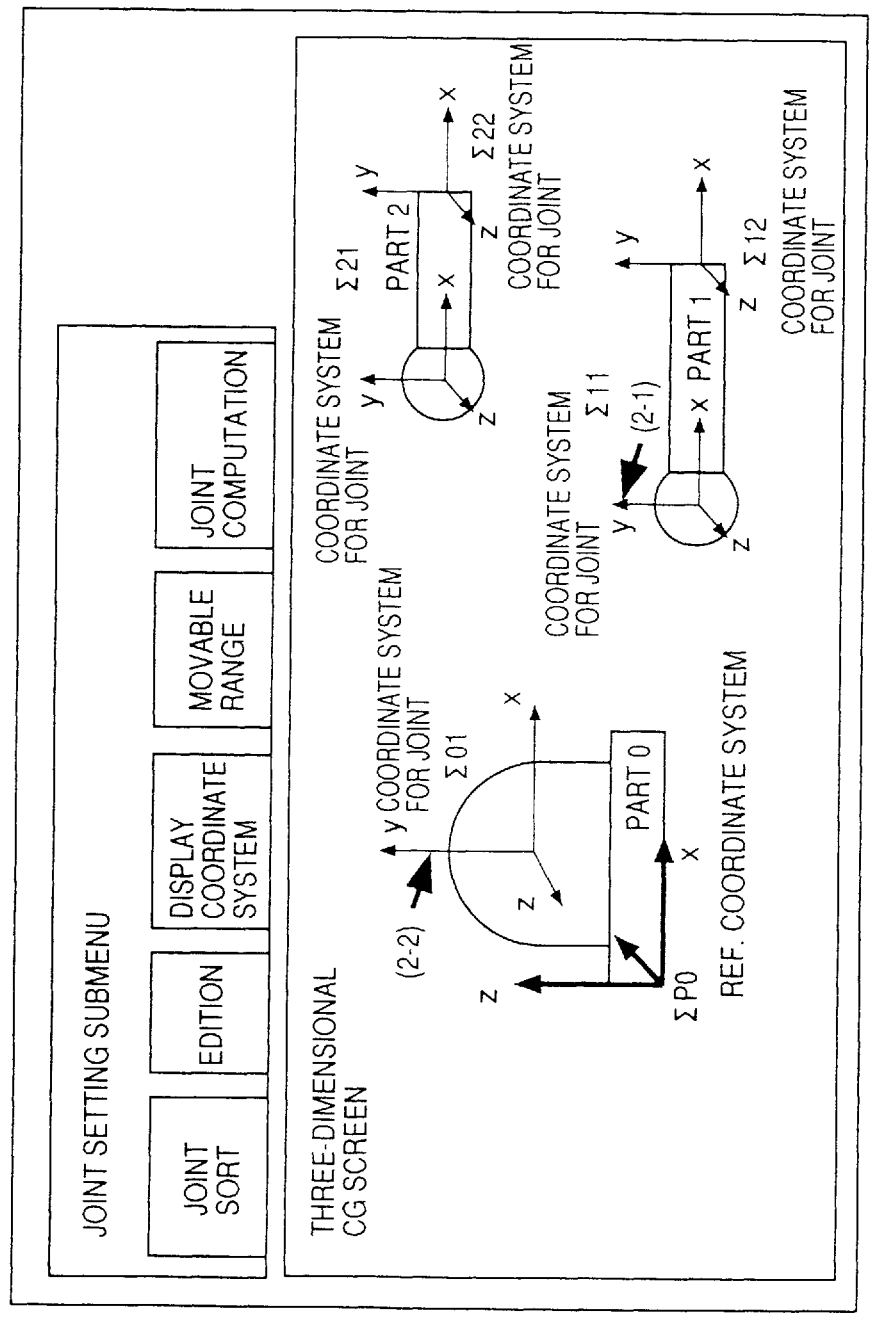
Figure 83:
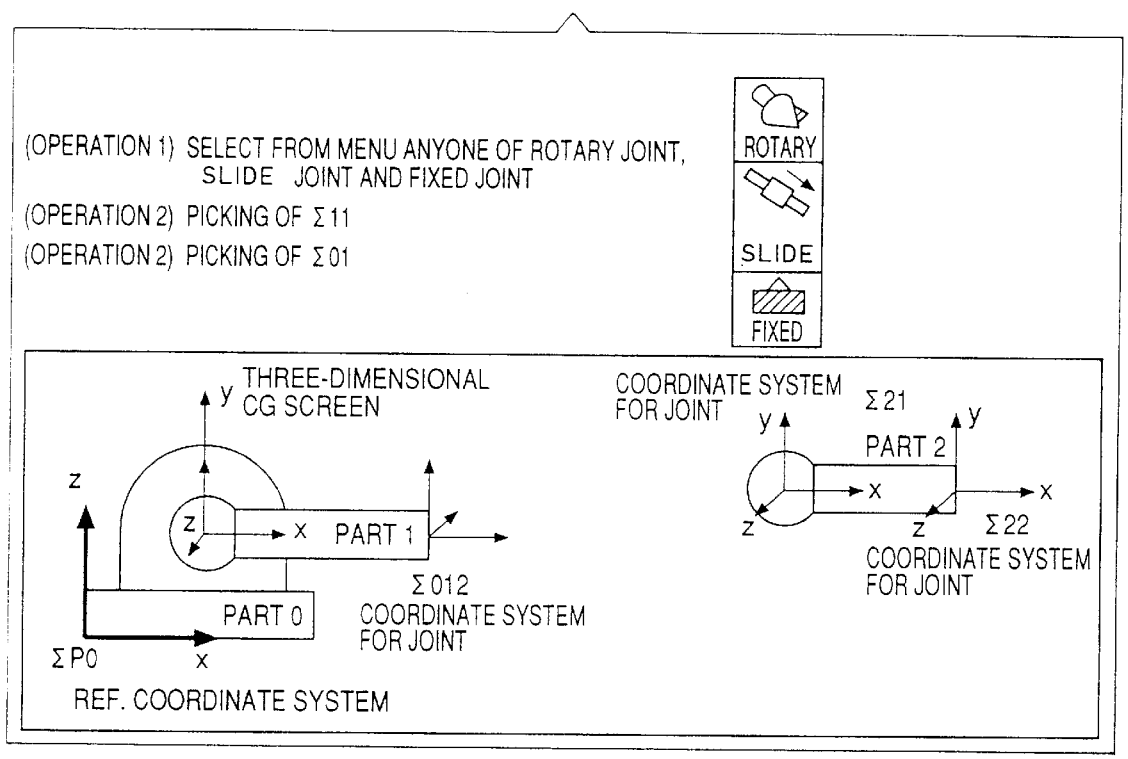

Next, the button "coordinate system display" in the joint setting menu is depressed to open the pull-down menu, and then the button "coordinate system for joints" is depressed. As a result, the coordinate system for joints, as shown in FIG. 82, is displayed on the CG screen, on the basis of data of the CAD file.

Next, the button "set joint" in the joint setting menu is depressed to open the pull-down menu, and then the menu "joint sort selection" is selected and the menu "rotary type of joint" (or "slide type of joint", "fixed type of joint") is selected in the screen "joint sort selection". Here, it is assumed that the "rotary type of joint" is selected. Next, the coordinate system Σ 11 (cf. FIG. 82) is subjected to picking with the mouse. In addition, the coordinate system Σ 01 is subjected to picking with the mouse. As a result, a D-H parameter and its parameter value are evaluated so that the part are rearranged to superimpose the coordinate system on Σ 01 (cf. FIG. 83).

Further, confirmation and setting of an axis of rotation and a reference point are performed. The axis of rotation (default: z-axis) and the reference point (default: x-axis) are automatically displayed. When a designer arranges coordinate systems taking into account an axis of rotation in the CAD system, in many cases, it is considered that the coordinate systems are properly set up. However, on the other hand, in a case where it is different from the coordinate system intended, setting of the coordinate systems is done over again with the valuator and the like in such a manner that the button "edition" of the joint setting menu is depressed to open the pull-down menu, and the button "position" or "orientation" is depressed to open the screen "joint position setting" or "joint orientation setting". The "edition" including the fine adjustment will be described in detail later. Incidentally, the illustrations shown in FIG. 77 omit the button "application". This is similar to the matter of other illustrations.

Figure 84:
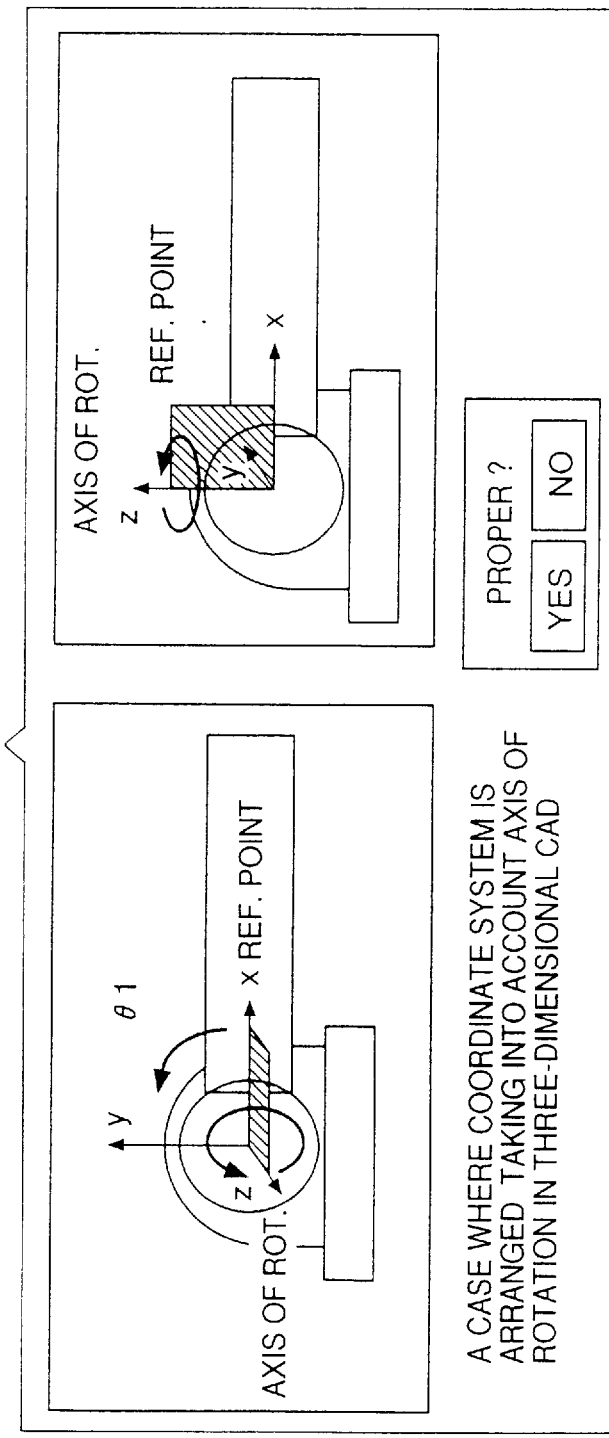
Figure 85:
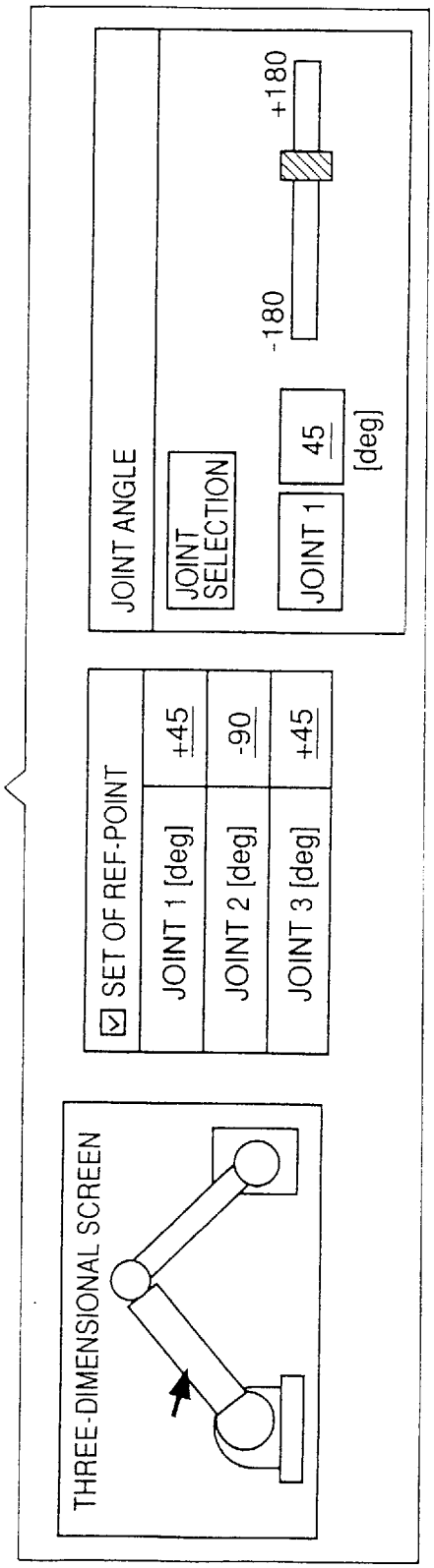

Alternatively, it is also acceptable to provide such an arrangement in which as shown in FIG. 84, defaults of an axis of rotation and a reference point are displayed, and simultaneously, the menu for a confirmation is displayed on the screen so that the user's will is confirmed through a selection between the buttons of "Yes" or "No" by the mouse operation. In case of "No", an operation immediately goes to an edition mode and the valuator and the like is displayed.

The reference point (an angle of rotation of a joint is given by zero) is set up in the following fashion. In a state that the screen "joint angle" is opened, for example, "joint 1" is inputted through the keyboard. While seeing the CG screen, the joint angle is inputted with the valuator or the numerical value input to move the part.

Next, the button "edition" in the joint setting menu is depressed to open the pull-down menu, and then the button "set reference point" is depressed. Then, the screen "set reference point" is displayed. Whenever the button "set reference point" is depressed, the angle becomes a new reference point.

When button "joint calculation" shown in FIG. 77 is depressed, there are evaluated a D-H parameter and its parameter value which are link parameters.

The "edition" is performed in accordance with the following fashion. Specifically, the "edition" is performed in a case where the button "edition" in the joint setting menu is depressed to open the pull-down menu, and then the button "position" or "orientation" is depressed, or in a case where defaults of an axis of rotation and a reference point are displayed, and simultaneously, the menu for a confirmation is displayed on the screen and the button of "No" is depressed. The coordinate system for joints defined in the CAD system is involved in a high possibility in which they are inadvertently erroneously disposed with ±90, ±180° or the like. For these reasons, the button "edition" in the joint setting menu is depressed to open the pull-down menu and select "orientation (plain)", so that a menu having a button of 6 directions as to an axis of rotation is displayed.

When the button in the menu screen is depressed, an axis of rotation is displayed so as to turn to the direction of the associated axis. In a case where it is desired to alter the orientation to another other than those, the button "other" is depressed, or the button "edition" in the joint setting menu is depressed to open the pull-down menu, and then the button "orientation" is depressed to open the screen "joint orientation setting menu", so that the axis of rotation is moved by the valuator or the numerical value entry. On the other hand, in a case where it is desired to alter the position, the button "edition" in the joint setting menu is depressed to open the pull-down menu, and then the button "position" is depressed to open the screen "joint position setting", so that the position is altered. At that time, if the menu "viewpoint etc." in the mechanism analysis main menu is selected, the trihedral views looking from x, t, z axes are displayed. This makes it possible to exactly perform an adjustment of positions and orientations.

FIG. 86 is an explanatory view useful for understanding a display scheme for standby and acceleration of parts in the subwindow.

The parts, which are looking moderately apart from the reference coordinates, or which are moderately reduced, are in turn displayed on the subwindow in the order of writing into the CAD file or loading. When a part is coupled by the joint setting, the coupled part is shifted to the main window, and the remaining part is displayed in the subwindow. The use of such a subwindow makes it possible to provide an easy-to-see screen, thereby facilitating the joint setting.

Figure 87:
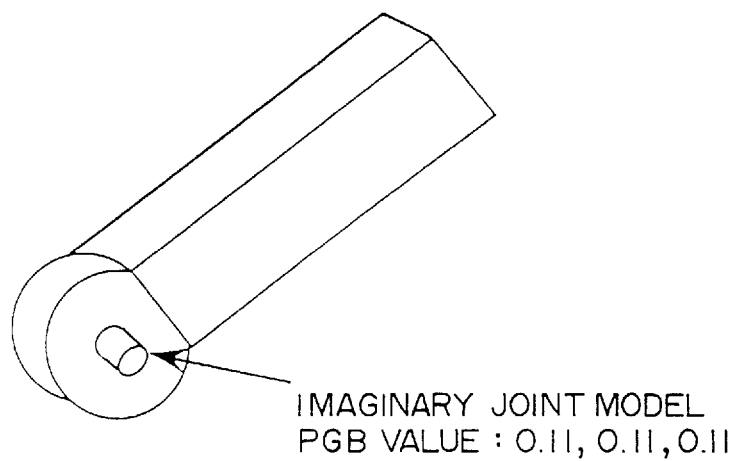
FIG. 87 is an exemplary illustration of a CG screen including an imaginary joint model.

FIG. 87 is an exemplary illustration of a CG screen including an imaginary joint model.

According to the above explanation, in the CAD system, the joint coordinate system is defined. However, it is acceptable that this is modified in such a manner that in the CAD system, an imaginary joint model in which a position and an orientation of a joint are simulated, instead of the joint coordinate system, is produced, and upon receipt of data involved in a position and an orientation of the joint model from the CAD system, a solid joint model is arranged on the position and orientation thus received, and thereafter proceeding with the subsequent procedure. It is sufficient for the imaginary joint model to be provided with a simple configuration (e.g. a cone, a column, etc.) in manufacture. And, it is preferable that a portion of the part is distinguished from the joint model on the basis of color data (e.g. RGB values: 0.11, 0.11, 0.11, etc.).

As described above, according to a link mechanism analyzer of the present invention, it is possible to perform a mechanism analysis of a link mechanism through a simple operation.

Also, according to a link mechanism joint data arithmetic unit, it is possible to input data involved in joints, which will be necessary to produce joint data of a link mechanism, with a simple operation and also in such a way that a traveling behavior of the parts coupled by the joint is readily visually grasped on the screen on an intuitive basis.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A link mechanism analyzer comprising:

file storage unit for storing a file which describes an analytic solution of a forward kinematics on each of a plurality of sorts of link mechanism models each having a link and a joint, and an analytic solution of an inverse kinematics, on each of the plurality of sorts of link mechanism models, in a case where the link and the joint of each of the link mechanism models are adopted as a driving source for driving the link mechanism model;

data input unit for inputting geometry data representative of a three-dimensional geometry of a link mechanism to be analyzed having a link and a joint, and joint data which describes a parameter representative of a coupling relation between the link and the joint constituting the link mechanism to be analyzed and a parameter value of the parameter;

a first handler for selecting from among said plurality of sorts of link mechanism models a link mechanism model corresponding to a three-dimensional geometry represented by the geometry data inputted through said data input unit;

a second handler for designating a driving source for driving a link mechanism to be analyzed having the three-dimensional geometry represented by the geometry data inputted through said data input unit;

a third handler for inputting a drive rate of said driving source designated by operation of said second handler; and arithmetic unit for solving on a numerical value basis the analytic solution of the forward kinematics corresponding to the link mechanism model selected by operation of said first handler, and the analytic solution of the inverse kinematics corresponding to the driving source of the link mechanism to be analyzed designated by operation of said second handler, in such a manner that the parameter value included in the joint data inputted through said data input unit and the drive rate inputted by operation of said third handler are substituted.

2. A link mechanism analyzer according to claim 1, wherein said analyzer further comprises display unit for displaying a graphic screen of the three-dimensional geometry represented by the geometry data inputted through said data input unit, and a link mechanism model screen representing the link mechanism model selected by operation of said first handler.

3. A link mechanism analyzer according to claim 2, wherein said display unit displays a plurality of menu titles arriving at a designation of a desired link mechanism model through a sequential designation, and said first handler performs an operation to designate the menu titles displayed on said display unit.

4. A link mechanism analyzer according to claim 3, wherein said plurality of menu titles include a menu title representative of each of groups of link mechanism models which are classified with degree of freedom.

5. A link mechanism analyzer according to claim 2, wherein said second handler performs both an operation of instructing a link on the graphic screen displayed on said display unit, and an operation of instructing as to which one of the link and the joint coupling the link is adopted as the driver source.

6. A link mechanism analyzer according to claim 2, wherein said display unit displays marks each representative of a selectable driving source, the mark being superimposed on the link mechanism model screen, and said second handler performs an operation of instructing one of the marks.

7. A link mechanism analyzer according to claim 1, wherein said analyzer further comprises fourth handler for designating a first link locating at a base of all the links constituting the link mechanism to be analyzed having the three-dimensional geometry represented by the geometry data inputted through said data input unit.

8. A link mechanism analyzer according to claim 1, wherein said analyzer further comprises a first link detecting unit for detecting a first link locating at a base of all the links constituting the link mechanism to be analyzed having the three-dimensional geometry represented by the geometry data inputted through said data input unit, on the basis of the parameter included in the joint data inputted through said data input unit.

9. A link mechanism analyzer according to claim 1, wherein said analyzer further comprises a new link mechanism model construction unit for constructing a new sort of link mechanism model by combination of a plurality of link mechanism models from among said plurality of sorts of link mechanism models.

10. A link mechanism analyzer comprising:

file storage unit for storing a file which describes analytic solutions of a forward kinematics and a kinetics on each of a plurality of sorts of link mechanism models each having a link and a joint;

data input unit for inputting geometry data representative of a three-dimensional geometry of a link mechanism to be analyzed having a link and a joint, and joint data which describes a parameter representative of a coupling relation between the link and the joint constituting the link mechanism to be analyzed and a parameter value of the parameter;

a first handler for selecting from among said plurality of sorts of link mechanism models a link mechanism model corresponding to a three-dimensional geometry represented by the geometry data inputted through said data input unit;

a second handler for designating a driving source for driving a link mechanism to be analyzed having the three-dimensional geometry represented by the geometry data inputting through said data input unit;

a third handler for inputting a drive rate of said driving source designated by operation of said second handler; and arithmetic unit for solving on a numerical value basis the analytic solutions of the forward kinematics and the kinetics corresponding to the link mechanism model selected by operation of said first handler in such a manner that the parameter value included in the joint data inputted through said data input unit and the drive rate inputted by operation of said third handler are substituted.

11. A link mechanism analyzer according to claim 10, wherein said analyzer further comprises display unit for displaying a graphic screen of the three-dimensional geometry represented by the geometry data inputted through said data input unit, and a link mechanism model screen representing the link mechanism model selected by operation of said first handler.

12. A link mechanism analyzer according to claim 11, wherein said display unit displays a plurality of menu titles arriving at a designation of a desired link mechanism model through a sequential designation, and said first handler performs an operation to designate the menu titles displayed on said display unit.

13. A link mechanism analyzer according to claim 12, wherein said plurality of menu titles include a menu title representative of each of groups of link mechanism models which are classified with degree of freedom.

14. A link mechanism analyzer according to claim 11, wherein said second handler performs both an operation of instructing a link on the graphic screen displayed on said display unit, and an operation of instructing as to which one of the link and the joint coupling the link is adopted as the driver source.

15. A link mechanism analyzer according to claim 11, wherein said display unit displays marks each representative of a selectable driving source, the mark being superimposed on the link mechanism model screen, and said second handler performs an operation of instructing one of the marks.

16. A link mechanism analyzer according to claim 10, wherein said analyzer further comprises fourth handler for designating a first link locating at a base of all the links constituting the link mechanism to be analyzed having the three-dimensional geometry represented by the geometry data inputted through said data input unit.

17. A link mechanism analyzer according to claim 10, wherein said analyzer further comprises a first link detecting unit for detecting a first link locating at a base of all the links constituting the link mechanism to be analyzed having the three-dimensional geometry represented by the geometry data inputted through said data input unit, on the basis of the parameter included in the joint data inputted through said data input unit.

18. A link mechanism analyzer according to claim 10, wherein said analyzer further comprises a new link mechanism model construction unit for constructing a new sort of link mechanism model by combination of a plurality of link mechanism models from among said plurality of sorts of link mechanism models.

19. A link mechanism joint data arithmetic apparatus comprising:

geometry data input unit for inputting geometry data representative of a three-dimensional geometry of a plurality of parts constituting a link mechanism having a link and a joint;

a joint defining handler for defining a sort, a position and an orientation of joints for coupling parts in such a manner that from among a plurality of sorts of solid joint marks in which joints are classified and provided in a form of a link mechanism model on a three-dimensional basis, any one of the solid joint marks is selected, and the selected solid joint mark is arranged, at a joint portion whereat the parts entered through said geometry data input unit are coupled, with a predetermined position and a predetermined orientation;

a display unit for displaying parts entered through said geometry data input unit and the solid joint marks; and joint data arithmetic unit responsive to a message that the solid joint mark is arranged at said joint portion for evaluating joint data which describes a parameter representative of a coupling relation between the link and the joint constituting the link mechanism including a part involving the solid joint mark and a parameter value of the parameter, wherein said point data arithmetic unit solves on a numerical value basis an analytic solution of a forward kinematics corresponding to the link mechanism model selected by operation of said joint defining handler, and an analytic solution of the inverse kinematics corresponding to the driving source of the link mechanism to be analyzed designated by operation of said joint defining handler.

20. A link mechanism joint data arithmetic apparatus according to claim 19, wherein said geometry data input unit is adapted to input geometry data representative of a three-dimensional geometry of a plurality of parts in a state of assembly; and said joint defining handler is operative to dispose the solid joint mark at the joint portion of a plurality of parts in a state of assembly, entered through said geometry data input unit.

21. A link mechanism joint data arithmetic apparatus according to claim 19, wherein said geometry data input unit is adapted to input geometry data representative of a three-dimensional geometry of a plurality of parts in a state before assembly; and said joint defining handler is operative to dispose the solid joint marks each indicating that the position and the orientation are mutually associated, at the joint portions of a plurality of parts to be mutually coupled, respectively.

22. A link mechanism joint data arithmetic apparatus according to claim 19, wherein said link mechanism joint data arithmetic unit further comprises a collision check unit for inspecting as to whether said solid joint marks collide with said parts.

23. A link mechanism joint data arithmetic apparatus according to claim 19, wherein said geometry data input unit is adapted to input joint position data representative of a joint position as well as said geometry data;

said joint defining handler is for performing operations including an operation to dispose the solid joint mark at the joint position represented by said joint position data.

24. A link mechanism joint data arithmetic apparatus according to claim 19, wherein said display unit is adapted to display a two-dimensional geometry formed through projection of said parts in a predetermined direction;

said joint defining handler is for performing operations including an operation to dispose the solid joint mark at the joint position by instructing a joint position in said two-dimensional geometry.

25. A link mechanism joint data arithmetic apparatus according to claim 19, wherein said link mechanism joint data arithmetic unit further comprises a joint limit defining handler for determining a travel limit of parts coupled by joints.

26. A link mechanism joint data arithmetic apparatus according to claim 25, wherein said solid joint mark is provided with a mark portion simulating a travel position of the parts coupled through the joint, said joint limit defining handler determines the travel limit of the parts by means of moving said mark portion to a position corresponding to a travel limit position of the parts.

27. A link mechanism joint data arithmetic apparatus according to claim 25, wherein said joint limit defining handler determines the travel limit of the parts by means of moving the parts coupled through the joint, displayed on said display unit, to a travel limit position of the parts.

* * * * *